United States Patent [19]
Haga

[11] Patent Number: 6,104,657
[45] Date of Patent: Aug. 15, 2000

[54] SEMICONDUCTOR INTEGRATED CIRCUIT DEVICE FOR CHANGING DRAM ROW ADDRESSES ACCORDING TO OPERATION MODE

[75] Inventor: Ryo Haga, Yokohama, Japan

[73] Assignee: Kabushiki Kaisha Toshiba, Kawasaki, Japan

[21] Appl. No.: 09/143,376

[22] Filed: Aug. 28, 1998

[30] Foreign Application Priority Data

Aug. 28, 1997 [JP] Japan ...................................... 9-232446

[51] Int. Cl.[7] ..................................................... G11C 7/00
[52] U.S. Cl. ..................................... 365/222; 365/230.03
[58] Field of Search ................................ 365/222, 230.03

[56] References Cited

U.S. PATENT DOCUMENTS 5,251,177  10/1993  Akamatsu et al. ....................... 365/222

Primary Examiner—David Nelms
Assistant Examiner—M. Tran
Attorney, Agent, or Firm—Banner & Witcoff, Ltd.

[57] ABSTRACT

A semiconductor integrated circuit device has memory cell arrays capable of using shared sense amplifiers, wherein memory can be increased by refresh units to a desired capacity. Specific memory cell arrays can be selected when writing/reading and refreshing by switching address signals when writing/reading and when refreshing. The number of word lines selected when refreshing is always uniform in the memory system.

42 Claims, 40 Drawing Sheets

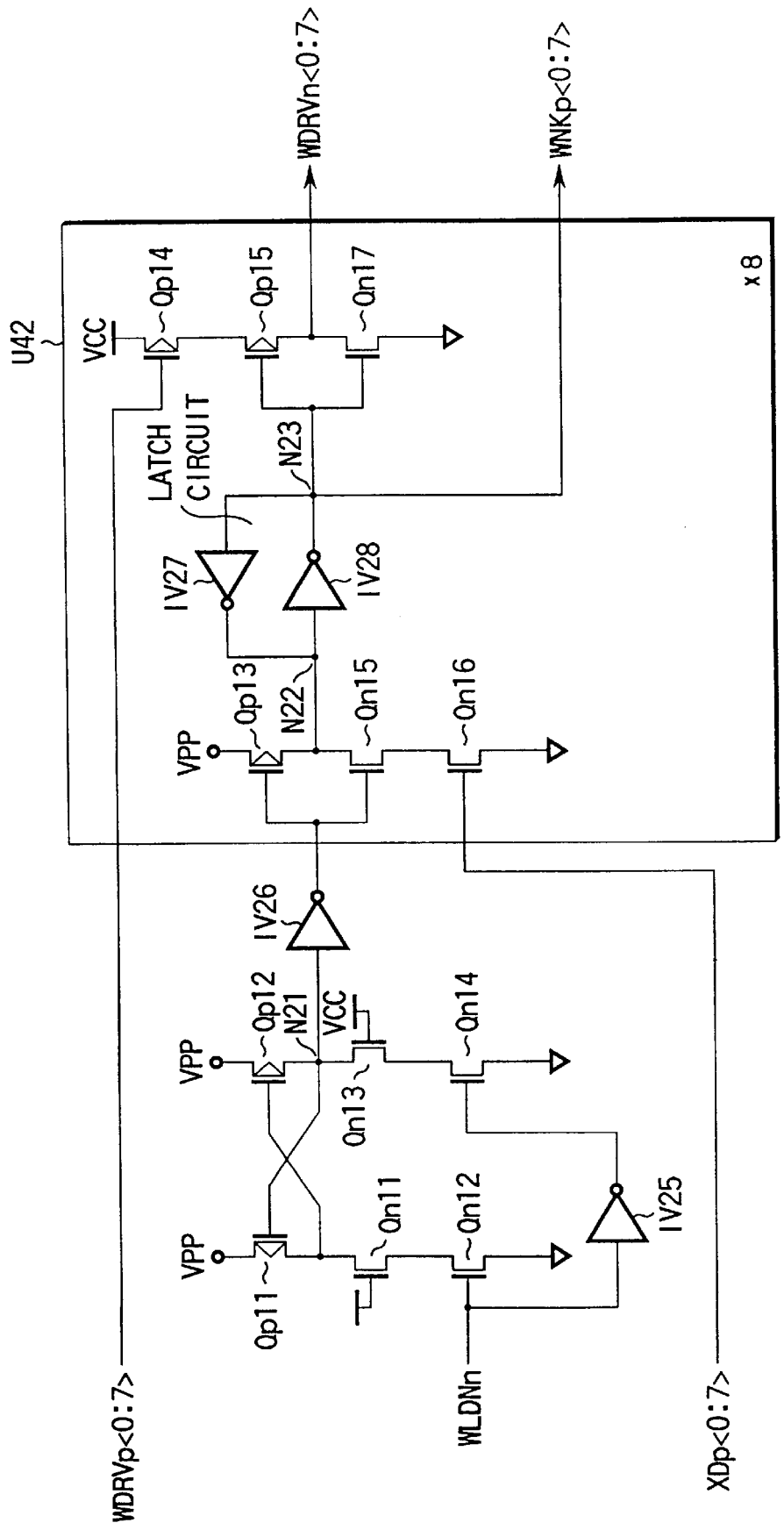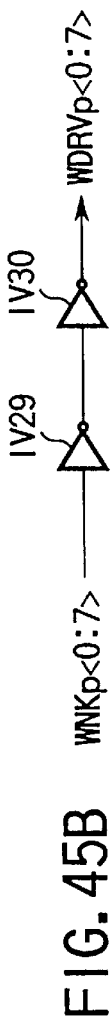
FIG. 45A
FIG. 45B

SEMICONDUCTOR INTEGRATED CIRCUIT DEVICE FOR CHANGING DRAM ROW ADDRESSES ACCORDING TO OPERATION MODE

BACKGROUND OF THE INVENTION

The present invention relates particularly to a semiconductor integrated circuit device comprising a memory such as a DRAM (dynamic RAM) for accompanying refreshing operations.

FIG. 1 is a block diagram showing a conventional row system address generator of a DRAM. When activating word lines WL in order to input and output data to/from the DRAM, a row address signal RA which specifies a given word line and a row address strobe signal /RAS (in the diagram, the header / is indicated by bar above) are input.

The /RAS is temporarily stored in a row address controller 12. Next, when a clock signal (not shown in the diagram) has been input to the row address controller 12, a control signal is sent from the row address controller 12 to a row address buffer 11. The row address buffer 11 receives this control signal and passes on the row address signal RA which has been temporarily stored in the row address buffer 11.

Thereafter, the row address signal RA is transmitted via a multiplexer (also known as an address multiplexer) 13, which multiplexes the row address signal RA with a refresh address signal, a row pre-decoder 14, a row decoder 15 and a word line driver 19, thereby activating the word line WL. Furthermore, those addresses which are not required for refreshing are input directly to the row pre-decoder 14 without passing through the multiplexer 13 (10).

On the other hand, when carrying out refresh operations, a refresh signal REF sent from the outside becomes active and is input to a refresh controller 16. The REF signal causes the refresh controller 16 to supply a control signal in synchronism with a clock signal (not shown in the diagram) to a refresh counter 17 and to the row address buffer 11 and the multiplexer 13. As a consequence, the multiplexer 13 switches from inputting addresses from the row address buffer 11 to inputting refresh addresses from the refresh counter 17. That is, the refresh counter 17 commences operation and the output from the address multiplexer 13 is switched to the value of the refresh counter 17. The refresh address signal sent from the refresh counter 17 passes through the row pre-decoder 14, the row decoder 15 and the word line driver 19, thereby activating the word line WL. Further, those address signals (10) which are not input to the multiplexer 13 all switch to "H" (high level) at the row address buffer 11. Furthermore, the value of the refresh counter 17 is incremented each time a refresh signal REF is input thereto.

FIG. 2 is a schematic block diagram showing the configuration of primary parts of a conventional DRAM having the structure described above. The DRAM has capacity of 2.5 megabits, and 256 row lines, that is, word lines (WL) which are not shown in the diagram, are provided for each cell array block (256k cell array). Sense amplifiers are provided next to each cell array. The sense amplifiers S/A on either side of each cell array are connected in alternate sequence by pairs of bit lines. Moreover, the sense amplifiers provided between the cell arrays are shared sense amplifiers which can be used by the cell arrays on either side thereof. That is, each sense amplifier S/A comprises switch-connecting means for electrically isolating the pairs of bit lines of the cell array on either side. However, the sense amplifiers between cell arrays (4) and (5) are individually provided and cannot be shared.

Firstly, the method of accessing (for instance, reading out from) the memory cells when writing and reading (write/read) according to the configuration described above will be explained. In write/read operations, two word lines are activated in correspondence with one row address. Combinations of 256k cell arrays whose word lines become active simultaneously is: (0) and (5), (1) and (6), (2) and (7), (3) and (8), (4) and (9). Since two word lines connect to each cell, a column address determines from which cell data are to be read out. Row address signals A0 to A7 determine which word line (one out of 256 word lines) is to be activated in each 256k cell array.

Row address signals A8 to A10 select 256k cell arrays. That is, they select two 256k cell arrays, whose word lines become active simultaneously in the combinations described above, in correspondence with the connection concept of FIG. 2 showing address decodes for A8 to A10. Therefore, in the present example, the number of row addresses is 256×5=1280.

Next, the refresh operation in the configuration shown in FIG. 2 will be explained. When refreshing, the row addresses select 512 word lines. Refreshing is carried out by raising address signals /A10, A10, /A9 and A9 to "H" (high level; "1"). (In the diagram, the address signal headers / have bars thereabove.) The word lines which are activated during refreshing are determined only by address signals A0 to A8. For instance, when all the row address signals A0 to A8 are at the low level ("0"), the 0 word lines WL0 of the 256k cell arrays (0), (2), (4), (5), (7) and (9) are simultaneously activated. Thereafter, the refresh counter activates the word lines sequentially and refreshing is carried out as far as word lines WL255. After this, when row address signals A0 to A7 are all still at "L" (low level; "0") and row address signal A8 has risen to "H" (high level; "1"), the 0 word lines WL0 of the remaining 256k cell arrays (1), (3), (6) and (8) are simultaneously activated. Thereafter, the refresh counter sequentially activates the word lines and the cell arrays are refreshed as far as until word lines WL255. In this way, all cell arrays in the memory can be refreshed using 512 addresses corresponding to word lines WL0 to WL511, which is equivalent to two cell arrays.

In a refresh operation by the method according to the above configuration, word lines of cell array (4) and cell array (5) are activated simultaneously. Therefore, it is not possible to provide a shared sense amplifier between the cell arrays (4) and (5). As a consequence, as illustrated by sense amplifier (4) and sense amplifier (5) of FIG. 2, sense amplifiers must be provided separately, causing a problem of increased layout size.

Furthermore, in a memory such as an ASIC (application specific IC) embedded DRAM, there is a demand to increase the number of memory cells as much as possible with refresh units (of 512 word lines in this case) in order to achieve a desired capacity. When the conventional technology described above is used in an attempt to realize this, 256k cell arrays (4) and (9) require a different layout configuration from the other parts, which is a disadvantage from the point of view of increasing capacity.

BRIEF SUMMARY OF THE INVENTION

The present invention aims to provide a semiconductor integrated circuit device having a memory, comprising a uniform patterned layout in which shared sense amplifiers can be used, wherein a desired memory capacity can be realized by increasing the number of memory cells comprising refresh units.

Furthermore, the present invention aims to provide a memory wherein the number of memory cell arrays activated when refreshing is carried out can be controlled to a constant number.

The present invention is accomplished by the following configuration.

The semiconductor integrated circuit device of the present invention comprises: plurality of memory cell arrays each comprising plurality of memory cells arranged in a matrix; sense amplifiers for sense-amplifying data read out from the memory cell arrays and data written to the memory cell arrays; wherein the plurality of memory cell arrays comprise a first group, split by a row address for write/read operation, and a second group, split by a row address for refresh operation, at least one element of the second group being divided into each part of two elements of the first group.

Even the relation between the numbers of row addresses for write/read operation and row addresses for refresh operation is other than a relation wherein the larger number of addresses is a square of the smaller number of addresses activation of adjacent memory cell arrays is avoided when carrying out either operation. As a consequence, one of the elements in the second group is spread across each part of two elements in the first group.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments give below, serve to explain the principles of the invention.

FIGS. 45A and 45B a e circuit diagrams showing a circuit for producing a word line control signal used in the twelfth embodiment of the present invention;

DETAILED DESCRIPTION OF THE INVENTION

Figure 3:
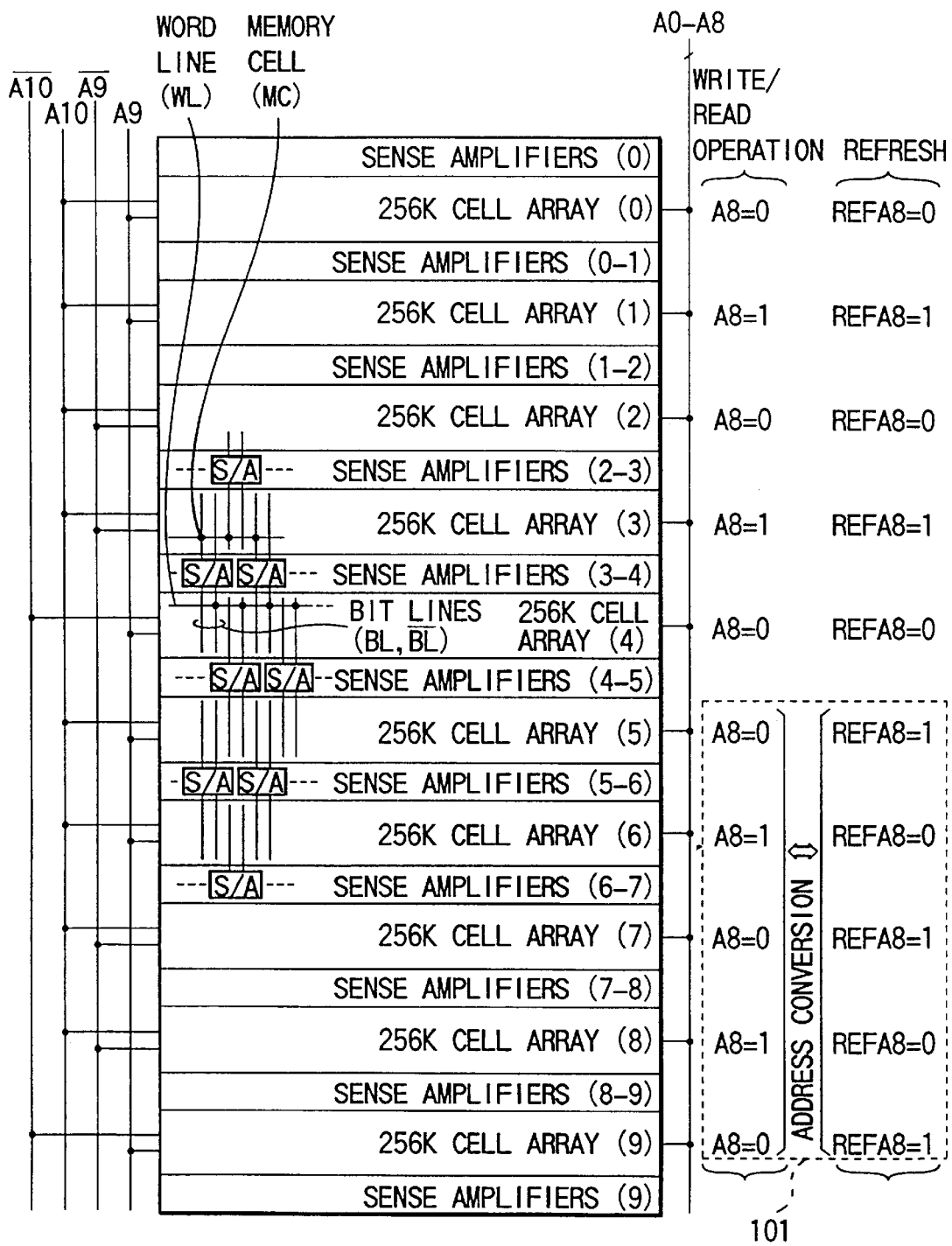
FIG. 3 is a schematic block diagram showing a primary configuration of a memory according to a specific embodiment of the semiconductor integrated circuit device of the present invention.

FIG. 3 is a schematic block diagram showing a primary configuration of a memory according to a specific embodiment of the semiconductor integrated circuit device of the present invention. The memory comprises a DRAM having capacity of 2.5 megabits, and 256 row lines, that is, word lines (WL) (not shown in the diagram) are provided for each of the 256k cell arrays (memory cell arrays) (0) to (9). There are 1280 row addresses for writing and reading to/from the memory and 512 row addresses for refreshing. Sense amplifiers are provided next to the cell arrays. The cell arrays (0) to (9) are connected to the sense amplifiers on either side thereof by bit lines in alternate sequence. Moreover, the sense amplifiers provided between the cell arrays (0) to (9) are shared sense amplifiers which can be used by the cell arrays (0) to (9) on either side thereof. The configuration of each shared sense amplifier includes switch-connecting means (not shown in the diagram) for electrically isolating the bit lines of either of the cell arrays on either side thereof.

Firstly, the method of accessing (for instance, reading out from) the memory cells when writing and reading (write/read) according to the configuration described above will be explained. In write/read operations, two word lines are activated in correspondence with one row address. Combinations of 256k cell arrays whose word lines become active simultaneously is: (0) and (5), (1) and (6), (2) and (7), (3) and (8), (4) and (9). Since two word lines connect to each cell, a column address determines from which cell data are to be read out. Row address signals (not shown) A0 to A7 determine which word line (one out of 256 word lines) is to be activated in each 256k cell array.

Row address signals A8 to A10 select 256k cell arrays. That is, they select two 256k cell arrays, whose word lines become active simultaneously in the combinations described above, in correspondence with the connection concept of FIG. 3 showing address decodes for A8 to A10. Therefore, in the present example, the number of row addresses is 256×5=1280.

Next, the refresh operation in the configuration shown in FIG. 3 will be explained. When refreshing, the row addresses select 512 word lines. Refreshing is carried out by raising address signals /A10, A10, /A9 and A9 to "H" (high level; "1"). (In the diagram, the address signal headers / have bars thereabove.) The word lines which are activated during refreshing are determined only by address signals A0 to A8. For instance, when all the row address signals A0 to A8 are at the low level ("0"), the 0 word lines WL0 of the 256k cell arrays (0), (2), (4), (6) and (8) are simultaneously activated. Thereafter, the refresh counter activates the word lines sequentially and refreshing is carried out as far as word lines WL255. After this, when row address signals A0 to A7 are all still at "L" (low level; "0") and row address signal A8 has risen to "H" (high level; "1"), the 0 word lines WL0 of the remaining 256k cell arrays (1), (3), (5), (7) and (9) are simultaneously activated. Thereafter, the refresh counter sequentially activates the word lines and the cell arrays are refreshed as far as until word lines WL255. In this way, all cell arrays in the memory can be refreshed using 512 addresses corresponding to word lines WL0 to WL511, which is equivalent to two cell arrays.

The present invention makes it possible to change the selection of specific memory cell arrays when carrying out writing/reading and refreshing, by switching address signals (shown at 101 in FIG. 3) which are used when writing/reading and refreshing. As a result, sense amplifiers between adjacent cell arrays can all be shared. Consequently, this cell array comprising refresh operation units (in this case, equivalent to 512 word lines) makes it possible to increase memory capacity of a embedded-logic DRAM or the like.

In the conventional technology, it was not possible to provide shared sense amplifiers between adjoining cell arrays because cell arrays (4) and (5) are both activated by row address signal A8=0. This can be avoided by preventing adjoining cell arrays from becoming active simultaneously during refresh operations. For instance, for cell arrays (5) to (9), the address signal A8 when writing/reading and refreshing may be switched between the states shown at 101 in FIG.

3. For convenience, the row address signal A8 for refreshing is represented as refresh address signal REFA8.

In compliance with the memory configuration, an address converter is inserted at a point along the transmission path to invert the refresh address signal REFA8 at cell arrays (5) to (9). Alternatively, in compliance memory configuration, an address converter is inserted at a point along the transmission path to invert the row address signal A8 for writing/reading at cell arrays (5) to (9).

According to the abovementioned embodiment, when carrying out writing/reading, combinations of the 256k cell arrays whose word lines become active simultaneously are: (0) and (5), (1) and (6), (2) and (7), (3) and (8), (4) and (9). When these combinations are deemed (A), (B), (C), (D) and (E) respectively, it is possible to achieve a first group comprising two elements: an element formed from cell arrays (0) to (4) and an another element formed from cell arrays (5) to (9), with combinations (A) to (E) which comprise 1280 row addresses being deemed one element.

When carrying out refreshing, combinations of the 256k cell arrays whose word lines become active simultaneously are: (0), (2), (4), (6), (8), and (1), (3), (5), (7), (9). When these combinations are deemed (F) and (G) respectively, it is possible to achieve a second group comprising five elements: an element comprising cell arrays (0) and (1), an element comprising cell arrays (2) and (3), an element comprising cell arrays (4) and (5), an element comprising cell arrays (6) and (7), and an element comprising cell arrays (8) and (9), with combinations (F) and (G) comprising 512 row addresses being deemed one element.

Here, at least two elements from the second group are included in one element of the first group. Moreover, cell arrays (4) and (5), which together form one element of the second group, are separately included in parts of two elements of the first group. That is, cell array (4) is included in the element comprising cell arrays (0) to (4) and cell array (5) is included in the element comprising cell arrays (5) to (9).

Thus, even in the case of a memory wherein the relation between the number of row addresses when writing/reading and the number of row addresses when refreshing is other than a relation wherein the larger number of addresses is a square of the smaller number of addresses, e.g. when the number of row addresses for write/read operation is 1280 and the number of row addresses for refresh operation is 512, activation of adjacent memory cell arrays is avoided when carrying out either operation. As a result, a single element of the second group, such as cell arrays (4) and (5), is spread across parts of two elements in the first group. Consequently, plurality of sense amplifiers can be shared between adjoining memory cell arrays.

Let us consider a memory system comprising $2n$ memory cell arrays ($n \geq 3$), each memory cell array having a number W of word lines. The present invention is most effective when implemented in a memory having the relation wherein: if the number of addresses when writing/reading is aW ($a \geq n$) and the number of addresses when refreshing bW ($b \geq 2$), when aW>bW, $aW \neq bW \times 2^k$ and when bW>aW, $bW \neq aW \times 2^i$.

In the above configuration, address signal lines used in order to select two n memory cell arrays (n=5) may be as follows: when performing writing/reading, a given memory cell is selected from among the upper half n memory cell arrays (cell arrays (0) to (4)) of the two n memory cell arrays, and a memory cell array from the lower half n memory cell arrays (cell arrays (5) to (9)), which corresponds to the given memory cell from the upper half, is simultaneously selected. When performing refreshing, the odd numbered or even numbered cell arrays from the two n memory cell arrays are selected.

Figure 4:
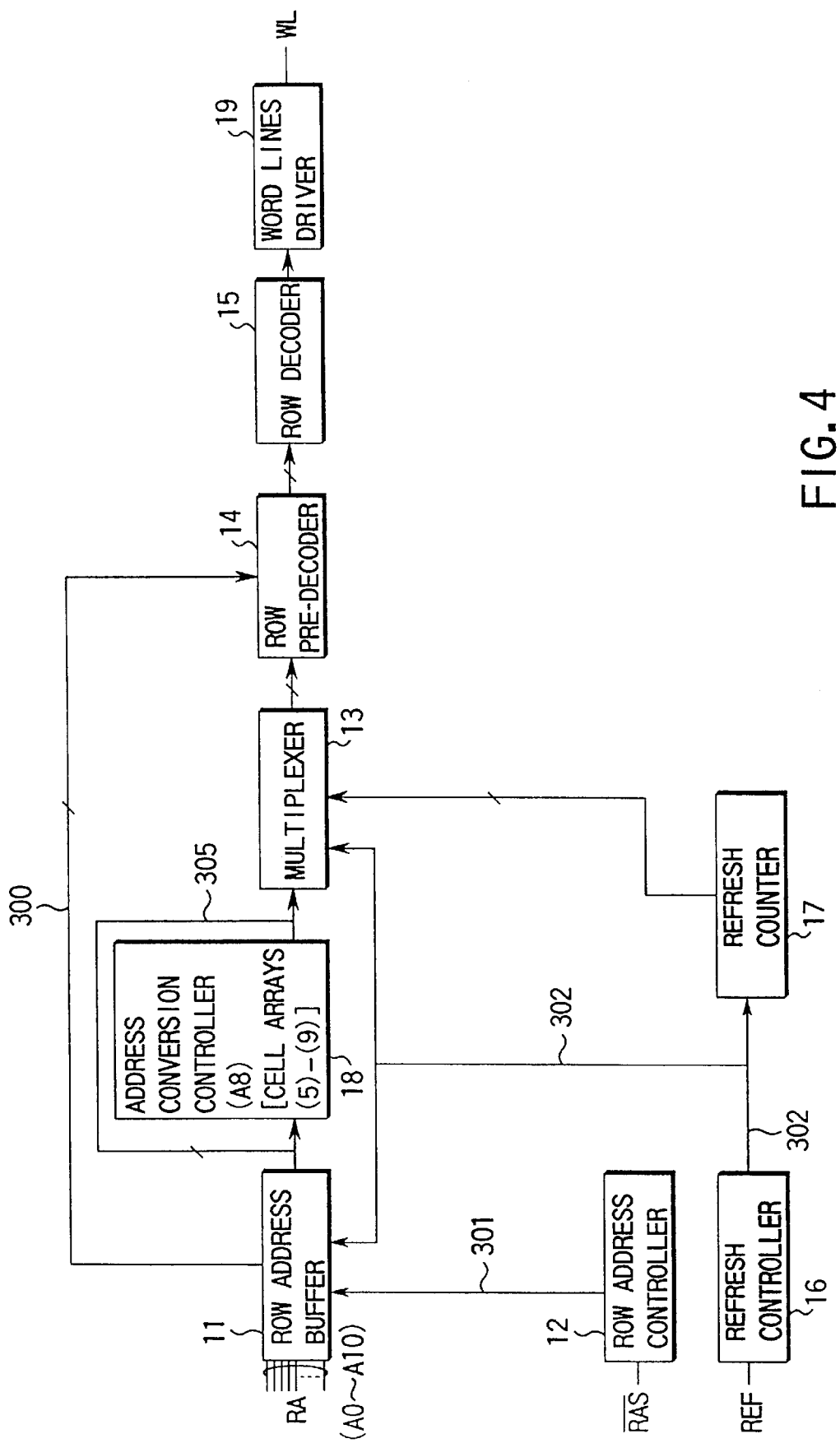
FIG. 4 is a schematic block diagram showing a row system address generator of a DRAM according to the first embodiment of the present invention.

FIG. 4 is a schematic block diagram showing a row address generator of a DRAM according to the first embodiment of the present invention, illustrating an address generator for switching row addresses for writing/reading and refreshing in a case where refreshing is being carried out in compliance with the row address signal A8. The configuration shown here differs from that of FIG. 1 described above in that an address converter 18 is inserted on the predetermined signal transmission path from the row address buffer 11 to the multiplexer 13.

Figure 1:
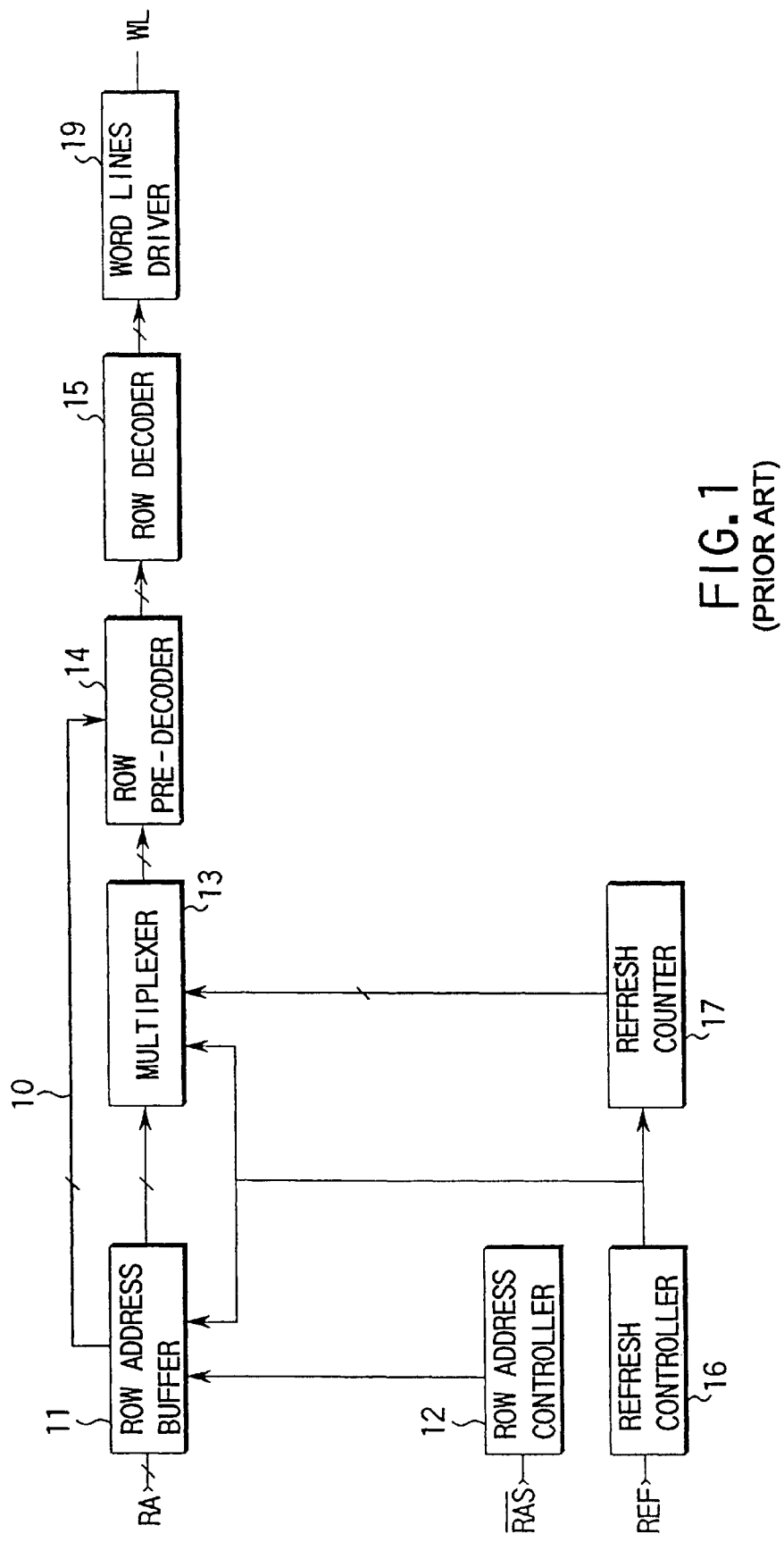
FIG. 1 is a block diagram showing a conventional row system generator of a DRAM.

That is, row address signals used when writing/reading to cell arrays (0) to (4) are sent a along a signal transmission path 305 which does not pass through the address converter 18, identical to that in FIG. 1. However, row address signals for cell arrays (5) to (9) do pass through the address converter 18, thereby reversing the row address signal A8 which selectively controls simultaneously activating cell arrays. The other signal transmission paths are the same as FIG. 15 and like reference numerals are used.

In FIG. 4, when activating word lines WL in order to perform writing/reading, a row address signal RA which specifies a given word line and a row address strobe signal /RAS (in the diagram, the header / has a bar above it) are input. The /RAS is temporarily stored in a row address controller 12. Next, when a clock signal (not shown in the diagram) has been input to the row address controller 12, a control signal 301 is sent from the row address controller 12 to the row address buffer 11. The row address buffer.11 receives this control signal 301 and next transmits the row address signal RA which has been temporarily stored in the row address buffer 11.

Let us concentrate on address signal A8 of the row address signals RA (A0 to A10). When A8 is transmitted to cell arrays (0) to (4), it passes directly to the multiplexer 13 (path 305). However, when transmitted to cell arrays (5) to (9), the address signal A8 is inverted by the address converter 18 before reaching the multiplexer 13 (also known as an address multiplexer). From the multiplexer 13, the row address signals are sent via a row pre-decoder 14, a row decoder 15 and a word line driver 19, thereby activating the word lines WL. Those address signals which are not needed for refreshing travel along path 300 and are input directly to the row pre-decoder 14 without passing through the multiplexer 13.

On the other hand, when refreshing, a refresh signal REF is input from the outside to the refresh controller 16. This signal REF causes the refresh controller 16 to supply a control signal 302 in synchronism with a clock signal (not shown in the diagram) to a refresh counter 17 and to the row address buffer 11 and the multiplexer 13. Upon receiving the control signal 302, the input of the multiplexer 13 is switched and the refresh counter 17 commences operation. As a result, the output from the address multiplexer 13 is switched to the value of the refresh counter 17. The refresh address signal sent from the refresh counter 17 passes through the row pre-decoder 14, the row decoder 15 (which also comprises a word line driver) thereby activating the word line WL. Further, those address signals which are not input to the multiplexer 13 all switch to "H" (active state) at the row address buffer 11, which has received the control signal 302, and are transmitted to the row pre-decoder along transmission path 300. Furthermore, the value of the refresh counter 17 is incremented each time a refresh signal REF is input thereto.

Figure 5:
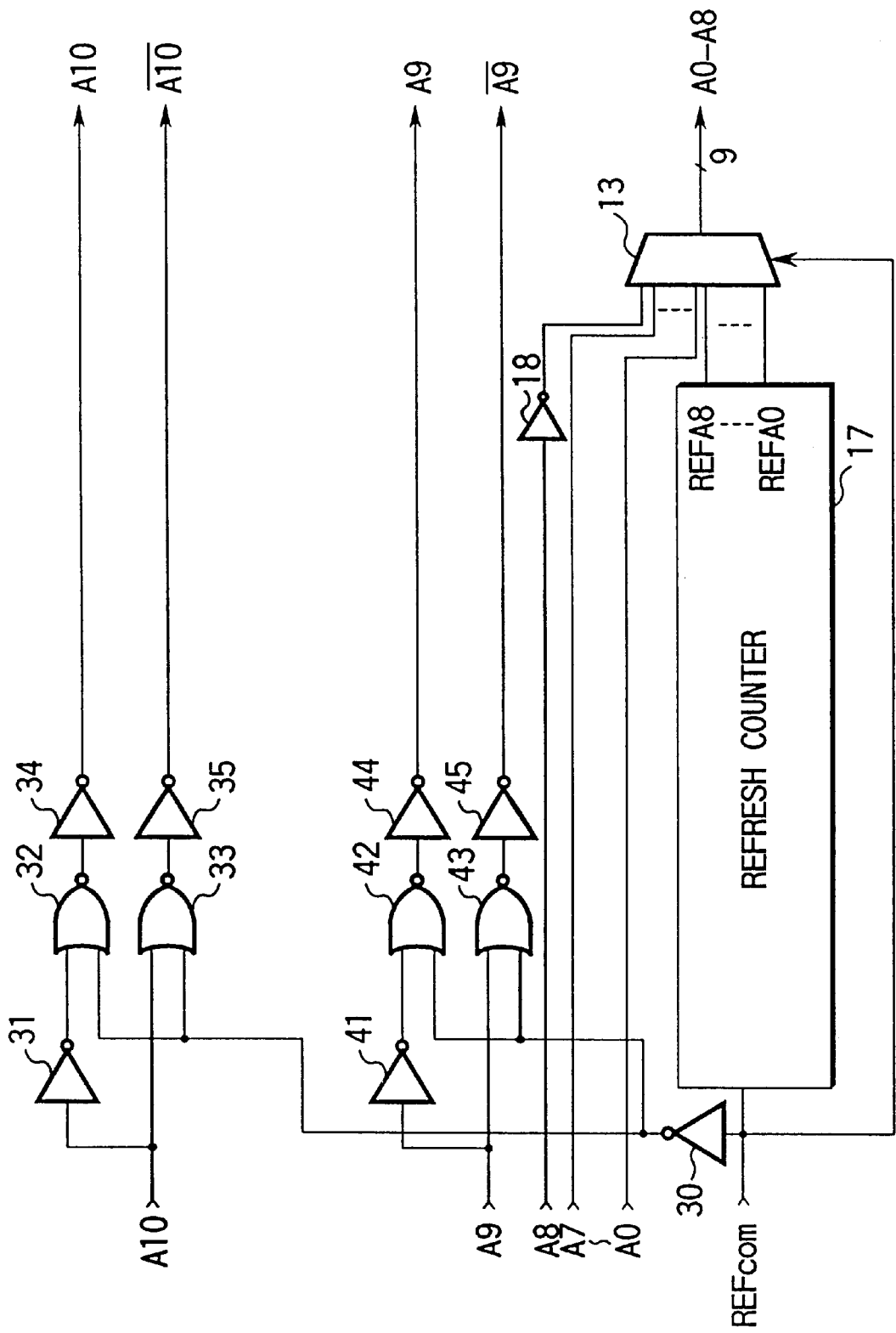
FIG. 5 is a circuit block diagram showing an address converter, which is provided based on the first embodiment, and surrounding circuits thereof.

FIG. 5 is a circuit block diagram showing the address converter 18, which is provided based on the first embodiment, and surrounding circuits thereof. FIG. 5 depicts one portion (controllers 30 to 35, and 41 to 45 making complementary signal of address bit A9 and A10) of the row address buffer 11, the multiplexer 13, the refresh counter 17 and the address converter 18 of FIG. 4.

In FIG. 5, row address signal A10 is input to a NOR gate 32 via an inverter 31 and also to a NOR gate 33. The other inputs of the NOR gates 32 and 33 both receive an inverted signal, comprising a refresh command signal REFcom from the refresh controller (16 in FIG. 4) which has been inverted by an inverter 30. The NOR gates 32 and 33, which output via inverters 34 and 35 respectively, supply the row address signal A10 and its complementary signal /A10 (in the diagram, the header / is indicated by a bar above).

Row address signal A9 is input to a NOR gate 42 via an inverter 41 and also to a NOR gate 43. The other inputs of the NOR gates 42 and 43 both receive an inverted signal, comprising a refresh command signal REFcom from the refresh controller which has been inverted by an inverter 30. The NOR gates 42 and 43, which output via inverters 44 and 45 respectively, supply the row address signal A9 and its complementary signal /A9 (in the diagram, the header / is indicated by a bar above).

Row address signals A0 to A8 from the row address buffer (11 in FIG. 4) are supplied to the multiplexer 13. In the case described here, the signal A8 is input to the multiplexer 13 via an address converter, that is, the inverter 18.

The refresh command signal REFcom is an operation control signal supplied from the refresh counter 17. In compliance with the refresh command signal REFcom, the multiplexer 13 supplies row address signals A0 to A8 by selecting either the row address signals A0 to A8 for writing/reading, or refresh address signals REFA0 to REFA8 for refreshing.

The above configuration is identical to the conventional example in respect of the row address signals /A10, A10, /A9 and A9 all being raised to the "H" level, which is the selection state, as a result of the "L" level of the refresh command signal REFcom. The above configuration differs from the conventional example in view of the treatment of row address signal A8. As shown in FIG. 3, it is possible to use shared sense amplifiers between adjacent cell arrays while ensuring that adjacent 256k cell arrays do not become active when writing/reading and refreshing. As a consequence, by appending the address converter (inverter 18) at an appropriate place, when writing/reading, the row address signal A8 together with A9 and A10 can be used to appropriately select cell array groups (0) and (5), (1) and (6), (2) and (7), (3) and (8), (4) and (9). And, when refreshing, the refresh address signal REFA8 can be used to appropriately select the cell array group comprising (0), (2), (4), (6), (8) or the group comprising (1), (3), (5), (7), (9).

Figure 6:
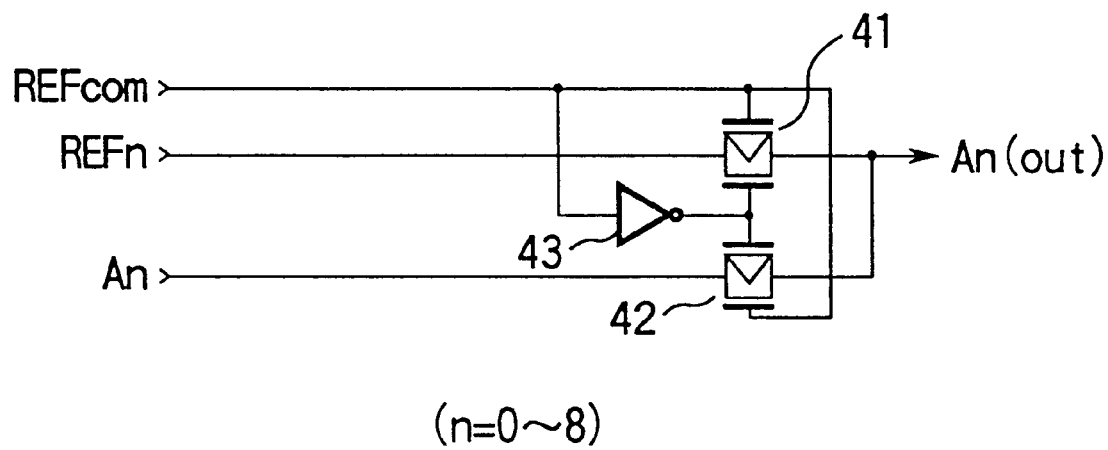
FIG. 6 is a circuit diagram of a single address signal of a multiplexer used in the present invention.

FIG. 6 is a circuit diagram of a single address signal of the multiplexer 13. A refresh address signal REFAn (n=0 to 8) is output via a transfer gate 41. A row address signal An (n=0 to 8) is output via a transfer gate 42. The transfer gates 41 and 42 become active in complement and the output from either one is transmitted as a row address signal An (out). The P-channel side gate of the transfer gate 41 and the N-channel side gate of the transfer gate 42 are both controlled with the refresh command signal REFcom; and the N-channel side gate of the transfer gate 41 and the P-channel side gate of the transfer gate 42 are both controlled with an inverted signal which is produced by passing the refresh command signal REFcom through an inverter 43.

Figure 7:
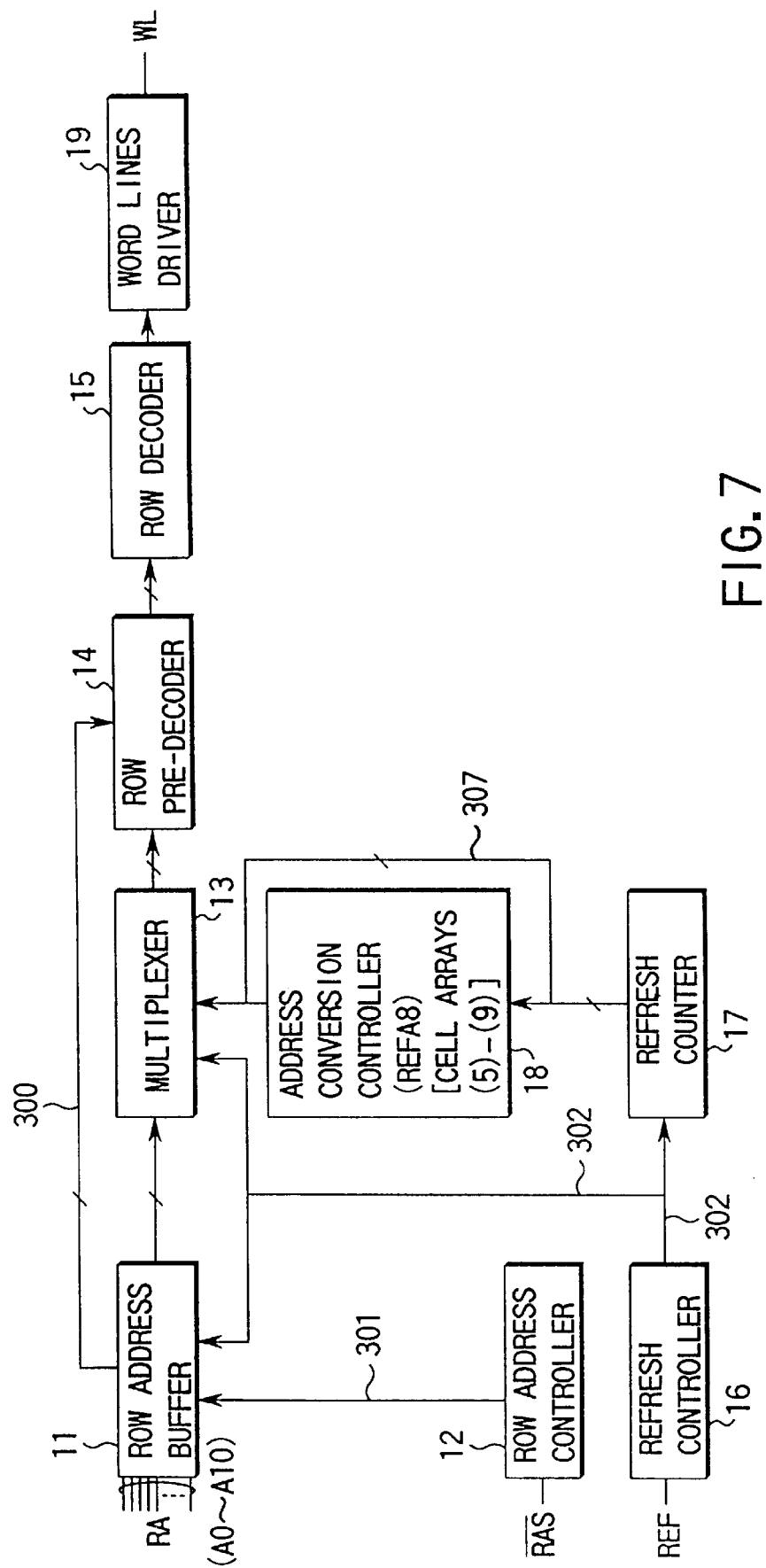
FIG. 7 is a schematic block diagram showing a row system address generator of a DRAM according to a second embodiment of the present invention.

FIG. 7 is a schematic block diagram showing primary parts of a row system address generator of a DRAM according to a second embodiment of the present invention, illustrating an address generator for switching row addresses for writing/reading and refreshing in a case where writing/reading is being carried out in compliance with the row address signal A8. The configuration shown here differs from that of FIG. 1 described above in that an address converter 18 is inserted at a point along the predetermined signal transmission system between the refresh counter 17 and the multiplexer 13.

That is, refresh signals to cell arrays (0) to (4) are sent along a signal transmission path 307 which does not pass through the address converter 18, identical to that in FIG. 1. However, refresh signals for cell arrays (5) to (9) do pass through the address converter 18, reversing the refresh address signal A8 which selectively controls simultaneously activating cell arrays. The signal transmission paths are the same as FIG. 1 and like reference numerals are used.

In FIG. 7, when activating word lines WL in order to perform writing/reading, a row address signal RA which specifies a given word line and a row address strobe signal /RAS are used. The signal /RAS is temporarily stored in a row address controller 12. Next, when a clock signal (not shown in the diagram) has been input to the row address controller 12, a control signal 301 is sent from the row address controller 12 to the row address buffer 11. The row address buffer 11 receives this control signal 301 and next transmits the row address signal RA which has been temporarily stored in the row address buffer 11. That is, thereafter the row address signal RA is multiplexed with the refresh address signal by the multiplexer 13 (also known as an address multiplexer) and sent via the row pre-decoder 14 and the row decoder 15 (also comprising a word line driver), thereby activating the word lines WL. Those address signals which are not needed for refreshing travel along path 300 and are input directly to the row pre-decoder 14 without passing through the multiplexer 13.

On the other hand, when refreshing, a refresh signal REF is input from the outside to the refresh controller 16. This signal REF causes the refresh controller 16 to supply a control signal 302 in synchronism with a clock signal (not shown in the diagram) to the refresh counter 17 and to the row address buffer 11 and the multiplexer 13. Upon receiving the control signal 302, the input of the multiplexer 13 is switched and the refresh counter 17 commences operation. As a result, the output from the address multiplexer 13 is switched so as to receive the signal from the refresh counter 17.

Let us concentrate on refresh address signal REFA8 which is supplied from the refresh counter 17 When REFA8 is transmitted to cell arrays (0) to (4), which are not shown in the diagram, it is sent directly to the multiplexer 13 (path 307). However, when transmitting to cell arrays (5) to (7), the refresh address signal REFA8 is inverted by the address converter 18 before being input to the multiplexer 13. A row address signal from the multiplexer 13 is sent via a row pre-decoder 14, a row decoder 15 and a word line driver 19, thereby activating the word lines WL. Further, those address signals which are not input to the multiplexer 13 are all switched to "H" (active state) at the row address buffer 11, which has received the control signal 302, and are transmitted along transmission path 300 to the row pre-decoder. Furthermore, the value of the refresh counter 17 is incremented each time a refresh signal REF is input thereto.

According to the configuration described above, the address signal (here, A8 for refreshing) is partially changed depending on whether writing/reading or refreshing is to be carried out, thereby changing the cell arrays which become active. As a result, even in an memory having a configuration wherein the relation between the number of row addresses when writing/reading and the number of row addresses when refreshing is other than a relation wherein the larger number of addresses is a square of the smaller numbers of addresses, e.g. when the number of row addresses for write/read operation is 1280 and the number of row addresses for refresh operation is 512, activation of adjacent memory cell arrays is avoided when carrying out either operation. As a result, sense amplifiers can be shared between adjacent cell array blocks and area can be reduced.

Figure 8:
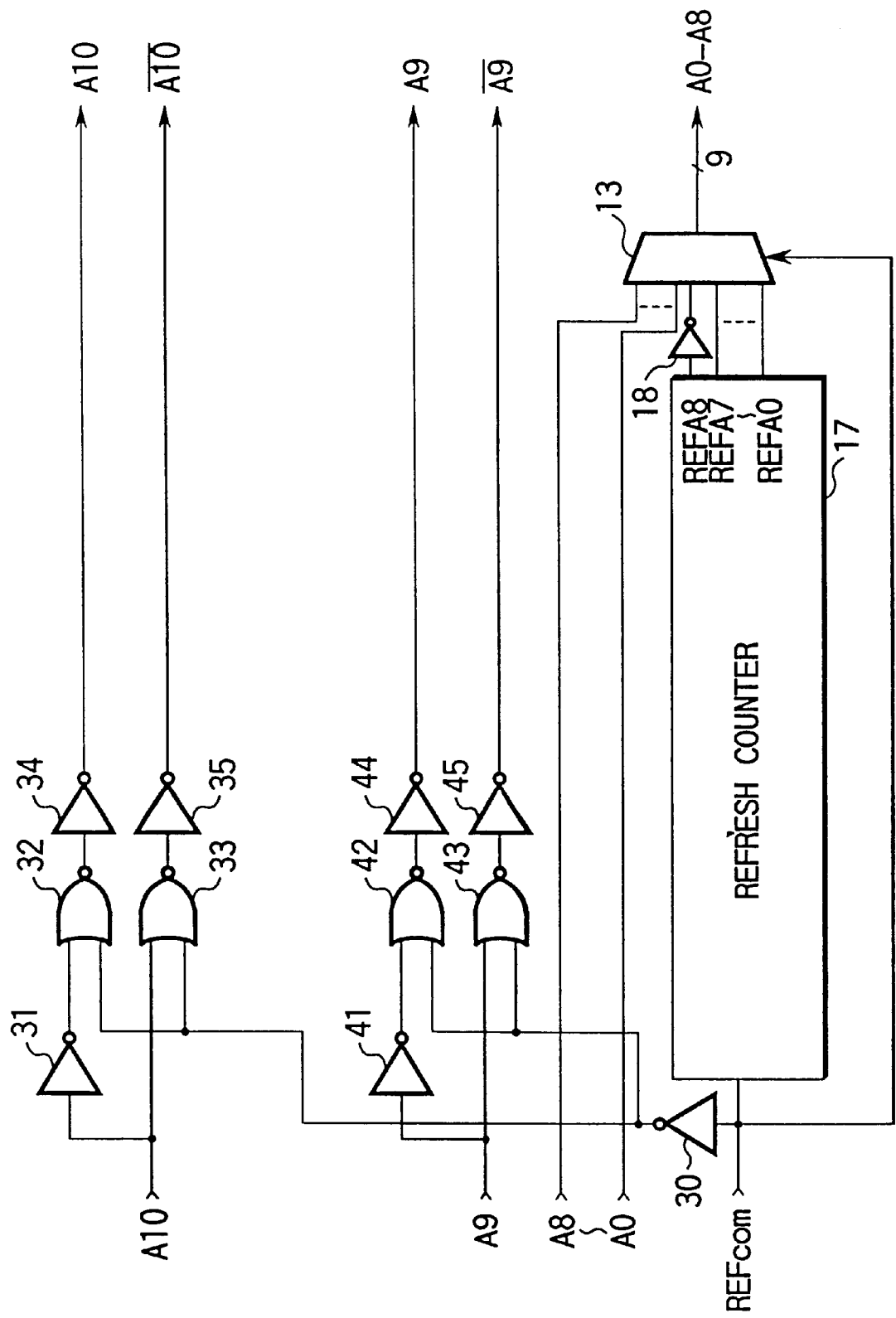
FIG. 8 is a circuit block diagram showing an address converter, which is provided based on the second embodiment, and surrounding circuits thereof.

FIG. 8 is a circuit block diagram showing an address converter, which is provided based on the second embodiment, and surrounding circuits thereof. FIG. 8 depicts one portion (controllers 30 to 35, and 41 to 45 making complementary signal of address bit A9 and A10) of the row address buffer 11, the multiplexer 13, the refresh counter 17 and the address converter 18 of FIG. 7. FIG. 5 above described an embodiment wherein, of the row address signal supplied from the row address buffer, signal A8 was input to the multiplexer 13 via an address converter (inverter 18). However, in the second embodiment, signals A0 to A8 are input to the multiplexer 13 without being address-converted. Instead, the refresh counter 17 inputs REFA8 to the multiplexer 13 via the address converter, that is, the inverter 18. In other words, referring FIG. 3, only when refreshing is to be carried out, cell arrays which are selected when refresh address signal REFA8 is at the "L" level are switched to (0), (2), (4), (6) and (8); and cell arrays which are selected at the "H" level are switched to (1), (3), (5), (7) and (9). Since other parts of the configuration are identical to FIG. 5, like reference numerals are used and explanation is omitted.

The above configuration is identical to the conventional example in respect of the row address signals /A10, A10, /A9 and A9 all being raised to the "H" level, which is the selection state, as a result of the "L" level of the refresh command signal REFcom "L". The above configuration differs from the conventional example in view of the treatment of row address signal REFA8. As shown in FIG. 3, it is possible to use shared sense amplifiers between adjacent cell arrays while ensuring that adjacent 256k cell arrays do not become active when writing/reading and refreshing. As a consequence, by appending the address converter (inverter 18) at an appropriate place, when writing/reading, the row address signal A8 together with A9 and A10 are able to appropriately select cell array groups (0) and (5), (1) and (6), (2) and (7), (3) and (8), (4) and (9). And, when refreshing, the refresh address signal REFA8 can be used to appropriately select the cell array group comprising (0), (2), (4), (6), (8) or the group comprising (1), (3), (5), (7), (9).

Figure 9:
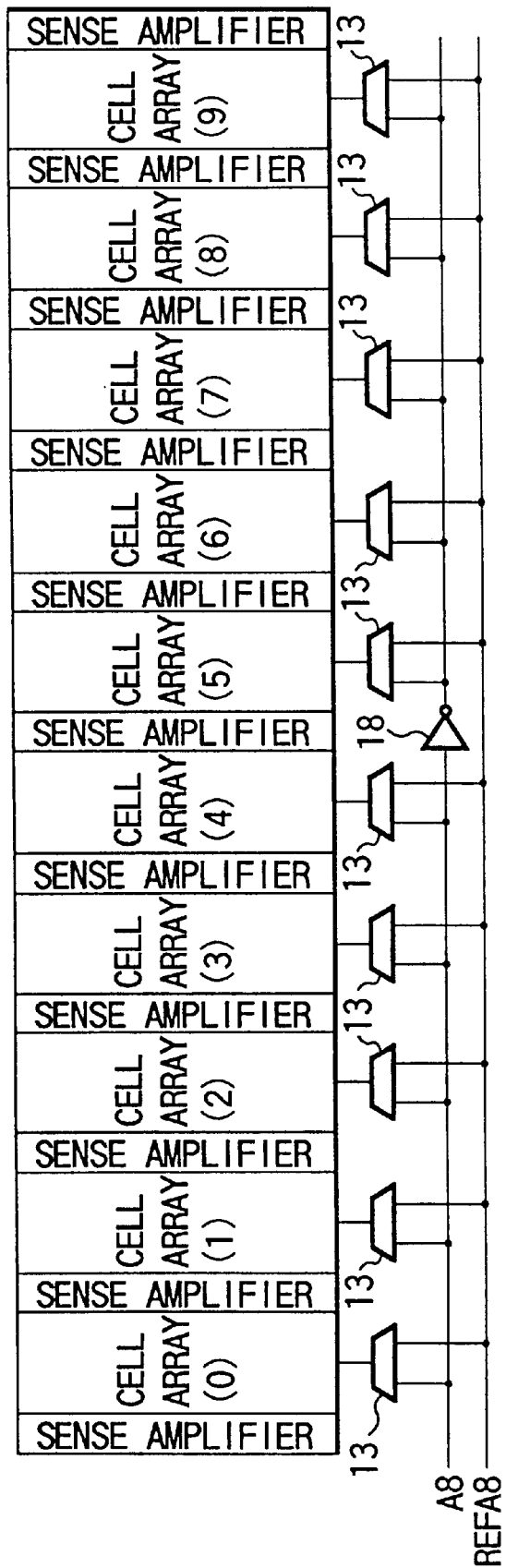
FIG. 9 is a block diagram showing primary parts of a memory according to a third embodiment of the semiconductor integrated circuit device of the present invention, illustrating the layout of a converter for a row address signal based on the above first embodiment.

FIG. 9 is a block diagram showing primary parts of a memory according to a third embodiment of the semiconductor integrated circuit device of the present invention, illustrating the layout of a converter for row address signal A8 based on the first embodiment. Other row address signals are not depicted in the diagram.

Multiplexers 13, provided for each of the cell arrays (0) to (9), output row addresses, which are input from the outside to the semiconductor integrated circuit device when writing/reading, and refreshing addresses, which are supplied from the refresh counter 17, when refreshing. The inverter 18, which comprises a converter, is provided on the transmission path of address signal A8 between cell arrays (4) and (5). Consequently, with respect to cell arrays (5) to (9), cell arrays selected when writing/reading are different from cell arrays selected when refreshing due to the effect of A8.

Figure 10:
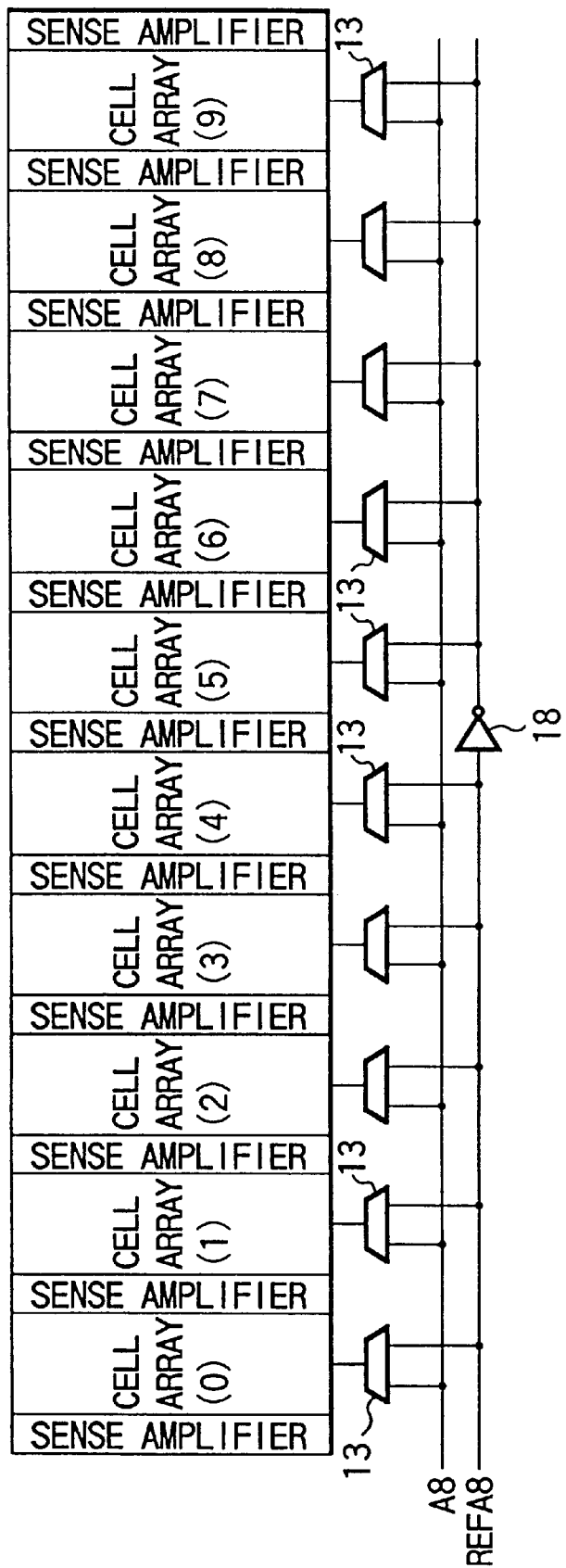
FIG. 10 is a block diagram showing primary parts of a memory according to a fourth embodiment of the semiconductor integrated circuit device of the present invention, illustrating the layout of a converter for a refresh address signal based on the above second embodiment.

FIG. 10 is a block diagram showing primary parts of a memory according to a fourth embodiment of the semiconductor integrated circuit device of the present invention, illustrating the layout of a converter for refresh address signal REFA8 based on the above second embodiment. Other row address signals are not depicted in the diagram.

Multiplexers 13, provided for each of the cell arrays (0) to (9), output row addresses, which are input from the outside to the semiconductor integrated circuit device when writing/reading, and refreshing addresses, which are supplied from the refresh counter 17, when refreshing. The inverter 18, which comprises a converter, is provided on the transmission path of address signal REFA8 between cell arrays (4) and (5). Consequently, with respect to cell arrays (5) to (9), cell arrays selected when writing/reading can be different from cell arrays selected when refreshing due to the effect of REFA8.

In the case of a embedded-logic memory, memories of various capacity should ideally be provided with minimum replacement. Next, a configuration will be described wherein the present invention has been implemented with consideration to this point.

Figure 11:
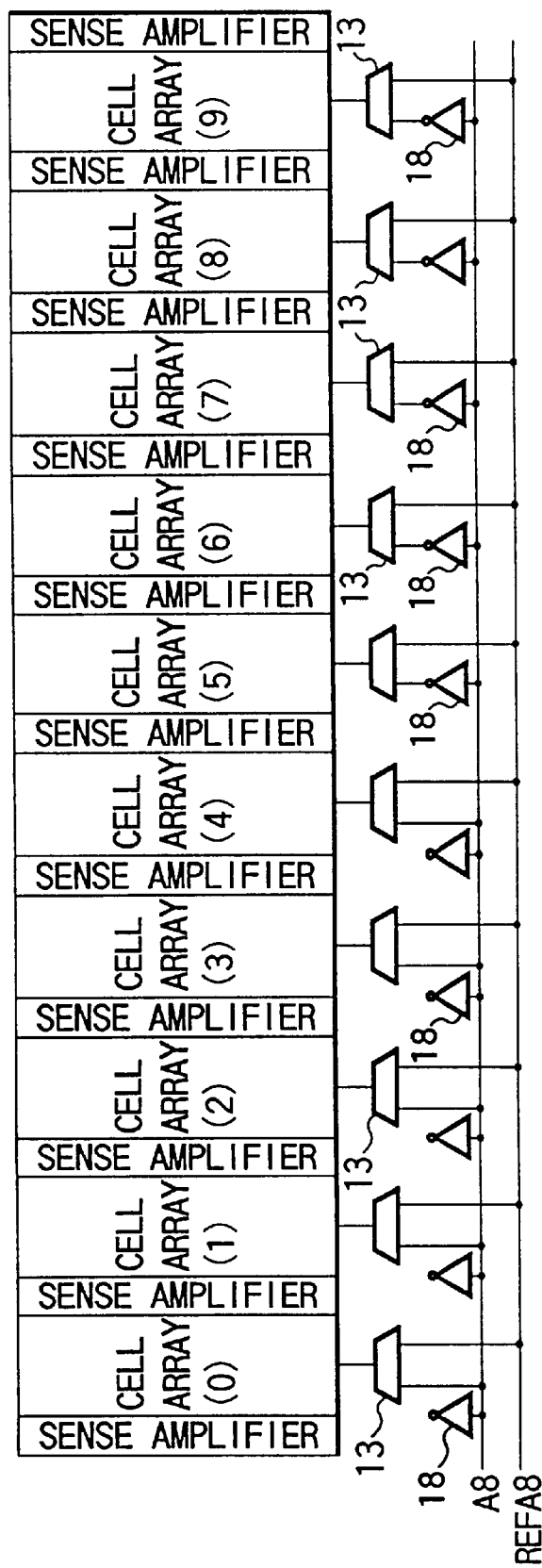
FIG. 11 is a block diagram showing primary parts of a memory according to a fifth embodiment of the semiconductor integrated circuit device of the present invention, illustrating the layout of converters for a row address signal based on the above first embodiment.

FIG. 11 is a block diagram showing primary parts of a memory according to a fifth embodiment of the semiconductor integrated circuit device of the present invention, illustrating the layout of converters for row address signal A8 based on the above first embodiment. Other row address signals are omitted.

Multiplexers 13, provided for each of the cell arrays (0) to (9), output row addresses, which are input from the outside to the semiconductor integrated circuit device when writing/reading, and refreshing addresses, which are supplied from the refresh counter 17, when refreshing. In this example, inverters 18, comprising converters, corresponding to all the cell array blocks (0) to (9) are provided along the transmission path of the row address signal A8. Consequently, most of the layout pattern can be formed from repeated array units. Furthermore, since the mask pattern is comparatively simple, it is possible to reduce loading effect (phenomenon whereby a desired pattern cannot be created due to diffraction of light caused by variation in the intensity of the mask pattern).

In the configuration described above, only cell arrays (5) to (9) required address-conversion. Therefore, outputs from the converters are not used for the other cell array blocks. That is, the inverters 18 are connected so as to effect the transmission path of the row address signal A8 to cell arrays (5) to (9) only.

Figure 12:
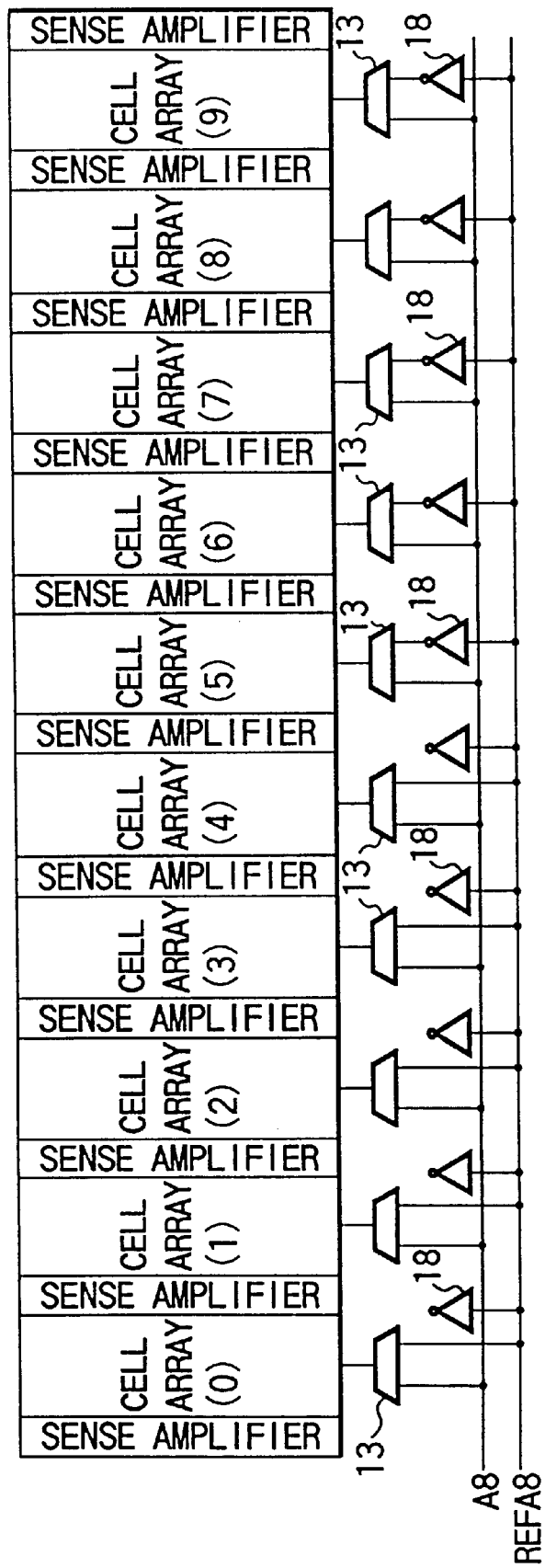
FIG. 12 is a block diagram showing primary parts of a memory according to a sixth embodiment of the semiconductor integrated circuit device of the present invention, illustrating the layout of converters for a refresh address signal based on the above second embodiment.

FIG. 12 is a block diagram showing primary parts of a memory according to a sixth embodiment of the semiconductor integrated circuit device of the present invention, illustrating the layout of a converter for refresh address signal REFA8 based on the second embodiment. Other row address signals are not depicted.

Multiplexers 13, provided for each of the cell arrays (0) to (9), output row addresses, which are input from the outside to the semiconductor integrated circuit device when writing/reading, and refreshing addresses, which are supplied from the refresh counter 17, when refreshing. In this example, inverters 18, comprising converters, corresponding to all the cell array blocks (0) to (9) are provided along the transmission path of the refresh address signal REFA8. Consequently, most of the layout pattern can be formed from repeated array units. Since only cell arrays (5) to (9) require address-conversion, outputs from the converters are not used for the other cell array blocks. That is, the inverters 18 are connected so as to affect the transmission path of the refresh address signal REFA8 to cell arrays (5) to (9) only.

According to the configurations of each of the embodiments described above, when writing/reading, the row address signal A8 can be used together with other row address signals to appropriately select those cell array groups which have been stipulated by row addresses: cell array groups (0) and (5), (1) and (6), (2) and (7), (3) and (8), (4) and (9). And, when refreshing, the row address signal A8 can be used to appropriately select the cell array group comprising (0), (2), (4), (6), (8) or the group comprising (1), (3), (5), (7), (9) due to providing address conversion in transmission path for row address A8 or signal REF8.

As a result, sense amplifiers can be shared between all adjacent cell arrays. Furthermore, in the configurations shown in FIG. 11 and FIG. 12, since inverters 18 for address conversion are provided for the cell array units, it need only be determined whether or not to connect these inverters so as to affect signal transmission. Therefore, in a memory such as an ASIC (application specific IC) embedded DRAM, it is easier to produce a standard cell or gate array circuit. Since the same pattern layout is used in either case, memory capacity can easily be increased and loading can be preventing.

Figure 13:
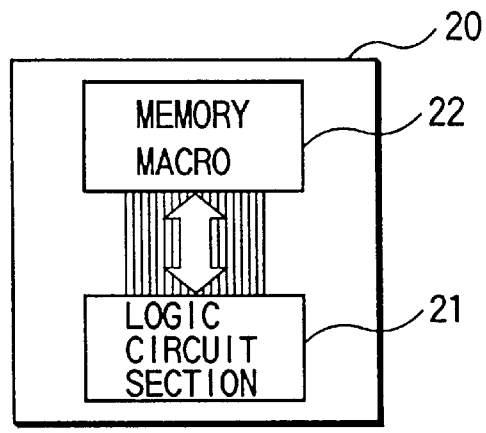
FIG. 13 is a diagram showing the configuration of a embedded-logic memory chip.

For instance, as shown in FIG. 13, a logical circuit section 21 can be provided on the same chip 20 as a memory macro 22. In this case, the chip 20 may comprise either a gate array or a standard cell configuration, thereby enabling a desired memory chip to be formed within a short time period. This is because the circuit configuration of the memory macro can easily be designed, even when the memory capacity of the memory macro is changed in response to customer demand.

Since the present invention uses a shared sense amplifier system, area increase can be limited even when the memory has a predetermined capacity. This is possible because row address converters are provided within the memory. As a result, as shown in FIG. 13, there is no need to alter any circuits of the logical circuit section 21.

As explained above, by multiplexing with a multiplexer after changing a part of the row address signals for writing/reading from/to the DRAM, or after changing a part of the refresh address signals, the present invention is able to provide a memory wherein sense amplifiers can be shared between all adjacent cell arrays, in a memory system comprising memory cell arrays having a certain number of refresh units, and even in the case of a wherein the relation between the number of row addresses when writing/reading and the number of row addresses when refreshing is other than a relation wherein the larger number of addresses is a square of the smaller number of addresses.

Figure 14:
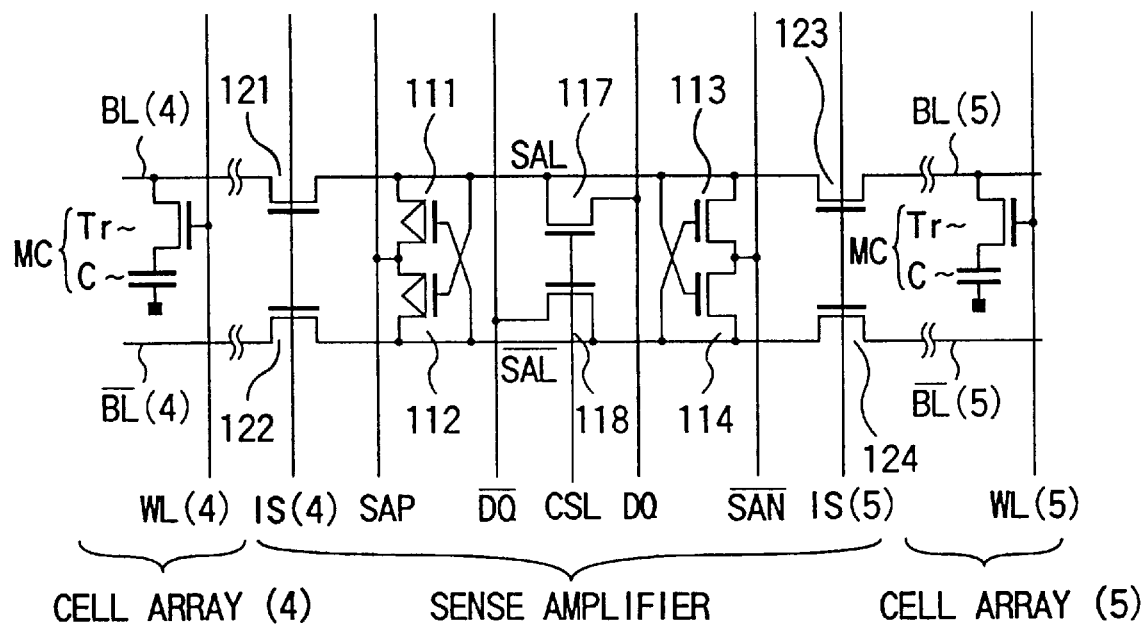
FIG. 14 is a circuit diagram showing an example configuration of a shared sense amplifier.

FIG. 14 is a circuit diagram showing an example configuration of a shared sense amplifier, used in all the sense amplifiers between cell arrays in the configuration shown in FIG. 3. For instance, assume that the diagram represents one configuration of a latch-type sense amplifier which is shared by adjacent cell arrays (4) and (5). The sense amplifier latches the relation of potential between bit line BL (4) or bit line BL (5), which constitute given rows in cell arrays (4) and (5) respectively, and their complementary /BL (4) or /BL (5) (in the diagram, the header is indicated by a bar above). For convenience, the interconnection between bit lines BL (4) and BL (5) is deemed sense line SAL, and the interconnection between bit lines /BL (4) and /BL (5) is deemed sense line /SAL (in the diagram, the header is indicated by a bar above).

The sense lines SAL and /SAL connect to drains of P-channel MOS transistors 111 and 112, and a control signal SAP is supplied to the sources of these transistors 111 and 112. The gate of transistor 112 connects to sense line SAL, the gate of transistor 111 connects to sense line /SAL. Furthermore, a control signal /SAN (in the diagram, the header is indicated by a bar above) is supplied to the sources of N-channel MOS transistors 113 and 114, and sense lines SAL and /SAL connect to the drains of these transistors 113 and 114. The gate of transistor 114 connects to sense line SAL, the gate of transistor 113 connects to sense line /SAL. Moreover, when enabled, the control signal SAP is set to a high-potential power source of the sense amplifier, and the control signal SAN is set to a low-potential power source (ground potential) of the sense amplifier. Furthermore, when disabled, the control signals SAP and SAN are set to a middle potential which does not exceed the threshold voltage of the transistors 111 to 114.

The sense line SAL is electrically connected, via the current path of an N-channel MOS transistor 117, to a global data line DQ. Sense line /SAL is electrically connected, via the current path of an N-channel MOS transistor 118, to a global data line /DQ (being complementary to DQ; in the diagram, the header is indicated by a bar above). A column selection signal is supplied to transistors 117 and 118. Transfer gate 121 forms an electrical path between the sense line SAL and the bit line BL (4). Transfer gate 122 forms an electrical path between the sense line /SAL and the bit line /BL (4). The transfer gates 121 and 122, which are controlled by an isolating control signal IS (4), electrically control and isolate-control the path between the sense amplifier and the cell array (4) comprising an array of memory cells MC. Furthermore, transfer gate 123 forms an electrical path between the sense line SAL and the bit line BL (5); and transfer gate 124 forms an electrical path between the sense line /SAL and the bit line /BL (5). The transfer gates 123 and 124, which are controlled by an isolating control signal IS (5), electrically control and isolate-control the path between the sense amplifier and the cell array (5) which comprises an array of memory cells MC.

The memory cell MC of FIG. 14 comprises a transistor Tr for transfer and a capacitor C for data accumulation. For convenience, a cell which is connected to a column (bit line) belonging to word lines (4) or (5), which constitute given rows within cell arrays (4) or (5) is principally represented.

In the embodiments so far explained, refresh addresses were generated using a counter (refresh counter 17) provided within the memory system. However, the present invention can also be applied in a case where the counter is provided outside the memory system.

Based on the above embodiments, according to the present invention, even when plurality of memory cells arrays are divided into an odd number of arrays (five cell arrays in the embodiments described above) using row addresses for writing/reading, during a refresh operation it is possible to ensure that the number of cell arrays simultaneously selecting one of two adjacent cell arrays, which share a sense amplifier, is equal to the number of cell arrays simultaneously selecting the other cell array.

Figure 15:
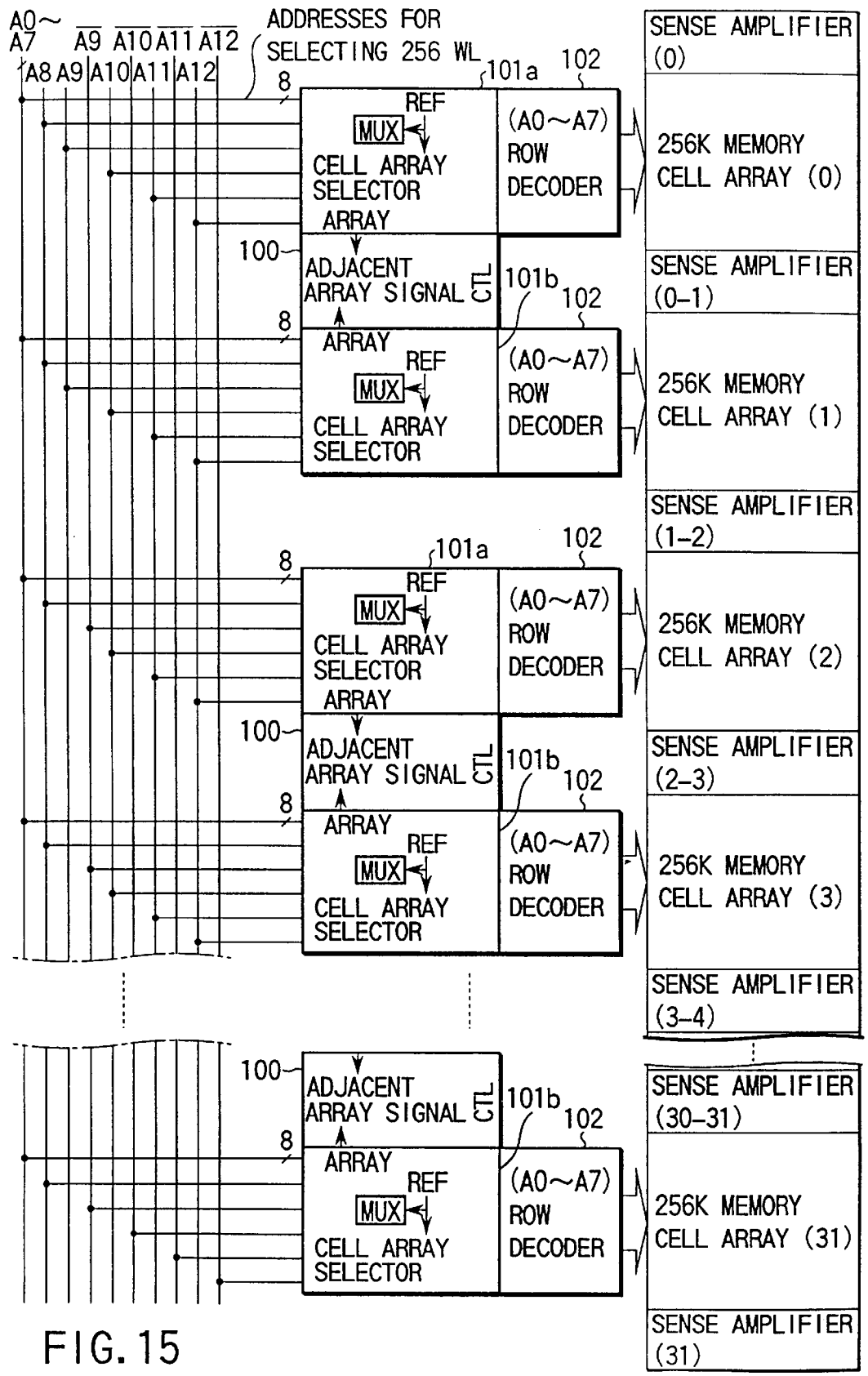
FIG. 15 is a circuit block diagram showing primary parts of a DRAM implementing a seventh embodiment of the present invention.

FIG. 15 is a circuit block diagram showing primary parts of a DRAM implementing a seventh embodiment of the present invention. The present embodiment relates to a memory system comprising thirty-two 256k cell arrays.

Each 256 cell array has 256 word lines (not shown in the diagram). A cell array selector 101 (101a or 101b) and a row decoder 102 are provided to each cell array. Row addresses R0 to R7 select one word line among the 256 word lines contained in each cell array. Each of the thirty-two cell arrays can be selected by addresses A8 to A12 (corresponding complementary lines are shown only for A9 to A12).

Adjacent cell arrays which share a sense amplifier, for instance, cell arrays (0) and (1), also share addresses A9 to A12. Either one of the cell arrays (0) and (1) can be selected by address signal A8. Similarly, cell arrays (2) and (3) share addresses A9 to A12, and either one can be selected by address signal A8.

When writing/reading, the 32 cell arrays are selected by addresses A8 to A12, but when refreshing, all the signal lines of addresses A9 to A12 become active ("H") and the 32 cell arrays are selected only by address signal A8.

In FIG. 15, cell array selectors 101 (101a and 101b) are provided to the adjacent cell arrays. These cell array selectors 101 produce array signals for selecting cell arrays. Cell array selectors 101a and 101b together use address signal A8 in complement, thereby ensuring that adjacent cell arrays are not selected simultaneously. The cell array selectors 101 (101a and 101b) are similarly provided in correspondence with other adjacent pairs of cell arrays which share signal signals A9 to A12. A controller 100, to be explained later, uses an ARRAY signal from each of the cell array selectors 101a and 101b.

The cell array selectors 101 (101a and 101b) are provided in a layout comprising the following sequence, beginning from the head cell array (0): 101a, 101b, 101a, 101b, ... (first layout), whereby adjacent cell arrays have identical addresses with the exception of A8.

Therefore, when the number of memory cell arrays specified by the row address for writing/reading is an even number, the address header always starts from a cell array having a cell array selector 101a. Therefore, when the number of memory cell arrays in bank even, the memory comprises an sequence of the above first layouts.

However, when the number of memory cell arrays specified by the row address for writing/reading is an odd number, the address header will start from a cell array having cell array selector 10b. That is, the cell array selectors 101 may also be provided in a layout comprising the sequence from the row address header: 101b, 101a, 101b, 101a (second layout). Therefore, when the number of memory cell arrays in a block is odd, the memory comprises an alternating sequence of the above first and second layouts.

Each cell array selector 101 (101a and 101b) has a multiplexer for switching output in compliance with an operation mode (writing/reading or refreshing) (MUX). Consequently, address transmission and cell array selection performed in compliance with operation mode is reflected in a row decoder 102.

Next, FIGS. 16 to 26 are specific circuit diagrams illustrating the relation between the cell array selectors 101 and the row decoder 102.

Figure 16A:
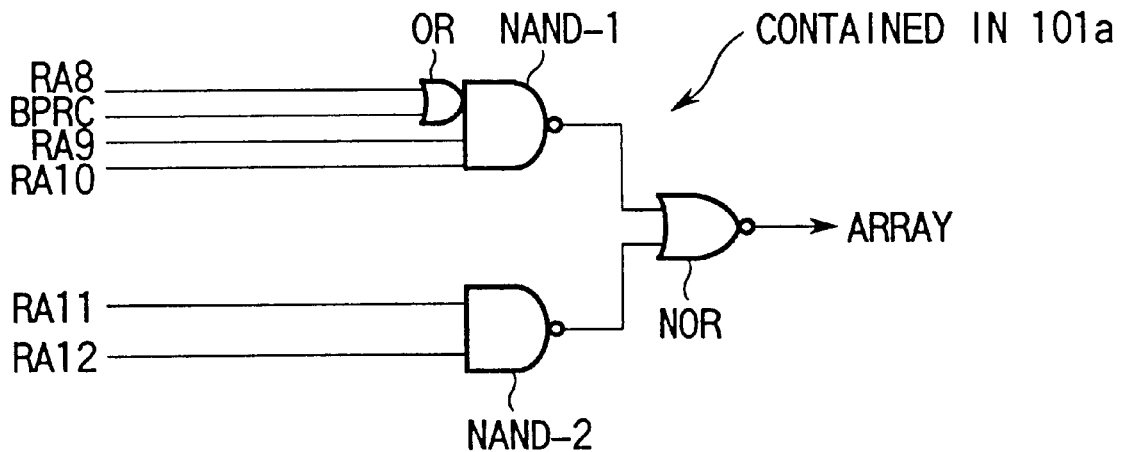
FIGS. 16A and 16B are diagrams of circuits for producing control signals for selecting cell arrays, included in FIG. 15.
Figure 16B:
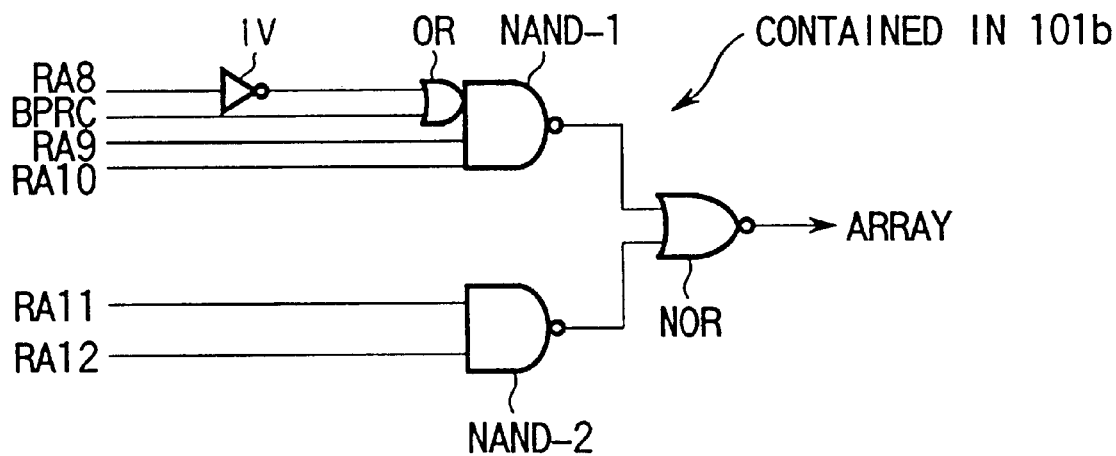

FIGS. 16A and 16B illustrate circuits which produce a control signal ARRAY for selecting the 256k cell arrays, which are contained in the cell array selectors 101a and 101b.

In each diagram, row address signals RA8 to RA12 are determined by predetermined connections of A9 to A12, comprising complementary signals in correspondence to A8 to A12 of FIG. 15, and A8. Further, signal BPRC is a bank precharge signal which is provided to select cell arrays irrespective of RA8 when precharging a bank containing cell arrays to be selected.

The circuit shown in FIG. 16A have the following configuration. The signal RA8 and signal BPRC are input to an OR logic gate OR. The output from the OR gate is input together with signals RA9 and RA10 to a NAND logic gate NAND-1. Signals RA11 and RA12 input to a NAND logic gate NAND-2. A NOR logic gate NOR outputs an ARRAY signal.

The circuit shown in FIG. 16B is the same as FIG. 16A with the exception of an inverter IV which is appended to the circuit of FIG. 16A. The inverter IV inverts the signal RA8 and sends it to the logic gate OR. The logic gate NOR outputs the ARRAY signal.

That is, the same address signals are input to both FIGS. 16A and 16B, but the circuit configurations of FIGS. 16A and 16B produce ARRAY signals having different logical outputs due to the provision in FIG. 16B of the inverter IV.

Therefore, when low addresses (RA12, RA11, RA10, RA9, RA8)=(11111), the ARRAY signal output from the circuit of FIG. 16A is at the "H" level. Consequently, the ARRAY signal output from the circuit of FIG. 16B at this time is at the "L" level.

On the other hand, when low addresses (RA12, RA11, RA10, RA9, RA8)=(11110), the ARRAY signal output from the circuit of FIG. 16A is at the "L" level. Consequently, the ARRAY signal output from the circuit of FIG. 16B at this time is at the "H" level.

Figure 17:
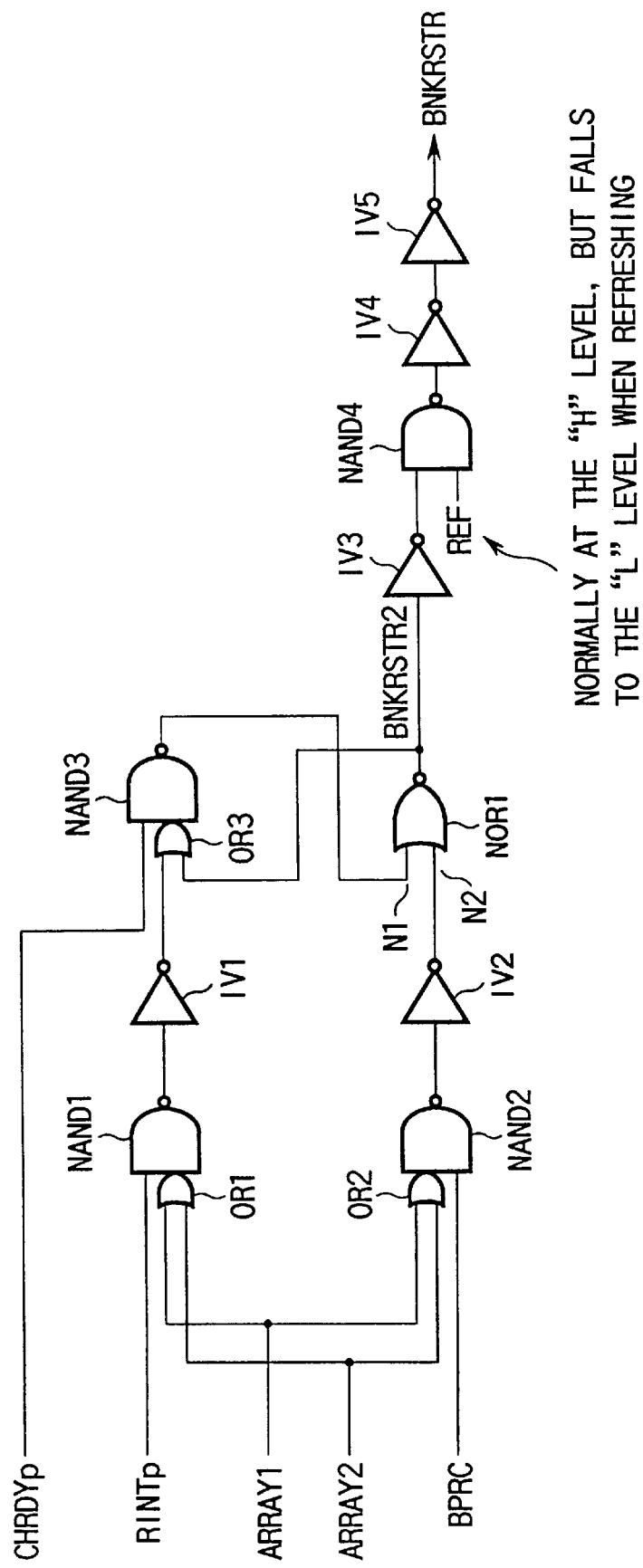
FIG. 17 is a circuit diagram for producing a segment selection control signal included in FIG. 15.

FIG. 17 shows a circuit (the controller(CTL) 100 of FIG. 115) for producing a segment selection control signal (BNKRSTR). This circuit is provided to every two adjacent cell arrays (segment) which are not selected simultaneously when refreshing. OR1 to 3 are OR logic gates, NAND 1 to 4 are NAND logic gates, NOR1 is a NOR logic gate, and IV1 to 5 are inverters.

ARRAY 1, comprising the ARRAY signal from the circuit in FIG. 16A (or the signal from the circuit in FIG. 16B), and ARRAY 2, comprising the ARRAY signal from the circuit in FIG. 16B (or the signal from the circuit in FIG. 16A), are input to the logic gates OR1 and OR2. The logic gate NAND1 receives the output from the logic gate OR1 and a signal RINTp. The logic gate NAND2 receives the output from the logic gate OR1 and a signal BPRC.

Inverter IV1 inverts the output from the logic gate NAND1. Inverter IV2 inverts the output from the logic gate NAND2. The inverter IV1 and the logic gate NOR1 input to the logic gate OR3. Logic gate OR3 and signal CHRDYp input to the logic gate NAND3. The inverter IV2 and the logic gate NAND3 input to logic gate NOR1.

The inverter IV3 inverts the output from the logic gate NOR1. The output from the inverter IV1 and the refresh control signal REF are input to the logic gate NAND4. Inverters IV4 and IV5, connected in sequence, output the output from the logic gate NAND4 as the signal BNKSTR.

In FIG. 17, the CHRDYp signal is a signal for preventing malfunction. After power has been injected into the memory system, the CHRDYp signal remains the "L" level until the system is stable; normally, the CHRDYp signal keeps the "H" level.

In FIG. 17, the RINTp signal rises to the "H" level when the cell array is active. Furthermore, the BPRC signal is a precharge signal (at the "H" level during precharging) of a bank containing the selected cell arrays. The refresh control signal REF is normally at the "H" level, but falls to the "L" level when refreshing.

The level of the BNKRSTS signal produced by the circuit shown in FIG. 17 when writing/reading, holds the following levels while the bank is being precharged. When the BNKRSTS signal was previously at the "L" level (cell array unselected), it keeps the "L" level, but if the previous level was the "H" level, the BNKRSTS signal falls to the "L" level. The reason for the former is that nodes N1 and N2 of the logic gate NOR1 respectively keep the "H" level and the "L" level. The reason for the latter is that, from the point where the nodes N1 and N2 were both at the "L" level, node N1 rises to the "H" level.

After bank precharging, the RINTp signal is input together with the signals ARRAY1 and ARRAY2, at least one of which is at the "H" level. As a result, the BNKRSTR signal rises to the "H" level.

Figure 18A:
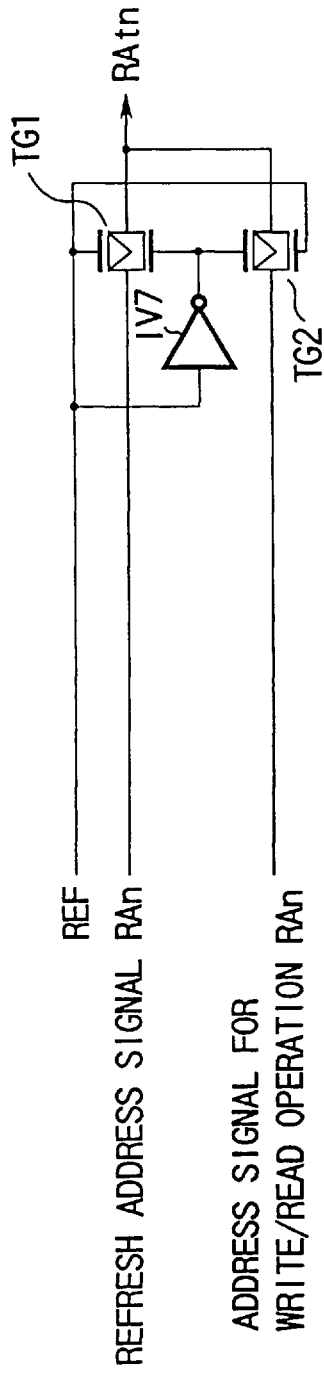
FIGS. 18A and 18B are circuit diagrams relating to the multiplexer included in FIG. 15.
Figure 18B:
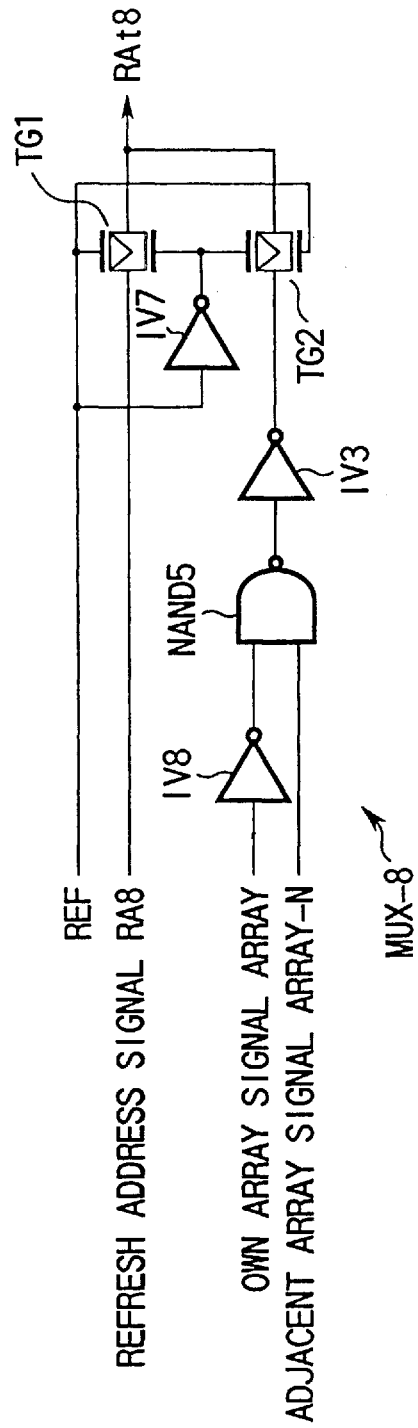

FIGS. 18A and 18B are circuit diagrams relating to the multiplexer MUX of FIG. 15. The multiplexer outputs a row address signal for either writing/reading or refreshing. The refresh control signal REF controls the multiplexer. Nine multiplexers are provided for the nine bits of row address signals RAt0 to RAt8 (the final t indicates "true"), that is, one unit comprises nine multiplexers.

Each multiplexer MUX has the following configuration. The P-channel gate of transfer gate TG1 and the N-channel gate of transfer gate TG2 are both controlled by the refresh control signal REF. The N-channel gate of transfer gate TG1 and the P-channel gate of transfer gate TG2 are both controlled by an inverted signal, formed by inverting the refresh control signal REF using an inverter IV7. More specifically, the transfer gate TG1 conducts when signal REF is at the "L" level. The transfer gate TG2 conducts when signal REF is at the "H" level.

That is, refresh address signals are output via the transfer gate TG1. The row address signals for writing/reading are output via the transfer gate TG2. The transfer gates TG1 and TG2 are activated in complement by the refresh control signal REF, the output of either one of the transfer gates TG1 and TG2 forming row address signals RAt0 to 8.

One unit of multiplexers MUX may comprise eight of the circuits shown in FIG. 18A provided in correspondence with RAt0 to RAt7, in addition to one circuit of FIG. 18B in correspondence with RAt8 (first unit configuration). Alternatively, one unit of multiplexers MUX may comprise nine of the circuits shown in FIG. 18A in correspondence with RAt0 to RAt8 (second unit configuration).

In the present embodiment, the above first unit configuration is included in all the cell array selectors 101 (101a, 10b) when the number of memory cell arrays specified by row addresses for writing/reading is an even number. That is, the first unit configuration is provided in correspondence with the first layout, wherein the cell array selectors are arranged in the sequence 101a, 101b as described in FIG. 15.

On the other hand, the second unit configuration is provided in correspondence with the second layout, wherein the cell array selectors are arranged in the sequence 101b, 101a, as described in FIG. 15. That is, when the number of memory cell arrays specified by row addresses for writing/reading is an odd number, multiplexers MUX according to the first unit configuration are provided in correspondence with the first layout, and multiplexers MUX according to the second unit configuration are provided in correspondence with the second layout.

FIG. 18B shows the circuit configuration of a multiplexer MUX-8 for creating RAt8, forming a part of a row address for writing/reading. The multiplexer MUX for creating RA0t to RA7t outputs row address signals RA0t to RA7t unchanged via the transfer gate TG2. However, the multiplexer MUX-8 outputs RA8t using the following two signals: an ARRAY signal (own array signal ARRAY), created by the multiplexer's own cell array selector, and an ARRAY signal, created by an adjacent cell array selector (adjacent array signal ARRAY-N).

That is, in the multiplexer MUX-8, the own array signal ARRAY is inverted by the inverter IV8 and input to one of the terminals of the NAND logic gate NAND5. The adjacent array signal ARRAY-N is input unchanged to the other terminal of the NAND logic gate NAND5. The output from the NAND5 is inverted by the inverter IV8 and output via the transfer gate TG2 as row address signal RA8t.

For instance, as shown in FIG. 15, when the value of the input row address signal A8 is "0" (that is, when RA8 is at the "L" level), cell arrays having the smaller number (in the diagram, memory cell array (0) and memory cell array (2)) are selected from the adjacent cell arrays which use adjacent array signals.

In other words, as a result of the "L" level of the row address signal RA8, the ARRAY signal from the circuit shown in FIG. 16A is at the "L" level, but the ARRAY signal from the circuit shown in FIG. 16B is at the "H" level.

As a result of this ARRAY signal, at the cell array selector 101a, provided in correspondence with memory cell array (0), the own ARRAY signal is output at the "L" level, and the adjacent array signal is at the "H" level. Therefore, the multiplexer MUX-8 of FIG. 18B produces a row address signal RA8t at the "H", level, which is reflected in a decoder to be explained later. Furthermore, at the cell array selector 101b, provided in correspondence with memory cell array (1), the own ARRAY signal is output at the "H" level, and the adjacent array signal is at the "L" level. Therefore, the multiplexer MUX-8 of FIG. 18B produces a row address signal RA8t at the "L" level, which is reflected in a decoder to be explained later.

On the other hand, for instance, in FIG. 15, when the value of the input row address signal A8 is "1" (that is, when RA8 is at the "H" level), cell arrays having the larger number (in the diagram, memory cell array (1) and memory cell array (3)) are selected from the adjacent cell arrays which use adjacent array signals.

In other words, as a result of the "H" level of the row address signal RA8, the ARRAY signal from the circuit shown in FIG. 16A is at the "H" level, but the ARRAY signal from the circuit shown in FIG. 16B is at the "L" level.

As a result of these ARRAY signals, at the cell array selector 101a, provided in correspondence with memory cell array (0), the own ARRAY signal is output at the "H" level, and the adjacent array signal is at the "L" level. Therefore, the multiplexer MUX-8 of FIG. 18B produces a row address signal RA8t at the "L" level, which is reflected in a decoder to be explained later. Furthermore, at the cell array selector 101b, provided in correspondence with memory cell array (1), the own ARRAY signal is output at the "L" level, and the adjacent array signal is at the "H" level. Therefore, the multiplexer MUX-8 of FIG. 181B produces a row address signal RA8t at the "H" level, which is reflected in a decoder to be explained later.

The symbol RAt<0:8> in FIGS. 18A and 18B, signifies that there are nine bits from row address RAt0 to row address RAt8, and any one signal from these is depicted. Hereinafter, other symbols of the form<X:Y> signify the same.

Figure 19:
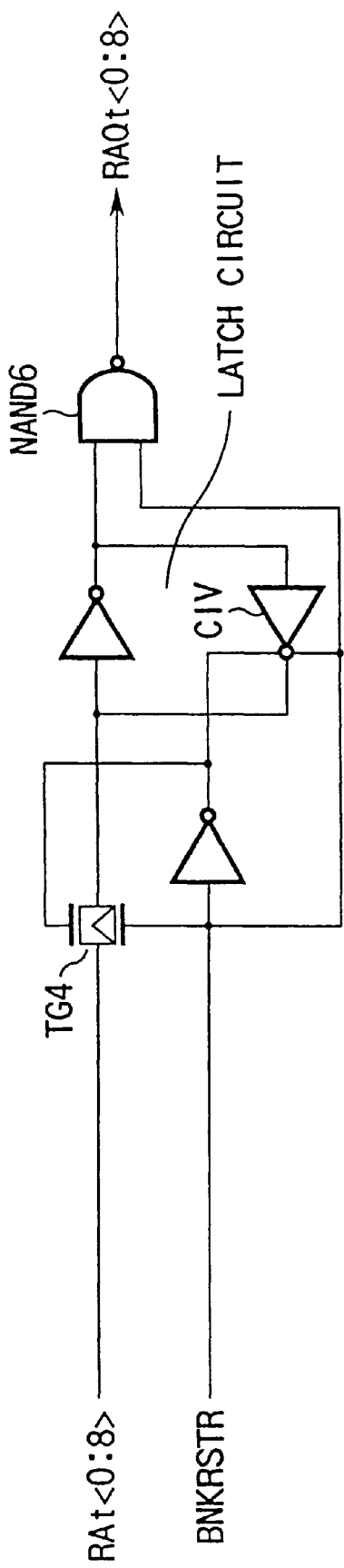
FIG. 19 is a circuit diagram showing the row address latch offer included in FIG. 15.

FIG. 19 is a circuit diagram showing a row address latch buffer for latch-outputting the low addresses RAt<0:8> from the multiplexer of FIGS. 18A and 18B in synchronism with a BNKRSTR signal. Therefore, nine of the circuits in FIG. 19 are provided to each of the cell array selectors shown in FIG. 15.

Therefore, the latch circuit latches the RAt<0:8> address signals via a transfer gate TG4, which is controlled by the BNKRSTR signal. The clocked inverter CIV of the latch circuit is controlled by the BNKRSTR signal. In addition, the latch circuit outputs via a NAND logic gate NAND6, the output of which is controlled by the BNKRSTR signal. Address signals output from the NAND6 are expressed as RAQt<0:8>.

Figure 20:
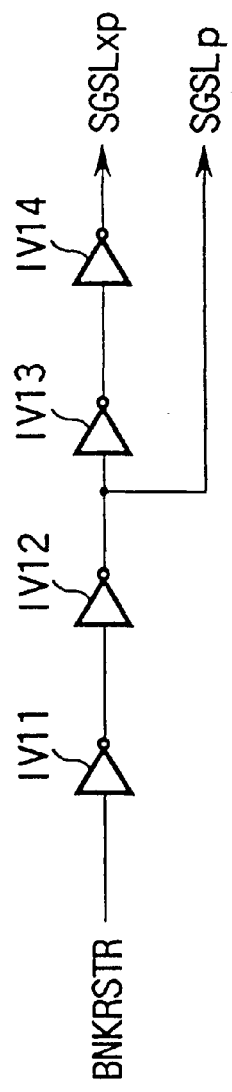
FIG. 20 is a diagram of a circuit for producing a control signal in order to select predetermined adjoining cell arrays (segments) included in FIG. 15.

FIG. 20 is a diagram of a circuit for producing a control signal in order to select predetermined adjacent cell arrays (segment). A signal SGSLxp is created by passing the BNKRSTR signal, obtained in FIG. 17 above, via inverters IV11 to IV14. Signal SGSLp is created by inputting the BNKRSTR signal via inverters IV11 and IV12. One of the circuits having the configuration shown in FIG. 20 is provided for each memory cell array specified by the row address for writing/reading.

Figure 21:
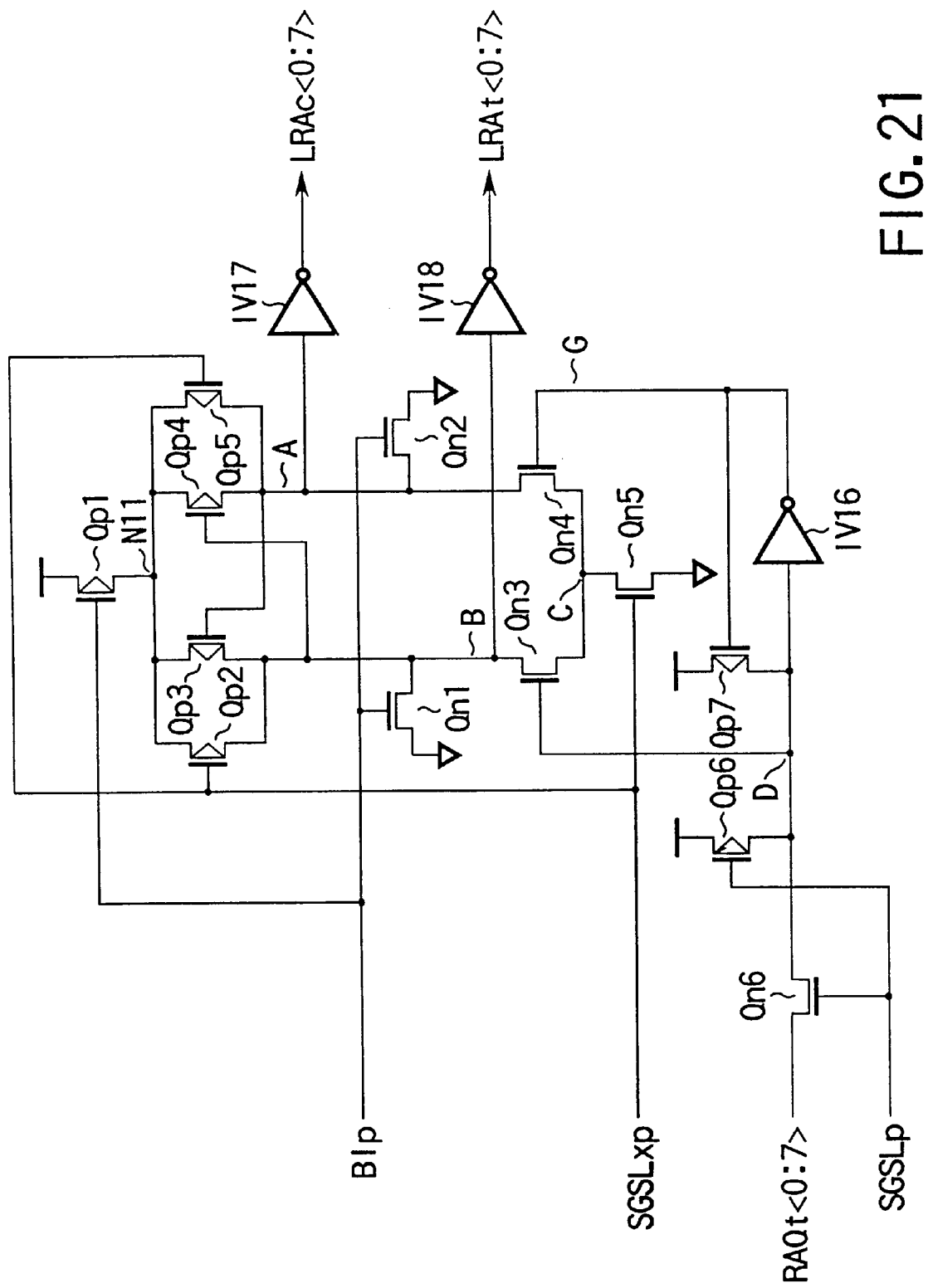
FIG. 21 is a circuit diagram for producing a complementary signal for each address signal included in FIG. 15

FIG. 21 is a diagram of a circuit for producing a complementary signal for each of the address signals RAQt<0:7>. This circuit is set to the write/read operation by the "L" level of signal BIp. When signal BIp is at the "H" level, the outputs of this circuit (the outputs from inverters IV17 and IV18) are both fixed at the "H" level.

That is, during the write/read operation, the circuit of FIG. 21 creates amplified complementary signals LRAc<0:7> and LRAt<0:7> of each of the address signals RAQt<0:7> (the final c indicates "complementary", the indicates "true") using the "H" level of signals SGSLxp and SGSLp. Therefore, eight of the circuits shown in FIG. 21 are provided for these signal outputs.

The circuit of FIG. 21 has the following configuration. A signal BIp is supplied to the gate of a P-channel MOSFET Qp1, a power source potential is supplied to one end of the conduction path of the P-channel MOSFET Qp1 and the other end connects to a node N11. A signal SGSLxp is supplied to the gate of a P-channel MOSFET Qp2, the node N11 is connected to one end of the conduction path of the P-channel MOSFET Qp2 and the other end connects to a node B. A signal from node A is supplied to the gate of a P-channel MOSFET Qp3, the node N11 is connected to one end of the conduction path of the P-channel MOSFET Qp3 and the other end connects to a node B. A signal from node B is supplied to the gate of a P-channel MOSFET Qp4, the node N11 connects to one end of the conduction path of the P-channel MOSFET Qp4 and the other end connects to a node A. The signal SGSLxp is supplied to the gate of a P-channel MOSFET Qp5, the node N11 connects to one end of the conduction path of the P-channel MOSFET Qp5 and the other end connects to a node A.

The signal BIp is supplied to the gate of an N-channel MOSFET Qn1, node B connects to one end of the conduction path of the N-channel MOSFET Qn1 and the other end connects to the ground potential. The signal BIp is supplied to the gate of an N-channel MOSFET Qn2, node A connects to one end of the conduction path of the N-channel MOSFET Qn2 and the other end connects to the ground potential.

Signal D is supplied to the gate of an N-channel MOSFET Qn3, node B connects to one end of the conduction path of the N-channel MOSFET Qn3 and the other end connects to node C. Signal G is supplied to the gate of an N-channel MOSFET Qn4, node A connects to one end of the conduction path of the N-channel MOSFET Qn4 and the other end connects to node C. The signal SGSLxp is supplied to the gate of an N-channel MOSFET Qn5, node C connects to one end of the conduction path of the N-channel MOSFET Qn5 and the other end connects to the ground potential. The signal SGSLp is supplied to the gate of an N-channel MOSFET Qn6, signal RAQt<0:7> (that is, one of signals RAQt0 to 7) is supplied to one end of the conduction path of the N-channel MOSFET Qn6 and the other end connects to node D.

Signal SGSLp is supplied to the gate of a P-channel MOSFET Qp6, the power source potential connects to one end of the conduction path of the P-channel MOSFET Qp6 and the other end connects to a node D. Signal G is supplied to the gate of a P-channel MOSFET Qp7, the power source potential connects to one end of the conduction path of the P-channel MOSFET Qp7 and the other end connects to a node D.

Node D is connected to the input of an inverter IV16, and node G connects to the output. Node A is connected to the input of an inverter IV17 which outputs a complementary signal LRAc<0:7> corresponding to the signal RAQt<0:7> input at the start. Node B connects to the input of an inverter IV18 which outputs a signal LRAt<0:7> corresponding to the signal RAQt<0:7> input at the start.

Figure 22:
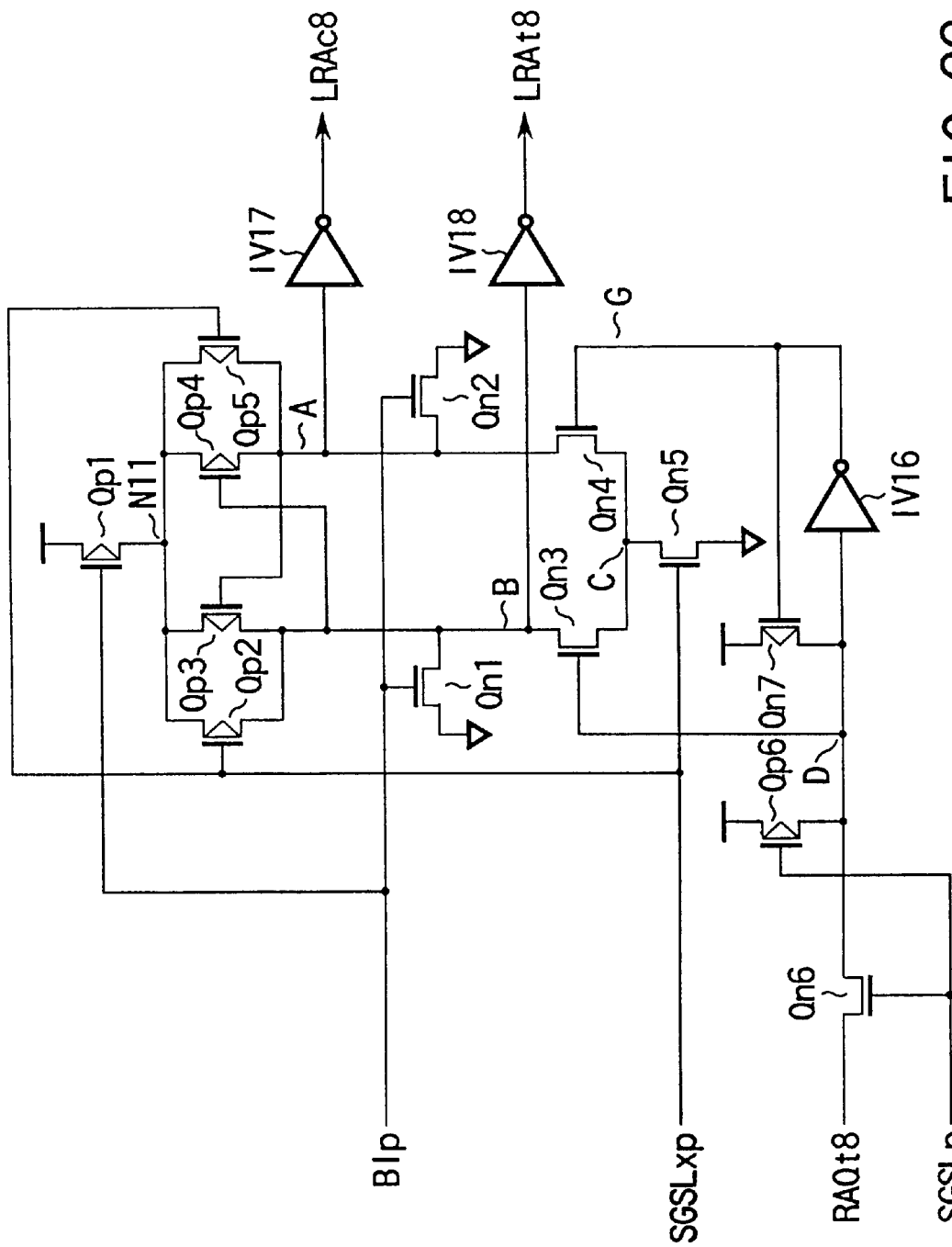
FIG. 22 is a circuit diagram for producing a complementary signal for an address signal relating to cell array selection included in FIG. 15.

FIG. 22 is a circuit diagram for producing a complementary signal of the address signal RAQt8 relating to cell array selection. Since the configuration is identical to that of the circuit of FIG. 21, like reference numerals are used. This circuit is set to the write/read operation by the "L" level of signal BIp. When signal BIp is at the "H" level, the outputs of this circuit (the outputs from inverters IV17 and IV18) are both fixed at the "H" level.

That is, during a write/read operation, the circuit of FIG. 22 creates amplified complementary signals LRAc8 and LRAt8 of the address signal RAQt8 using the "H" level of signals SGSLxp and SGSLp.

One unit, comprising eight of the circuits shown in FIG. 21 and one of the circuits shown in FIG. 22, is provided in correspondence with each memory cell array specified by the row address from writing/reading.

Figure 23:
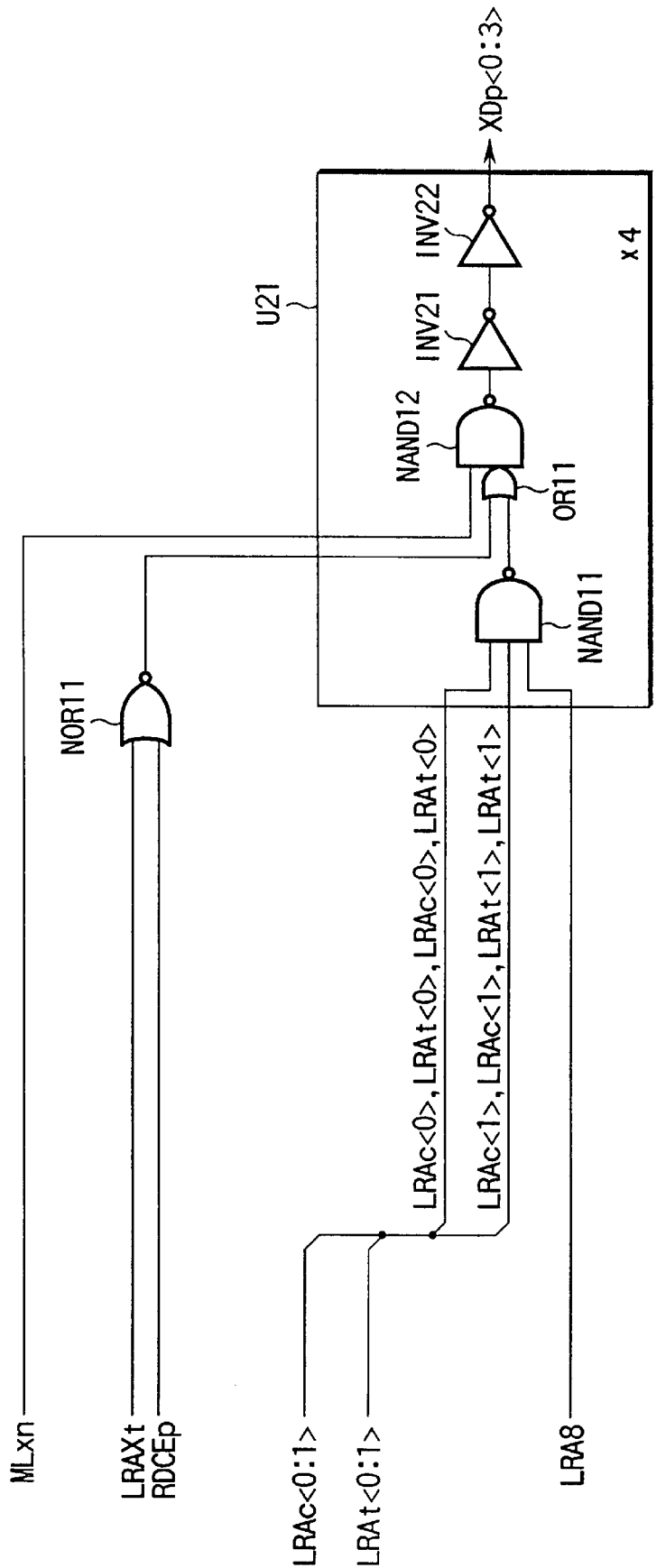
FIG. 23 is a circuit diagram for producing a control signal in order to select a word line driver of a row decoder included in FIG. 15.

FIG. 23 is a diagram of a circuit which produces a control signal for selecting a word line driver of a row decoder described later. Signal MLxn is a signal for redundancy control (not explained here) and normally keeps the "H" level. Signal LRAXt is a test system control signal (not explained here) and normally keeps the "L" level. When the row decoder is enabled, signal RDCEp rises to the "H" level. When the row decoder is enabled, the output from the NOR logic gate NOR11 falls to the "L" level.

In FIG. 23, there are four circuit units U21. Four combinations of signals LRAc<0:1> and LRAt<0:1>, created by the circuit of FIG. 21, and signal LRA8 are supplied to these four circuit units U21, which consequently output signals XDp<0:3> (that is, signals XDp0 to 3). Signal LAR8 comprises LRA8t or LRA8c, created in FIG. 22, the t or c logic being specified alternately in accordance with the array layout.

For instance, LRAc0 and LRAc1, one of the four combinations of signals LRAc<0:1> and LRAt<0:1> created by the circuit of FIG. 21, and signal LRA8 (t or c logic) are input to the NAND logic gate NAND11. The output from the NAND11 is supplied to one of the inputs of the logic gate OR11. The other input of the logic gate OR11 receives the logic gate NOR11 described above.

The output from the logic gate OR11 and the signal MLxn are input to the NAND logic gate NAND12, which outputs signal XDp0 via inverters IV21 and IV22 provided in series.

Figure 24A:
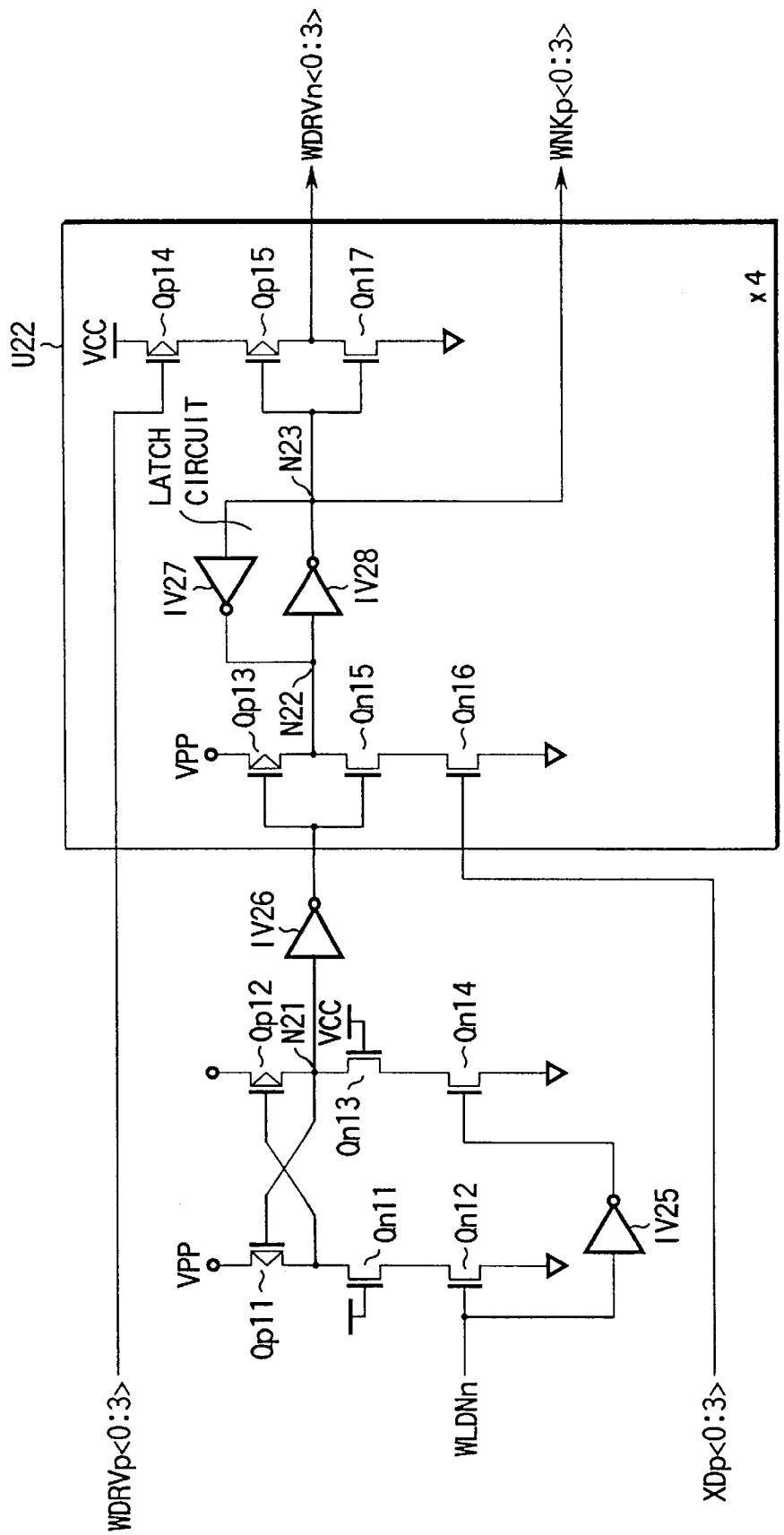
FIGS. 24A and 24B are circuit diagrams showing circuits for creating word line control signals included in FIG. 15.
Figure 24B:
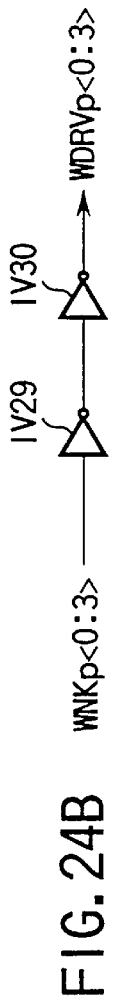

FIGS. 24A and 24B are circuit diagrams showing circuits for creating word line control signals. According to the above configuration, a control signal is created to prevent unselected word lines from fluctuating. Signal WLDNn holds the "L" level when the word line is selected, and rises to the "H" level when unselected.

That is, when WLDNn is at the "H" level, high-potential VPP power source potential ("H" level) is supplied to the node N21. Consequently, node N22 of the latch circuit outputs at the "H" level and node N23 outputs at the "L" level. As a result, signal WDRVp changes to the "L" level (See FIG. 24B) and signal WDRVn to the "H" level.

When WLDNn is outputting at the "L" level, "L" level is supplied to the node N21. Since signal XDp is at the "H" level, node N22 of the latch circuit outputs at the "L" level and node N23 outputs at the "H" level. As a result, signal WDRVp changes to the "H" level (See FIG. 24B) and signal WDRVn to the "L" level.

Circuit units comprising U22 of FIG. 24A are provided for the four control signals XDp<0:3> which are input for selecting a word line drive circuit of the row decoder; in other words, there are four circuit units U22 for each decoder.

The circuit of FIG. 24A has the following configuration. A high power source potential VPP is supplied to one end of the conduction path of a P-channel MOSFET Qp11, and the other end connects to the gate of a P-channel MOSFET Qp12. A high power source potential VPP is supplied to one end of the conduction path of the P-channel MOSFET Qp12, and the other end is connected to the gate (node N21) of the P-channel MOSFET Qp11.

A power source potential VCC is supplied to the gate of an N-channel MOSFET Qn11, one end of the conduction path connects to the gate of the N-channel MOSFET Qn12 and the other end connects to one end of the conduction path of the N-channel MOSFET Qn12. A signal WLDN is supplied to the gate of the N-channel MOSFET Qn12, and a ground potential is supplied to the other end of the conduction path.

A power source potential VCC is supplied to the gate of an N-channel MOSFET Qn13, one end of the conduction path of the N-channel MOSFET Qn13 is connected to the gate (node N21) of the P-channel MOSFET Qp11 and the other end connects to one end of the conduction path of an N-channel MOSFET Qn14. Signal WLDNn is inverted by the inverter IV25 to and input to the gate of the N-channel MOSFET Qn14. Ground potential is supplied to the other end of the conduction path of the N-channel MOSFET Qn14.

Inverter IV26 outputs the inverse of the signal from the node 21. The output from the inverter 26 is supplied to the gate of the P-channel MOSFET Qp13, the high power source potential VPP is supplied to one end of the conduction path of the P-channel MOSFET Qp13 and the other end is connected to node N22. The output from the inverter 26 is supplied to the gate of the N-channel MOSFET Qn15, one end of the conduction path of the N-channel MOSFET Qp15 connects to one end of the N-channel MOSFET Qn16 and the other end is connected to node N22. Signal XDp<0:3> is supplied to the gate of the N-channel MOSFET Qn16 and ground potential is supplied to the other end.

The latch circuit is formed by connecting the inputs and outputs of the inverters IV27 and IV28. The latch circuit also has latch nodes complementary to nodes 22 and 23.

The node 23 of the latch is connected to the gate of an N-channel MOSFET Qn17. Ground potential is supplied to one end of the conduction path of this MOSFET 17, and the other end outputs signal WDRVn<0:3>. Node N23 of the latch circuit is connected to the gate of P-channel MOSFET Qp15, one end of the conduction path of the P-channel MOSFET Qp15 connects to one end of the P-channel MOSFET Qp14, and the other end outputs signal WDRVn<0:3>. Signal WDRVp<0:3> is input to the gate of MOSFET Qn14, and power source potential VCC is supplied to the other end. Furthermore, the node 23 of the latch circuit outputs WNKp<0:3>.

The circuit of FIG. 24B has the following configuration. The WNKp<0:3> output from the node 23 of the latch circuit passes via inverters IV29 and 30, which are provided in series, thereby forming signal WDRVp<0:3>.

Figure 25:
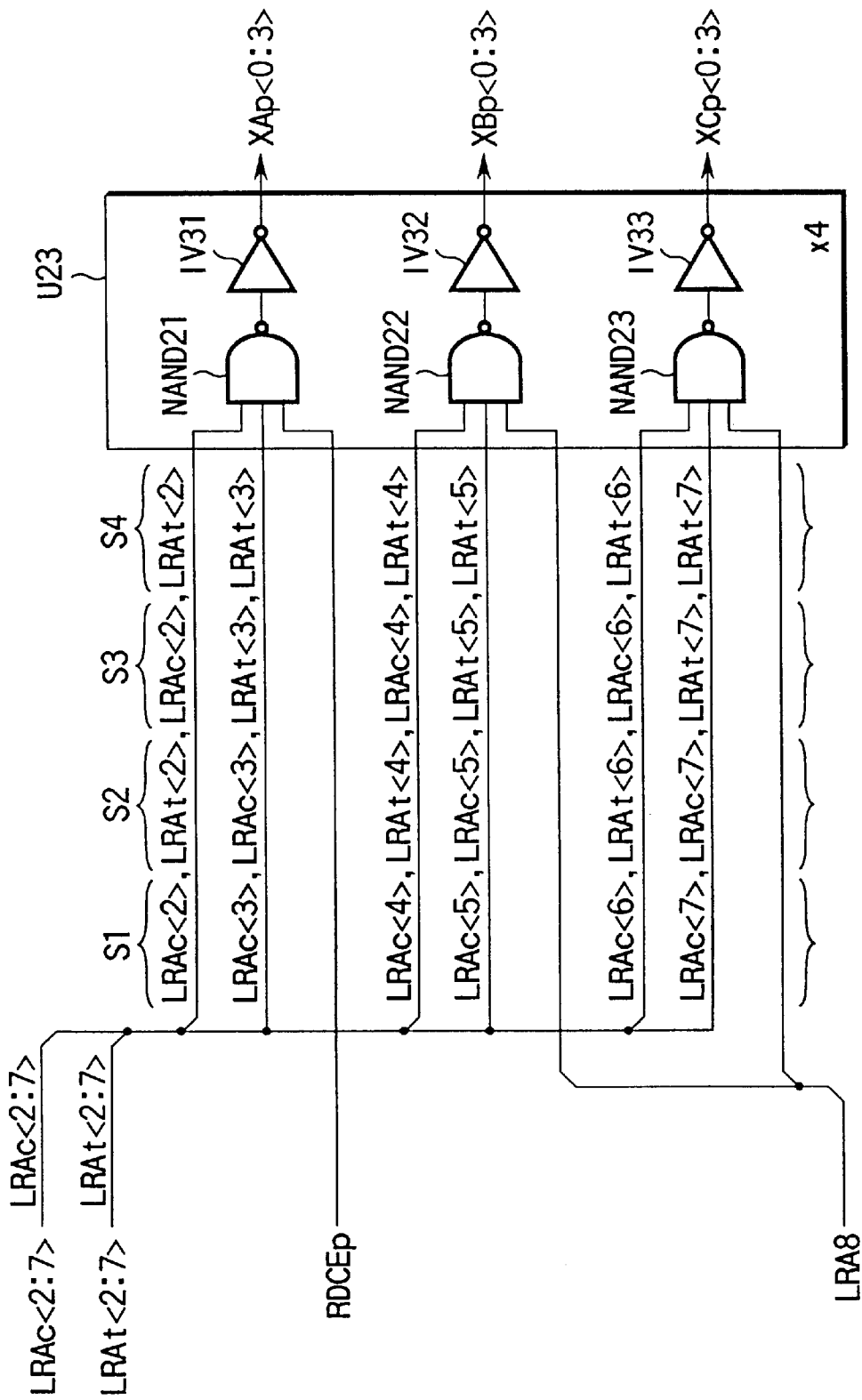
FIG. 25 is a circuit diagram showing a row pre-decoder (row partial decoder) included in FIG. 15.

FIG. 25 is a circuit diagram showing the row pre-decoder (row partial decoder). Four circuit units U23 are provided for one decoder. That is, the circuit units U23 utilize four signal combinations (S1 to S4): signal RDCEp indicating activation of the row decoder, signal LRA8 (t or c logic being determined in correspondence with cell array layout) created by the circuit unit of FIG. 22, and signals LRAc<2:7> and LRAt<2:7> created by the circuit unit of FIG. 21.

One of the circuit units U23 (using combination S1, for instance) has the following configuration. Signals LRAc<2> and LRAc<3> and signal RDCEp are input to a NAND logic gate NAND 21. An inverter 31 inverts the output from the NAND 21 and outputs signal XAp<0>. Signals LRAc<4> and LRAc<5> and signal LRA8 (t or c) are input to a NAND logic gate NAND 22. An inverter 32 inverts the output from the NAND 22 and outputs signal XBp<0>. Signals LRAc<6> and LRAc<7> and signal LRAt8 are input to a NAND logic gate NAND 23. An inverter 33 inverts the output from the NAND 23 and outputs signal XCp<0>.

Figure 26:
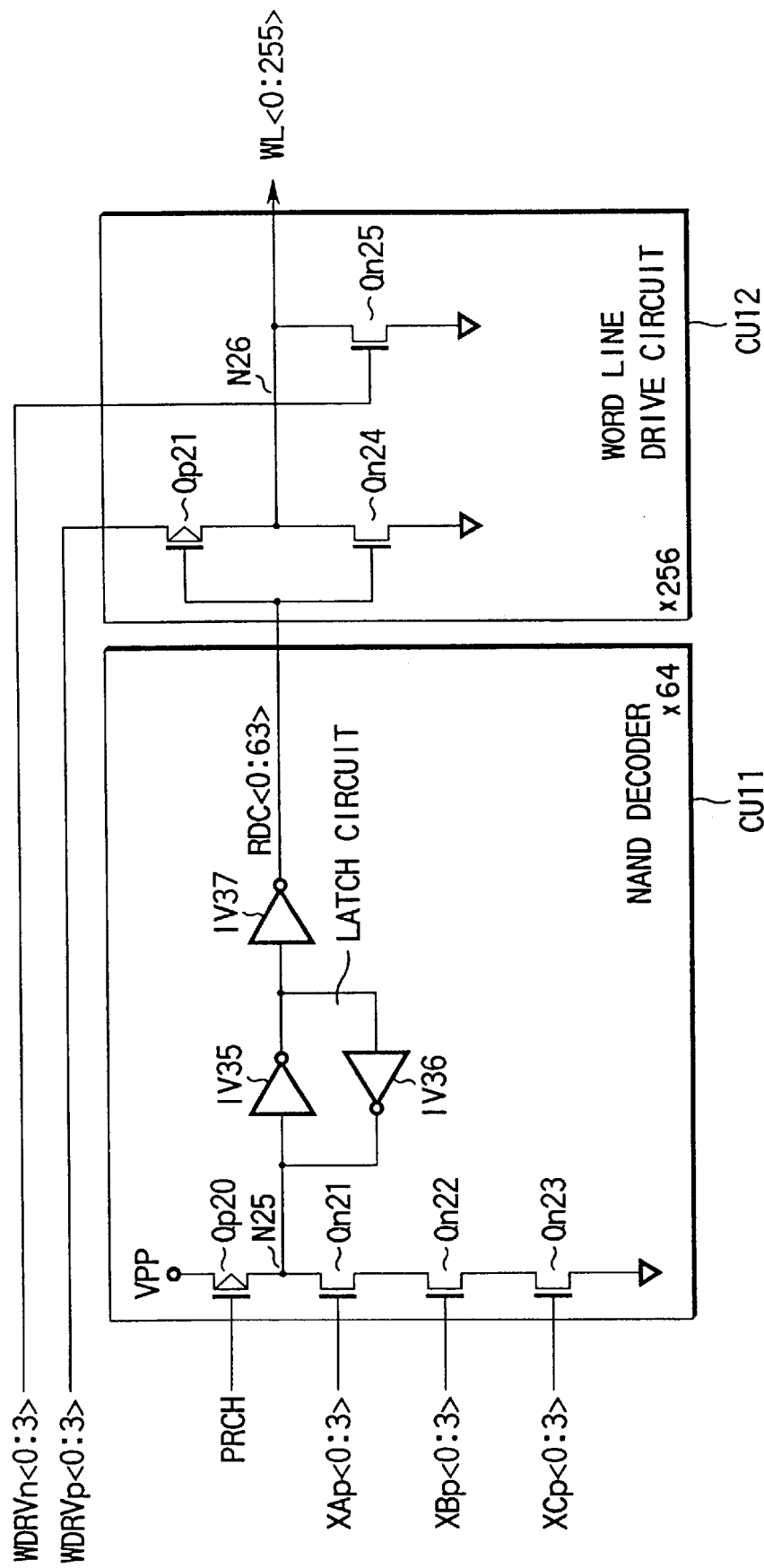
FIG. 26 is a circuit diagram showing a configuration of a row decoder for selecting one of 256 word lines in a 256k memory cell array.

FIG. 26 is a circuit diagram showing a configuration of the row decoder for selecting one of 256 word lines in a 256k memory cell array. For instance, 64 NAND decoders of circuit unit CU11 and 256 word line drivers of circuit unit CU12 are provided (without considering redundancy system circuits).

In NAND decoder CU11, the conduction of the P-channel MOSFET Qp20 precharges the node N25 beforehand to the high potential power source VPP. The node N25 takes NAND logic according to the patterns of the signals XAp<0:3>, XBp<0:3> and XCp<0:3>, which were produced based on the row addresses.

In other words, the NAND decoder has the following configuration. A precharge signal PRCH is supplied to the gate of the P-channel MOSFET Qp20, one end of the conduction path is connected to the supply point of the power source VPP, and the other end connects to node N25. The conduction paths of N-channel MOSFETs Qn21 to 23 are connected in series between node N25 and the ground potential. A signal XAp<0:3> (signifying one of the three signals XAp0 to 3) is supplied to the gate of MOSFET Qn21. A signal XBp<0:3> is supplied to the gate of MOSFET Qn22, and a signal XCp<0:3> is supplied to the gate of MOSFET Qn23.

The node N25 is one of the latch nodes of a latch circuit comprising inverters IV35 and IV36. Inverter IV37 inverts the output from the other node of the latch circuit. The output from the inverter IV37 forms signal RDC<0:63>. That is, one of the signals RDC0 to 63 is supplied to the word line driver CU12 of the next stage.

In the word line driver CU12, WDRVn<0:3> and WDRVp<0:3> (WDRVp<0:3> is determined unconditionally for WDRVn<0:3>), that is, the four signal pattern types comprising WDRVn, p<0> to <3>, are appended. As a result, including the 64 input signals RDC<0:33>, 256 signal patterns are input to the word line driver CU12. Therefore, 256 word line drivers CU12 are provided in order to drive the 256 word lines of a 256k cell array.

That is, the word line driver CU12 has the following configuration. Signal WDRVp<0:3> is supplied to one end of the conduction path of the P-channel MOSFET Qp21 as a high potential power source. Ground potential is supplied to one end of the conduction path of the N-channel MOSFET Qn24. The gates of the MOSFETs Qp21 and Qn24 are mutually connected, and the other ends of their conduction paths connect to an output node N26, thereby forming an inverter.

Signal WDRVn<0:3> is supplied to the gate of the N-channel MOSFET Qn25, output node N26 connects to one end of the conduction path, and ground potential is supplied to the other end. The output node N26 is a word line drive signal WL<0:255> (that is, any one of signals WL0 to 255).

The operation of the decoder having the configuration described above will next be explained. When the MOSFETs Qn21 to 23 are all ON as a result of signals XAp<0:3>, XBp<0:3> and XCp<0:3>, the node N25 outputs ground potential "L", but when any one of the MOSFETs Qn21 to 23 switches OFF, the node N25 rises to the high potential VPP "H" level.

The latch circuit latches the level of the node N25. Inverter IV37 inverts the output from the latch circuit to create a signal RDC<0:63>. When this signal RDC<0:63> is at the "L" level, WDRVn<0:3> is at the "L" level, WDRVp<0:3> is at the "H" level, and node N26 is at the "H" level. That is, one of the word lines from among word line drive signals WL0 to 255 is selected.

In the embodiments described above, DRAM row addresses change depending on the operation mode. By utilizing this feature, it is possible to provide a memory wherein the number of memory cell arrays which become active during a refresh operation can be kept constant, even in a memory comprising m rows (m=odd number) and n columns of memory cell arrays.

Figure 2:
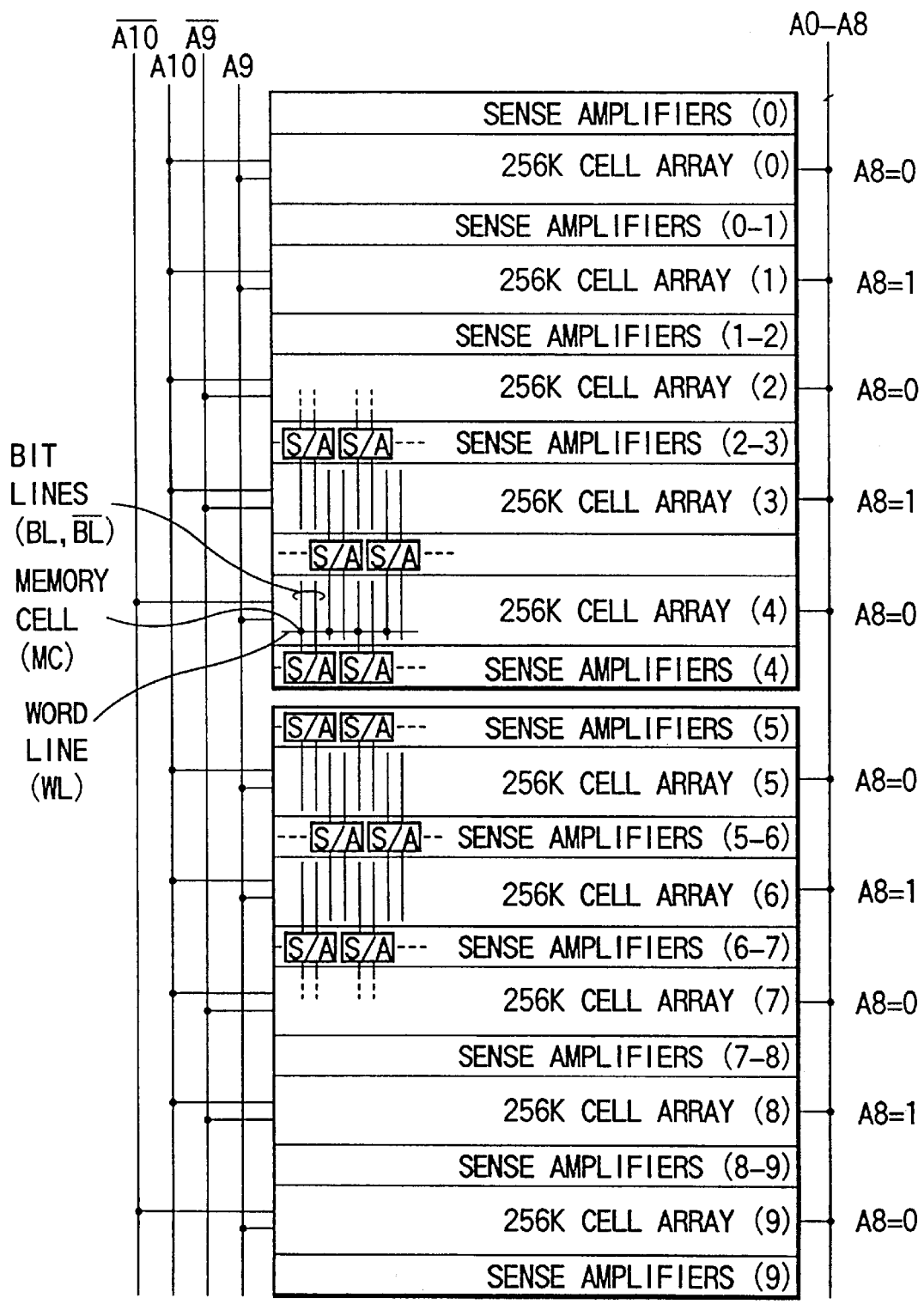
FIG. 2 is a schematic block diagram showing the configuration of primary parts of a conventional DRAM having the structure of FIG. 1.

According to the conventional technology of FIG. 2, the cell arrays which simultaneously become active when refreshing were divided into a group of six cell arrays: (0), (2), (4), (5), (7) and (9), and a group of four cell arrays: (1), (3), (6) and (8). Consequently, power supply circuits, for boosting voltages of the word lines, corresponding to six cell arrays were required to cope with the maximum number of simultaneously activated cell arrays.

In contrast, according to the technology of the present invention of FIG. 3, the cell arrays which simultaneously become active when refreshing are divided into two groups of five cell arrays: (0), (2), (4), (6), (8), and: (1), (3), (5), (7), (9). Consequently, power supply circuits, for boosting voltages of the word lines, corresponding to five cell arrays are sufficient to cope with the maximum number of simultaneously activated cell arrays.

Thus, according to the present invention, in a memory system wherein the number of row addresses is not an integral multiple of the number of refreshes the number of sell arrays (the number of word lines), which become active when a refresh operation is carried out can always be kept constant by converting specific address. Consequently, the number of power supply circuits needed to boost voltages of the word lines can be reduced. Therefore, the size of the layout, comprising the power supply circuits for boosting voltages of the word lines and other circuits of the power supply system, can be reduced further than in the conventional example.

Next, there will be detailed primary parts of a memory, which has address space for carrying out refreshing and address space for accessing rows relating to writing/reading operations, and which can be controlled so that the number of word lines which become active when refreshing is always constant, even when a memory system is constructed such that the larger number of the two is a square of the smaller number of addresses.

Figure 27:
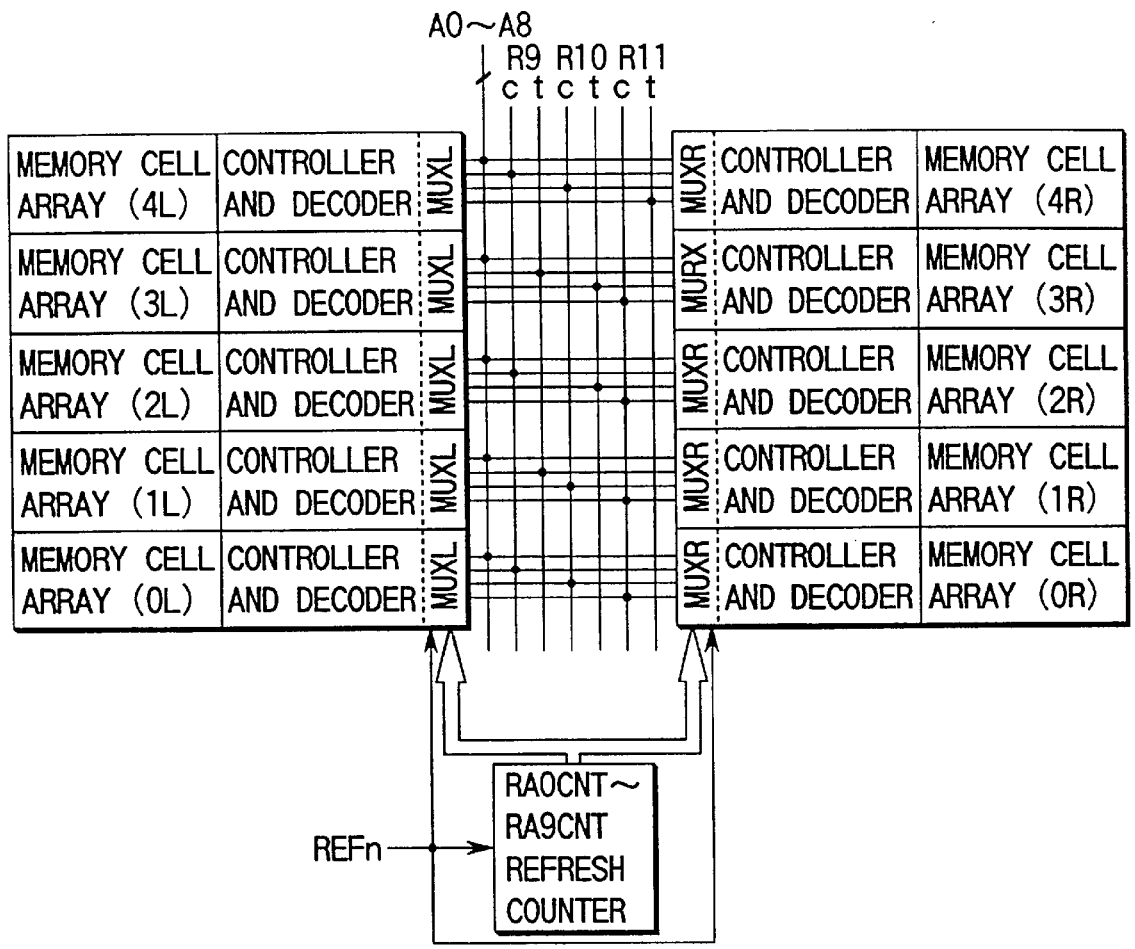
FIG. 27 is a circuit block diagram showing primary parts of a DRAM implementing an eighth embodiment of the present invention.

FIG. 27 is a circuit block diagram showing primary parts of a DRAM wherein an eighth embodiment of the present invention has been applied. The example illustrated is a configuration of a memory comprising two memory blocks provided side by side, each memory block having five cell arrays containing 512 word lines (sense amplifiers are not depicted).

In FIG. 27, R9 to R11 represent row addresses for selecting cell arrays. Row addresses R0 to R8 are not depicted in the diagram, but each selects one of the 512 word lines contained in each cell array. Two signal lines, t (true) and c (complementary), corresponding to each row address R9 to R11 are shown. Here, Rnc and Rnt (n=9, 10, 11) represent complementary signals.

When writing/reading is carried out, there are 2560 row addresses. That is, row address signals R0 to R8 select one word line from the 512 word lines in each cell array, and R9 to R11 select one of the five cell arrays. When accessing the memory from the outside, a predetermined word line can be selected from each of the five cell arrays on the left and right sides. Moreover, the c signal lines are activated in correspondence with "0" addresses input from the outside, and the t signal lines are activated in correspondence with "1" addresses.

Referring to the interconnections between the address signal lines as shown in FIG. 27, it will be seen that cell arrays in the same row share the same row address. For instance, in the diagram, when one word line is activated in cell array (0L), a word line is simultaneously activated in cell array (0R).

For instance, when input row addresses (R11, R10, R9)= (010), R11c, R10t and R9c become active. Each cell array has a decoder, and when R9t, c to R11t, c are activated, one of the five cell arrays is selected from each side. That is, when the input row addresses (R11, R10, R9)=(010), cell array (2L) and cell array (2R) are selected.

Furthermore, the refresh cycle of the memory contains 1024 operations. That is, when refreshing, the address signals R10t, c and R11t, c are all raised to the "H" level, and in addition, R0 to R9 are replaced by refresh addresses. The uppermost bit R9 of the refresh addresses selects one of two cell arrays which have consecutive addresses. As a consequence, 1024 word lines are selected.

The refreshing addresses are generated by a refresh counter. The multiplexers (MUXL and MUXR) multiplex the refresh addresses from the refresh counter and the addresses for writing/reading, in compliance with a refresh control signal REFn supplied along a refresh signal line. Therefore, when refreshing, the multiplexers (MUXL and MUXR) output values from the refresh counter as refresh addresses.

By controlling the multiplexers (MUXL and MUXR) using a method explained below, the present invention divides the word lines which become active simultaneously during refreshing into two groups: cell arrays (0L), (1R), (2L), (3R), (4L) and cell arrays (0R), (1L), (2R), (3L), (4R).

When refresh addresses (R9, R8, . . . R0)=(0000000000), the number 0 word lines WL0 of the cell arrays (0L), (1R), (2L), (3R) and (4L) become active simultaneously. Thereafter, word lines are activated sequentially in correspondence with the refresh increments of the refresh counter.

When refresh addresses (R9, R8, . . . R0)=(1000000000), the number 0 word lines WL0 of the remaining cell arrays (0R), (1L), (2R), (3L) and (4R) become active simultaneously. Thereafter, the word lines are activated sequentially in correspondence with the refresh increments of the refresh counter. All the word lines in the memory have been selected when refresh addresses (R9, RB, . . . R0)=(1111111111).

In this way, all the cell arrays in the memory can be refreshed using 1024 addresses corresponding to word lines WL0 to WL1023, equivalent to the number of word lines in two cell arrays.

As described above, in the present invention, the left and right columns have different numbers of cell arrays selected in a refresh operation. This method of selecting cell arrays is achieved by selecting complementary signals (RA9c, RA9t) for cell arrays on the right and left sides in the case of the address RA9 for cell array selection. As a result, the number of cell arrays selected is always five, irrespective of the value of the refresh counter.

Figure 28A:
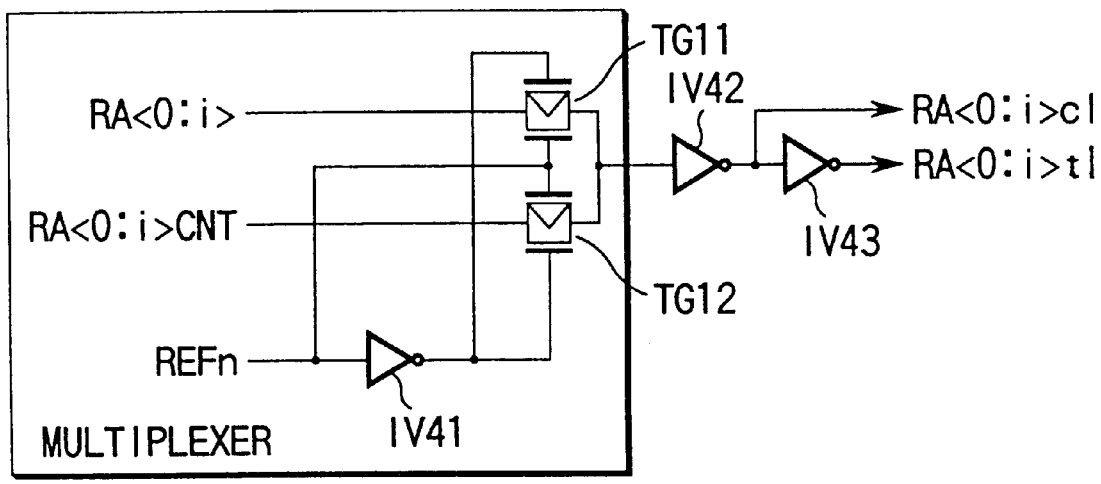
FIGS. 28A and 28B re circuit diagrams showing example configurations relating to the multiplexers shown in FIG. 27.
Figure 28B:
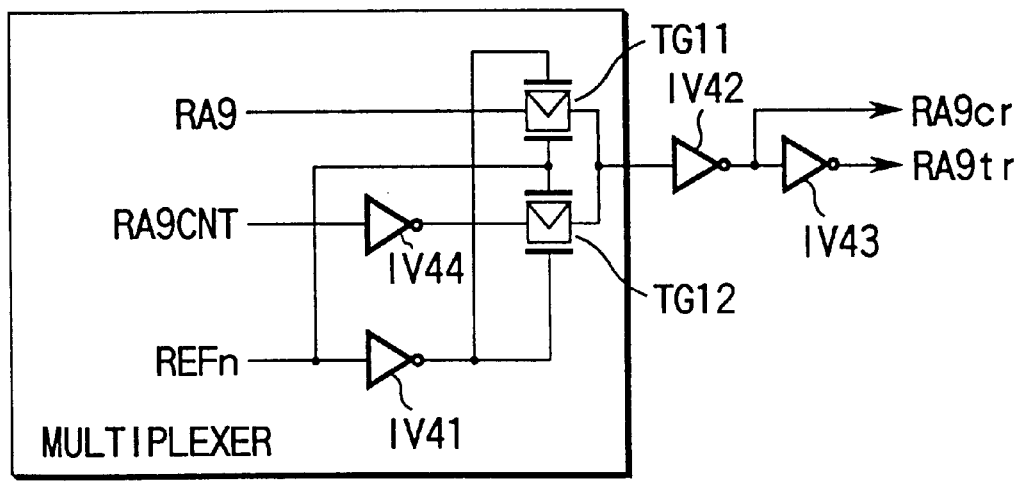

FIGS. 28A and 28B are circuit diagrams showing example configurations relating to the multiplexers MUXL and MUXR shown in FIG. 27.

The multiplexer MUXL comprises ten of the circuits shown in FIG. 28B. RA<0:i> represents one signal of the 10 bits comprising signals RA0 to RA9 which correspond to the row address signals R0 to R9 (i=9). RA<0:i>CNT represents one signal of the 10 bits comprising refresh address signals RA0CNT to RA9CNT from the refresh counter. REFn is a refresh control signal which holds the "H" level when writing/reading and falls to the "L" level when refreshing. RA<0:i>cl is a complementary row address signal corresponding to input. RA<0:i>tl is a legitimate row address signal corresponding to input.

That is, one of the multiplexers comprising the MUXL has the following configuration. Transfer gate TG11 transmits a row address signal RA<0:9> for writing/reading. Transfer gate TG12 transmits a refresh address signal RA<0:9>CNT. Inverter IV41 inverts signal REFn to create a signal for controlling the transfer gates.

Furthermore, circuits for creating complementary signals are represented as inverters IV42 and IV43. The inverter IV42 inverts a signal which has been supplied via the transfer gates TG11 and TG12, and outputs the inverted signal as RA<0:9>cl. The inverter IV43 inverts the output from the inverter IV42 and outputs RA<0:9>tl.

On the other hand, multiplexer MUXR comprises nine of the circuits shown in FIG. 28A and one of the circuits shown in FIG. 29B. In the circuit of FIG. 29A, RA<0:i> represents one signal of the 9 bits comprising signals RA0 to RA8 which correspond to the row address signals R0 to R8 (i=8). RA<0:i>CNT represents one signal of the 9 bits comprising refresh address signals RA0CNT to RA8CNT from the refresh counter. REFn is a refresh control signal which holds the "H" level when writing/reading and falls to the "L" level when refreshing. RA<0:i>cr is a complementary row address signal corresponding to input. RA<0:i>tr is a true row address signal corresponding to input.

That is, one of the multiplexers comprising the MUXR has the following configuration, excluding the output configuration of the uppermost bit (tenth bit). Transfer gate TG11 transmits a row address signal RA<0:8> for writing/reading. Transfer gate TG12 transmits a refresh address signal RA<0:8>CNT. Inverter IV41 inverts signal REFn to create a signal for controlling the transfer gates.

Furthermore, circuits for creating complementary signals are represented as inverters IV42 and IV43. The inverter IV42 inverts a signal which has been supplied via the transfer gates TG11 and TG12, and outputs the inverted signal as RA<0:9>cr. The inverter IV43 inverts the output from the inverter IV42 and outputs RA<0:9>tr.

Furthermore, the circuit of FIG. 28B illustrates a multiplexer for controlling the output of the uppermost bit (tenth bit) of the bits comprising the multiplexer MUXR. FIG. 28B differs from the circuit configuration of FIG. 28A in that an inverter IV44 is appended. This inverter IV44 inverts the refresh address signal RA9CNT supplied from the refresh counter.

That is, the multiplexer which controls the output of the uppermost bit (tenth bit) of MUXR has the following configuration. Transfer gate TG11 transmits a row address signal RA9 for writing/reading. Transfer gate TG12 transmits a refresh address signal RA9CNT which is inverted by the inverter IV44. Inverter IV41 inverts signal REFn to create a signal for controlling the transfer gates.

The inverter IV42 inverts a signal which has been supplied via the transfer gates TG11 and TG12, and outputs the inverted signal as RA9cr. The inverter IV43 inverts the output of the inverter IV42 and outputs RA9tr.

As shown in FIG. 27, when a refresh operation is carried out using the above configuration, the multiplexers MUXL, provided to the cell arrays (0L) to (4L) on the left side column, and the multiplexers MUXR, provided to the cell arrays (0R) to (4R) on the right side column, output complementary logic only for their uppermost bits (tenth bits).

Output from the uppermost bits (tenth bits) of the multiplexers MUXL and MUXR affects control of cell array selection as described above. Moreover, when refreshing, cell array selection is controlled only by the uppermost bits (tenth bits).

That is, in a case where a memory having the configuration shown in FIG. 27 is being refreshed, when the refresh address signal RA9CNT is "0", in multiplexers MUXL, RA9cl is at the "H" level and RA9tl at the "L"; and in multiplexers MUXR, RA9cr is at the "L" level and RA9tr at the "H" level.

Consequently, cell arrays (0L), (2L) and (4L) on the left side, which are connected to signal line R9c, become active simultaneously. Cell arrays (1R) and (3R) on the left side, which are connected to signal line R9t, become active simultaneously.

Or, when the refresh address signal RA9CNT is "1", in multiplexers MUXL, RA9cl is at the "L" level and RA9tl at the "H" level; and in multiplexers MUXR, RA9cr is at the "H" level and RA9tr at the "L" level.

Consequently, cell arrays (1L) and (3L) on the left side, which are connected to signal line R9t, become active simultaneously. Cell arrays (0R), (2R) and (4R) on the left side, which are connected to signal line R9c, become active simultaneously.

As a result, when refreshing, it is possible to select cell arrays in different rows on the left and right sides. Word lines which become active simultaneously during refreshing are divided into two groups: cell arrays (0L), (1R), (2L), (3R), (4L) and cell arrays (0R), (1L), (2R), (3L), (4R).

That is, according to this type of embodiment, the number of word lines which become active when refreshing can be controlled to a constant number, even when the memory system has a configuration wherein the relation between the number of row addresses when writing/reading and the number of row addresses when refreshing is other than a relation wherein the larger number of addresses is a square of the smaller number of addresses.

Figure 29:
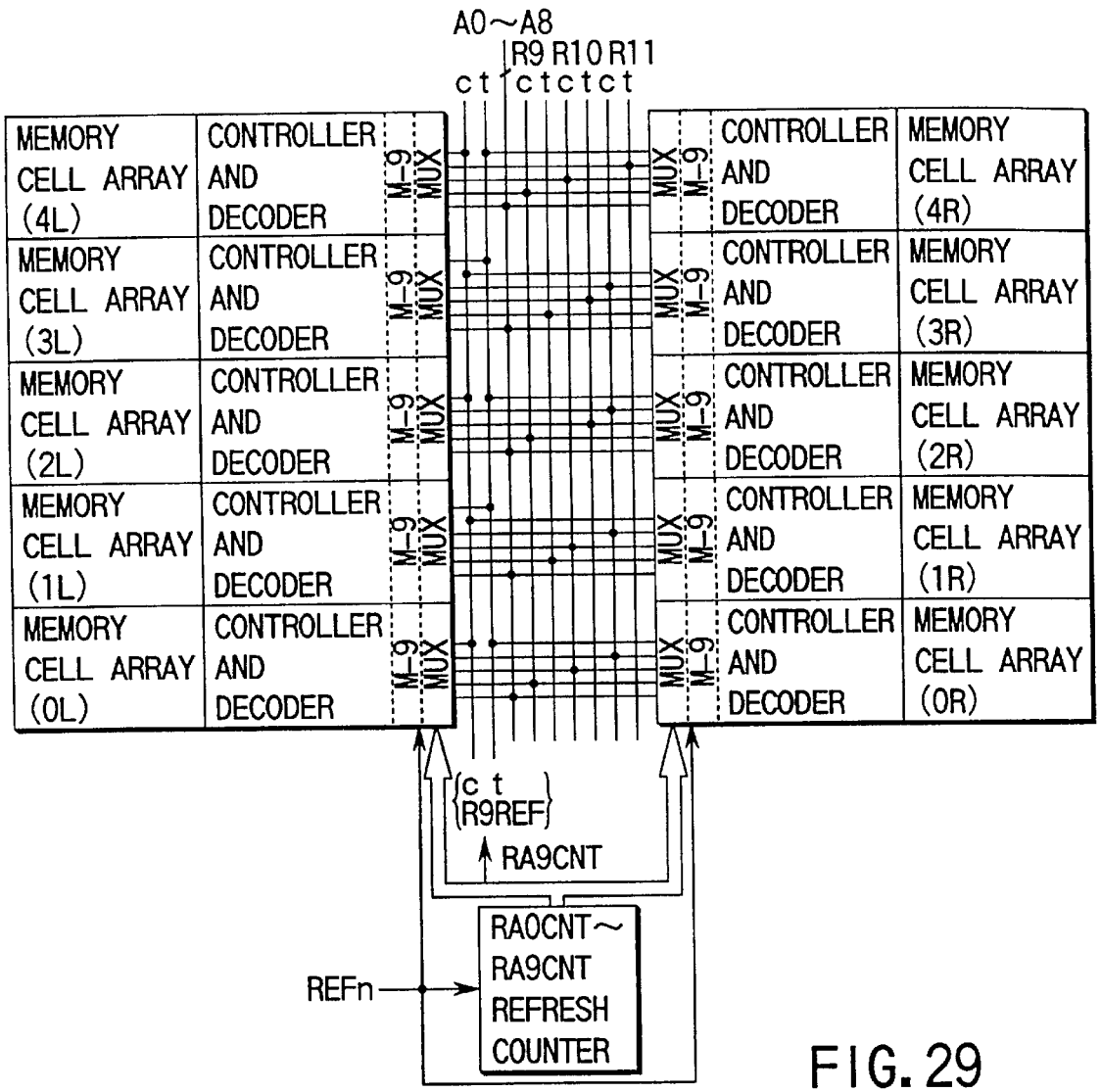
FIG. 29 is circuit block diagram showing primary parts of a DRAM implementing a ninth embodiment of the present invention.

FIG. 29 is circuit block diagram showing primary parts of a DRAM implementing a ninth embodiment of the present invention. The example illustrated is a configuration of a memory comprising two memory blocks provided side by side, each memory block having five cell arrays and each cell array containing 512 word lines (sense amplifiers are not depicted).

In FIG. 29, R9 to R11 represent row addresses for selecting cell arrays. Row addresses R0 to R8 are not depicted in the diagram, but each selects one of the 512 word lines contained in each cell array. Two signal lines, t (true) and c (complementary), corresponding to each row address R9 to R11 are shown. Furthermore, two signal lines, t (true) and c (complementary), corresponding to signal lines for signal R9REF indicating one part of the refresh address, are shown. The c signal lines are activated in correspondence with "0" addresses input from the outside, and the t signal lines are activated in correspondence with "1" addresses.

When writing/reading and refreshing, the ninth embodiment of FIG. 29 controls the selection of cell arrays by the same method as described above in the eighth embodiment.

That is, when writing/reading is carried out, there are 2560 row addresses for five cell arrays. When accessing the memory from the outside, word lines on the same row can be selected from the each of the five cell arrays on the same row on the left and right sides. Furthermore, when refreshing, the address signals R10t, R10c, R11t and R11c are all raised to the "H" level, and in addition, R0 to R9 are replaced by refresh addresses. 1024 word lines are selected. Word lines which become active simultaneously during refreshing are divided into two groups: cell arrays (0L), (1R), (2L), (3R), (4L) and cell arrays (0R), (1L), (2R), (3L), (4R).

In the configuration shown in FIG. 29, note the interconnections of the address signal lines. The columns on the left and right sides each contain five cell arrays, and row address signals for writing/reading RA9t and RA9c of the same logic are input to cell arrays on the same row. However, refresh address signals R9REFt and c of opposite logic are input to cell arrays on the same row.

For instance, during a refresh operation, when signal R9REFc is at the "H" level, the left-side cell arrays (0L), (2L), (4L) and the right-side cell arrays (1R) and (3R) are selected. Or, when signal R9REFt is at the "H" level, the left-side cell arrays (1L), (3L) and the right-side cell arrays (0R), (2R) and (4R) are selected.

It is a feature of the configuration shown in FIG. 29 that of the multiplexers MUX for multiplexing refresh addresses and writing/reading addresses, multiplexers (M-9), which are concerned with addresses for selecting cell arrays, are provided together with controllers for selecting cell arrays. This will be explained below.

Figure 30:
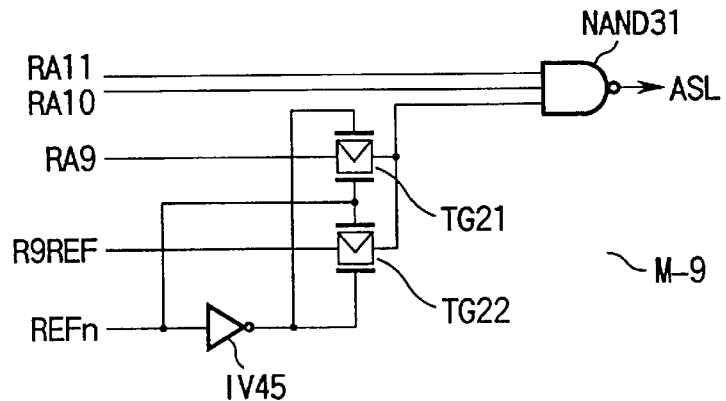
FIG. 30 is a circuit diagram showing a configuration of a row address signal multiplexer for generating a signal relating to cell array selection included in FIG. 29.

FIG. 30 is a circuit diagram showing the configuration of the row address signal R9 multiplexer (M-9) for generating a signal relating to cell array selection. Transfer gate TG21 transmits a signal RA9 in correspondence with the row address signal R9 for writing/reading (that is, signal RA9 follows the t or c interconnections). Transfer gate TG22 transmits a refresh address signal R9REF. The signal R9REF follows the t or c interconnections in compliance with the refresh address signal RA9CNT supplied by the refresh counter. Inverter IV45 inverts the refresh control signal REFn to create a signal for controlling both of the transfer gates.

A NAND logic gate NAND31 receives a signal which has passed through transfer gate TG21 or transfer gate TG22, a row address signal RA10 and a row address signal RA11 (t or c signals in compliance with row address signals R10 and R11). The logic gate NAND31 outputs an address signal ASL for cell array selection (low-active signal output).

The multiplexers(MUX) other than the M-9 comprise, for instance, nine of the circuits (i=8) shown in FIG. 28A. Multiplexers (MUX and M-9) of these configurations are provided to the cell arrays on the left and right sides.

Figure 31:
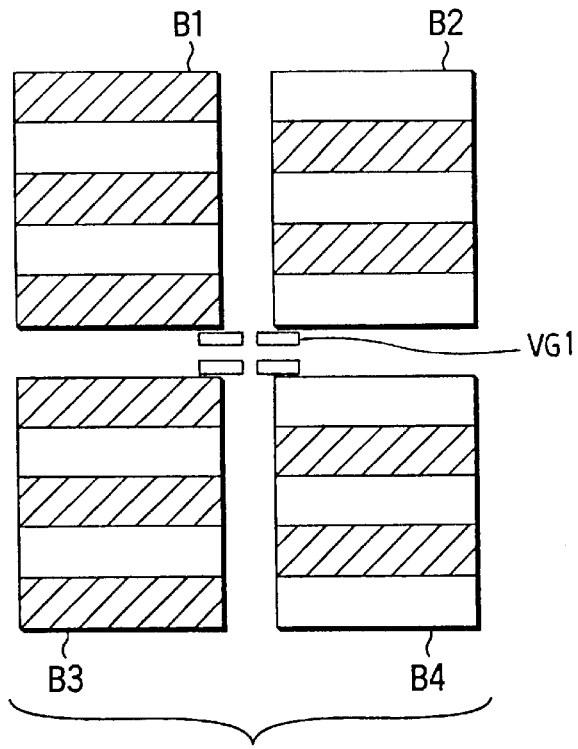
FIG. 31 is a first block diagram showing a selection state of cell arrays at a given time when refreshing.

FIG. 31 is a first block diagram showing a selection state of cell arrays at a given time when refreshing. In FIG. 31, four blocks, each comprising five cell arrays, are arranged in a matrix. Selected cell arrays are indicated by diagonal shading. Six cell arrays are selected in the blocks in the left column (B1 and B3), and four cell arrays are selected in the right column (B2 and B4).

In the technique for selecting memory cells described above, although the number of selected cell arrays is always fixed at a total of ten cell arrays, different numbers of cell arrays are selected on the left and right sides. In such circumstances, it is envisaged that the power source potential on the side where most cell arrays are selected may drop.

Figure 32:
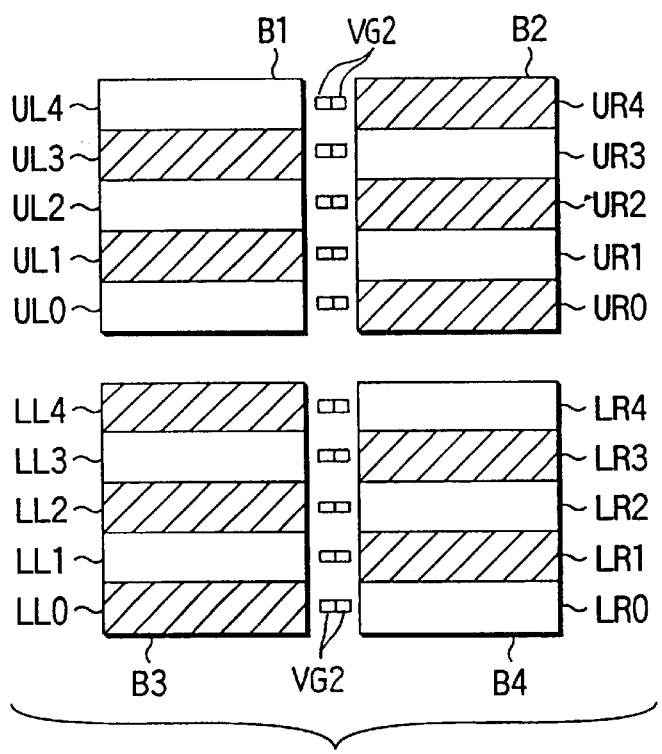
FIG. 32 is a second block diagram showing a selection state of cell array at a given timing when refreshing

FIG. 32 is a second block diagram showing a selection state of cell arrays at a given time when refreshing. In FIG. 32, four blocks, each comprising five cell arrays, are arranged in a matrix. Selected cell arrays are indicated by diagonal shading. Five cell arrays are selected in the blocks in the left column (B1 and B3), and five are selected in the right column (B2 and B4).

In the technique for selecting memory cells described above, the number of selected cell arrays is always fixed at a total of ten cell arrays, and the numbers of cell arrays selected on the left and right sides are equal. Under such circumstances, there is no deviation in the power source potential as in FIG. 31. Furthermore, for example, in FIG. 31, power supply circuits VG1 are distributed to each of columns (four blocks) of cell arrays and for example, in FIG. 32, power supply circuits VG2 are provided each of cell arrays.

It will be advantageous for designing memory systems if a power supply circuit for a word line can be provided at a minimum unit with which the memory capacity of the memory system can be increased or decreased, i.e., for each of the same pattern layouts.

According to the ninth embodiment shown in FIG. 29, the technique for selecting memory cells illustrated in FIG. 32 can easily be realized when refreshing. Note that, in the configuration of FIG. 29, refresh address signals R9REFt and c of reverse logic are input to cell arrays on the same rows. That is, in the case of blocks B1 and B2 in FIG. 32, the refresh address signals R9REFt and c need only input a first reverse logic to blocks on the same row. And, in the case of blocks B3 and B4, the refresh address signals R9REFt and c need only input a second reverse logic, which is opposite to the first reverse logic, to blocks on the same row.

Figure 33:
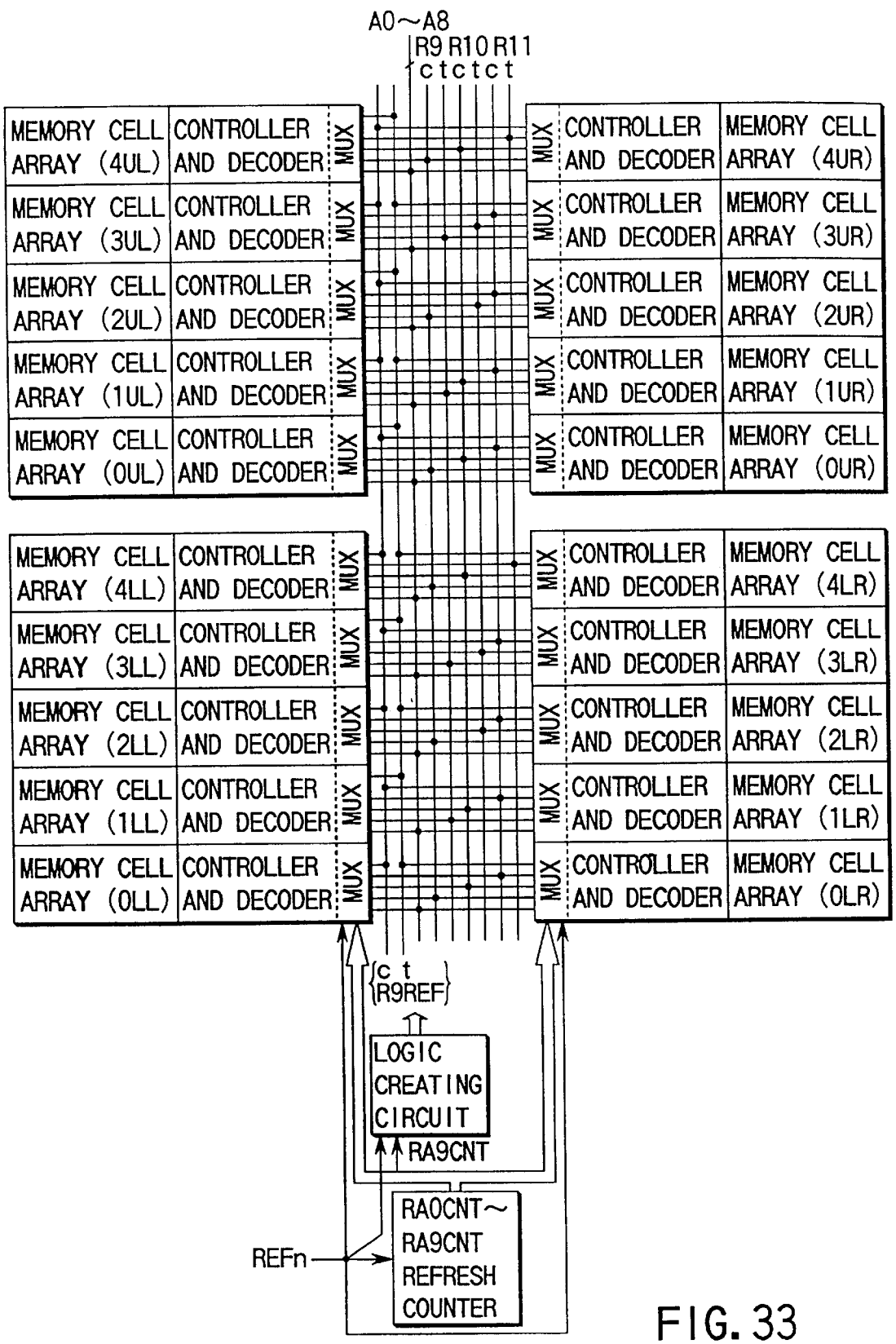
FIG. 33 is a circuit block diagram showing primary parts of a DRAM implementing a tenth embodiment of the present invention.

FIG. 33 is a circuit block diagram showing primary parts of a DRAM implementing a tenth embodiment of the present invention. The example illustrated is a configuration of a memory comprising four memory blocks aligned in a matrix, each memory block having five cell arrays and each cell array containing 512 word lines (sense amplifiers are not depicted).

In FIG. 33, R9 to R11 represent row addresses for selecting cell arrays. Row addresses R0 to R8 are not depicted in the diagram, but each selects one of the 512 word lines contained in each cell array. Two signal lines, t (true) and c (complementary), corresponding to each row address R9 to R11 are shown. Furthermore, two signal lines, t (true) and c (complementary), corresponding to signal lines for signal R9REF indicating one part of the refresh address, are shown. The c signal lines are activated in correspondence with "0" addresses input from the outside, and the t signal lines are activated in correspondence with "1" addresses.

When writing/reading, there are 2560 row addresses for five cell arrays. When accessing the memory from the outside, word lines on the same row can be selected from the each of the five cell arrays on the same row on the top and bottom of the left and right sides. Therefore, when writing/reading, four cell arrays are selected simultaneously.

Furthermore, when refreshing, the address signals R10t, R10c, R11t and R11c are all raised to the "H" level, and in addition, R0 to R9 are replaced by refresh addresses. 1024 word lines are selected. Word lines which become active simultaneously during refreshing are divided into two groups: cell arrays (0LL), (1LR), (2LL), (3LR), (4LL), (0UR), (1UL), (2UR), (3UL), (4UR) and cell arrays (0LR), (1LL), (2LR), (3LL), (4LR), (0UL), (1UR), (2UL), (3UR), (4UL) (see FIG. 32).

In the configuration shown in FIG. 33, note the interconnections of the address signal lines. The columns on the left and right sides each contain five cell arrays, and row address signals for writing/reading RA9t and RA9c of the same logic are input to cell arrays on the same rows. However, the refresh address signals R9REFt and c of reverse logic are input to cell arrays on the same row. Moreover, in blocks B1 and B2, the refresh address signals R9REFt and c input a first reverse logic to blocks on the same row. In blocks B3 and B4, the refresh address signals R9REFt and R9REFc input a second reverse logic, which is opposite to the first reverse logic, to blocks on the same row.

Yet another feature of the tenth embodiment will next be explained. The refresh address signals R9REFt and c are created in advance by taking the logic of the signal RA9CNT for the uppermost bit in the refresh address and the refresh control signal REFn. This technical configuration is shown in FIG. 33 as a logic creating circuit.

Figure 34:
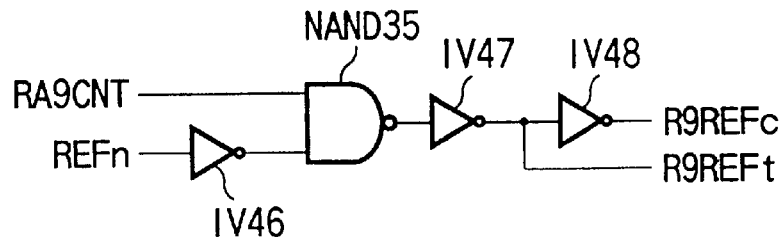
FIG. 34 is a circuit diagram showing an example circuit configuration of the logic creating circuit of FIG. 33.

FIG. 34 is a circuit diagram showing an example circuit configuration of the logic creating circuit of FIG. 33. The refresh signal RA9CNT from the refresh counter and a signal formed by inverting the refresh control signal REFn via inverter IV46 are supplied to a NAND logic gate NAND35. During a refresh operation, only the refresh control signal REFn holds the "H" level; the other signals are at the "L" level. Inverter IV47 inverts the output from the logic gate NAND35 and outputs it as signal R9REFt. Inverter IV48 inverts the signal R9REFt and outputs it as signal R9REFc.

Figure 35:
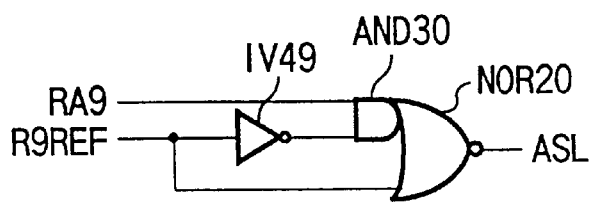
FIG. 35 is a circuit diagram showing an example controller relating to a cell array included in FIG. 33.

FIG. 35 is a circuit diagram showing an example controller relating to cell array selection. These circuits are contained in the controllers and decoders provided to each of the cell arrays in FIG. 33. The row address signal RA9 and a reverse signal of the signal R9REF (R9REFt or c following the interconnections of FIG. 33), which has been inverted by-inverter IV49, is input to an AND logic gate AND30. The output form the AND logic gate AND30 and the signal R9REF (that is, a predetermined signal R9REFc or R9REFt) are input to a NOR logic gate NOR20. The logic gate NOR20 outputs cell array selection address signal ASL.

Thus, the same effects as the ninth embodiment can be achieved using the configuration shown in FIG. 33. FIG. 32 shows the cell arrays selected when a refresh operation is carried out in this memory (when R9="0"). As shown clearly in FIG. 32, five cell arrays are selected on the left and the right. Moreover, a balanced selection of cell arrays, with no deviation in the selected positions in the memory, is achieved.

Furthermore, in the tenth embodiment, the signal line of refresh control signal REFn is not used in the main circuit for controlling cell array selection. That is, according to the ninth embodiment (see FIG. 29 and FIG. 30), the multiplexers M-9 are provided in separate circuit regions of the controllers for cell array selection from the multiplexers MUX. This M-9 circuit section uses the signal REFn.

On the other hand, according to the tenth embodiment as shown in FIG. 33, the multiplexer circuit sections are all provided inside the MUX. For instance, the MUX contains nine of the circuits shown in FIG. 28A. Furthermore, an address signal for cell array selection (ASL) is created from a technical configuration such as that shown in FIG. 35 by using the row address signal RA9, in compliance with R9 for cell array selection, together with complementary signals R9REFc and R9REFt, which are created using a technical configuration such as that shown in FIG. 34. The circuit shown in FIG. 35 can also be incorporated in the MUX as a multiplexer circuit section. Consequently, there is an advantage that power consumption when driving the signal lines is less than in the ninth embodiment.

Figure 36:
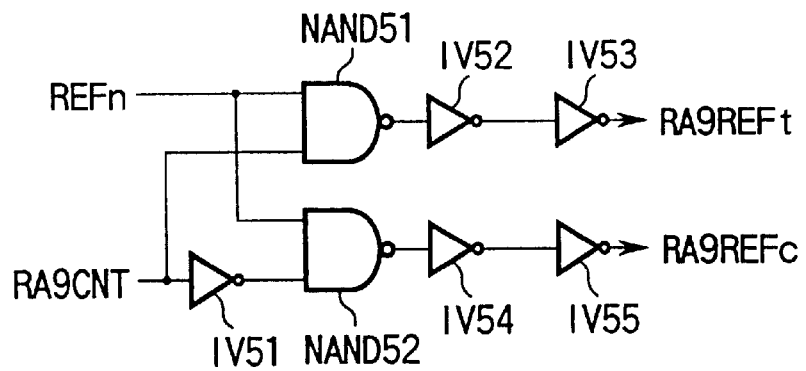
FIG. 36 is a circuit diagram for producing a complementary signal for an address signal relating to cell array selection according to an eleventh embodiment of the present invention.

FIG. 36 is a circuit diagram for producing a complementary signal for an address signal relating to cell array selection according to an eleventh embodiment of the present invention. That is, FIG. 36 is a modification of the circuit of FIG. 34, wherein signal R9REFc and signal R9REFt are created by taking the logic of the signal RA9CNT for the uppermost bit in the refresh address and the refresh control signal REFn.

The circuit of FIG. 36 has the following configuration. The refresh signal RA9CNT from the refresh counter and the refresh control signal REFn are supplied to a NAND logic gate NAND51. The refresh signal RA9CNT from the refresh counter and a signal formed by inverting the refresh control signal REFn via inverter IV51 are supplied to a NAND logic gate NAND52. Inverter IV52 inverts the output from the logic gate NAND51. Inverter IV5 3 inverts the output from the inverter IV52 and outputs it as signal R9REFt. Inverter IV54 inverts the output from the logic gate NAND52. Inverter IV55 inverts the output from the inverter IV54 and outputs it as signal R9REFc.

Figure 37:
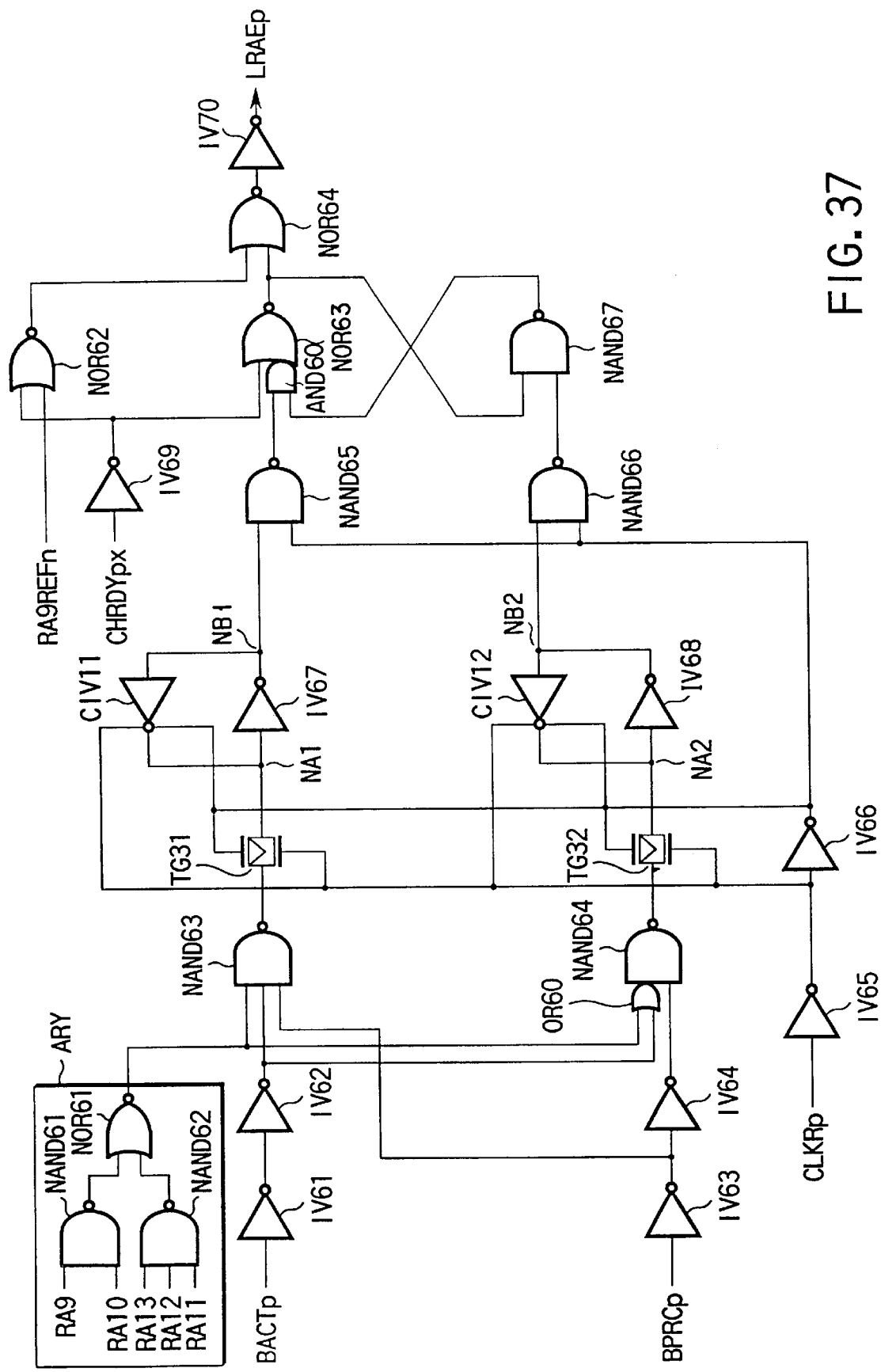
FIG. 37 is a circuit diagram showing an example of a control circuit relating to cell array selection according to a twelfth embodiment of the present invention.

FIG. 37 is a circuit diagram showing an example of a controller relating to cell array selection according to a twelfth embodiment of the present invention. This controller is provided to each cell array, and is used in a memory having a technical configuration such as shown in FIG. 33, that is, a memory having technology capable of selecting cell arrays in balanced first and second timings, and in balanced positions, throughout the entire memory system when performing a refresh operation.

NAND61 to 67 represent NAND logic gate, NOR61 to 64 represent NOR logic gates, IV61 to 70 represent inverters, CIV11 and CIV12 represent clock inverters, TG31 and TG32 represent transfer gates, OR60 represents an OR logic gate, AND60 represents an AND logic gate.

Circuit portion ARY represents a decoder for selecting arrays when writing/reading. The circuit portion ARY uses signals RA9 to RA13 corresponding to row address signals R9 to R13. Therefore, this configuration is capable of selecting one cell array from a maximum of 32 cell arrays.

That is, when writing/reading, 32 cell arrays are selected by addresses A9 to A13, but when refreshing, all the signal lines of addresses A10 to A13 become active (rise to "H") and the 32 cell arrays are selected only by address signal A9.

Signal RA9 and RA10 are input to the logic gate NAND61. Signals RA11, RA12 and RA13 are input to the logic gate NAND62. The logic gates NAND61 and NAND62 input to the logic gate NOR61. When logic gate NOR61 receives an address for selecting a cell array, it outputs the "L" level.

When cell arrays become active, signal BACTp is output at the "H" level. Furthermore, signal BPRCp is a precharge signal ("H" level when precharging) for a bank of cell arrays.

Inverter IV61 inverts the signal BACTp. Inverter IV62 inverts the output from inverter IV61. Inverter IV63 inverts the signal BPRCp. Inverter IV64 inverts the output from inverter IV63. Furthermore, logic gate NOR61 and inverter IV62 input to logic gate OR60.

Logic gate NAND63 is connected to the outputs of logic gate NOR61, inverter IV62 and inverter IV63. Logic gate NAND64 is connected to the outputs of logic gate OR60, inverter IV64. Signal CLKRp is a clock signal in synchronism with the bank precharge. Inverter IV65 inverts the signal CLKRp. Inverter IV66 inverts the output from inverter IV65. Therefore, inverter IV 65 outputs the reverse signal of the clock signal CLKRp, and inverter IV66 outputs a non-reverse signal of the clock signal CLKRp.

The reverse signal and non-reverse signal of CLKRp are respectively input to control gates on the N-channel and P-channel sides of transfer gate TG31. Therefore, the clock signal CLKRp controls the transfer gate TG31 to transfer the output of logic gate NAND63 to node NA1.

The reverse signal and non-reverse signal of CLKRp are respectively input to control gates on the N-channel and P-channel sides of transfer gate TG32. Therefore, the clock signal CLKRp controls the transfer gate TG31 to transfer the output of logic gate NAND63 to node NA2.

The reverse signal and non-reverse signal of CLKRp are respectively input to control gates on the P-channel and N-channel sides (not shown in the diagram) of the clock inverter CIV11. Therefore, when transfer gate TG31 is OFF, the clock inverter CIV11 supplies the reverse output of node NB1 to node NA1. Inverter IV67 inverts the logic level of node NA1 and outputs to the node NB1.

The reverse signal and non-reverse signal of CLKRp are respectively input to control gates on the P-channel and N-channel sides (not shown in the diagram) of the clock inverter CIV12. Therefore, when transfer gate TG32 is OFF, the clock inverter CIV12 supplies the reverse output of node NB2 to node NA2. Inverter IV68 inverts the logic level of node NA2 and outputs to the node NB2.

The logic level signal from node NB1 and the non-reverse signal of CLKRp are input to logic gate NAND65. Furthermore, the logic level signal from node NB2 and the non-reverse signal of CLKRp are input to logic gate NAND66.

The outputs from logic gate NAND65 and logic gate NAND67 are input to logic gate AND60. The outputs from logic gate NAND66 and logic gate NOR63 are input to logic gate NAND67. The outputs from logic gate AND60 and inverter IV69 are input to logic gate NOR63.

The inverter IV69 inverts a signal CHRDYpx for preventing error. After power injection to the memory system, the signal CHRDYpx falls to the "L" level, but is normally at the "H" level.

The inverter IV69 and signal RA9REFn input to logic gate NOR62. The signal RAREFn comprises, for instance, signals RA9REFt or RA9REFc created using the circuit configuration of FIG. 36. Signals RA9REFt and RA9REFc are used alternately in correspondence with the layout of the cell arrays. Signal RAREFn is, for instance, a control in keeping with the technique for selecting cell arrays when refreshing as shown above in FIG. 33 (see the interconnections from signals R9REFc and t to the memory cells).

Logic gate NOR62 and logic gate NOR63 input to logic gate NOR64. Inverter IV70 inverts the output of logic gate NOR64 and outputs a signal LRAEp. As a result, cell array selection and address transmission in accordance with operation mode are reflected to the decoder.

Figure 38:
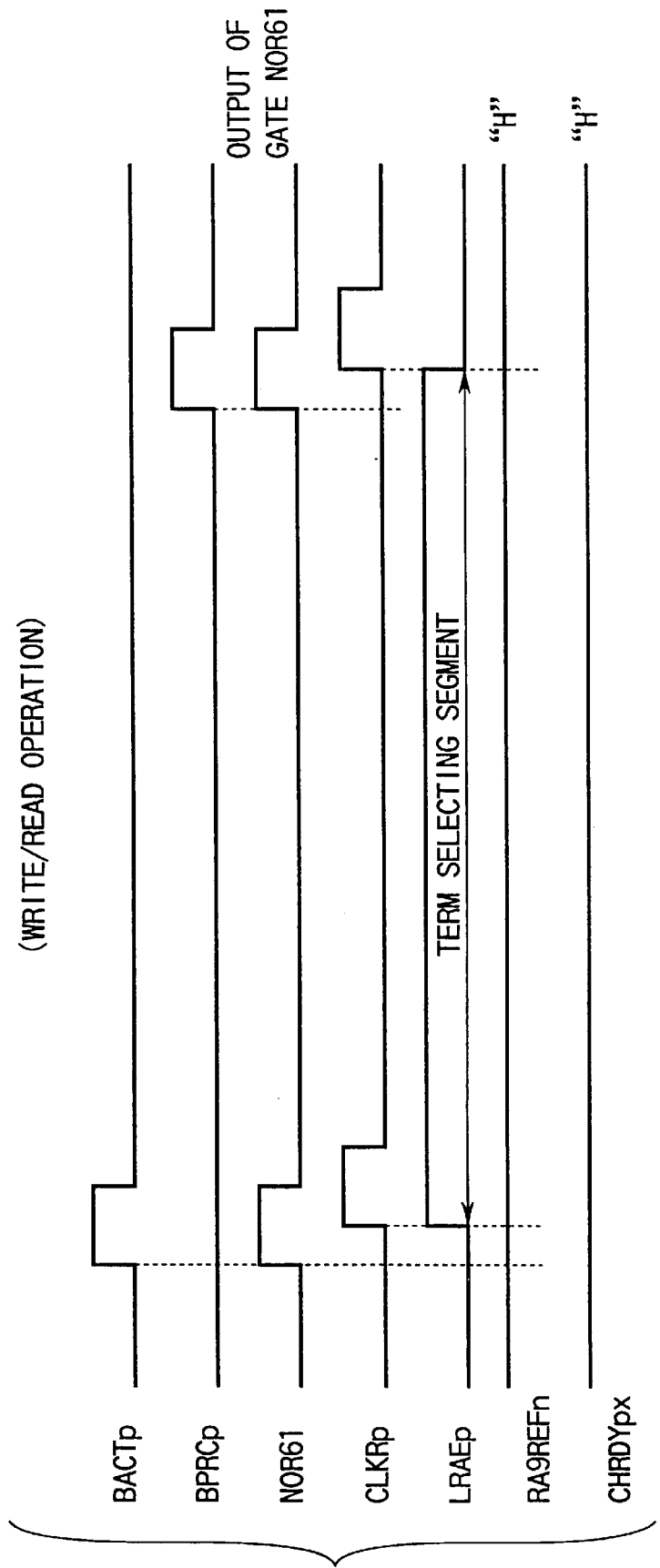
FIG. 38 shows waveforms for each part of the circuit of FIG. 7 when writing/reading.

FIG. 38 shows waveforms for each part of the circuit described above in FIG. 37 when writing/reading. The period when the signal LRAEp is output at the "H" level is the period when a segment, that is, a predetermined memory cell array, which the circuit in FIG. 37 belongs to, is selected.

Figure 39:
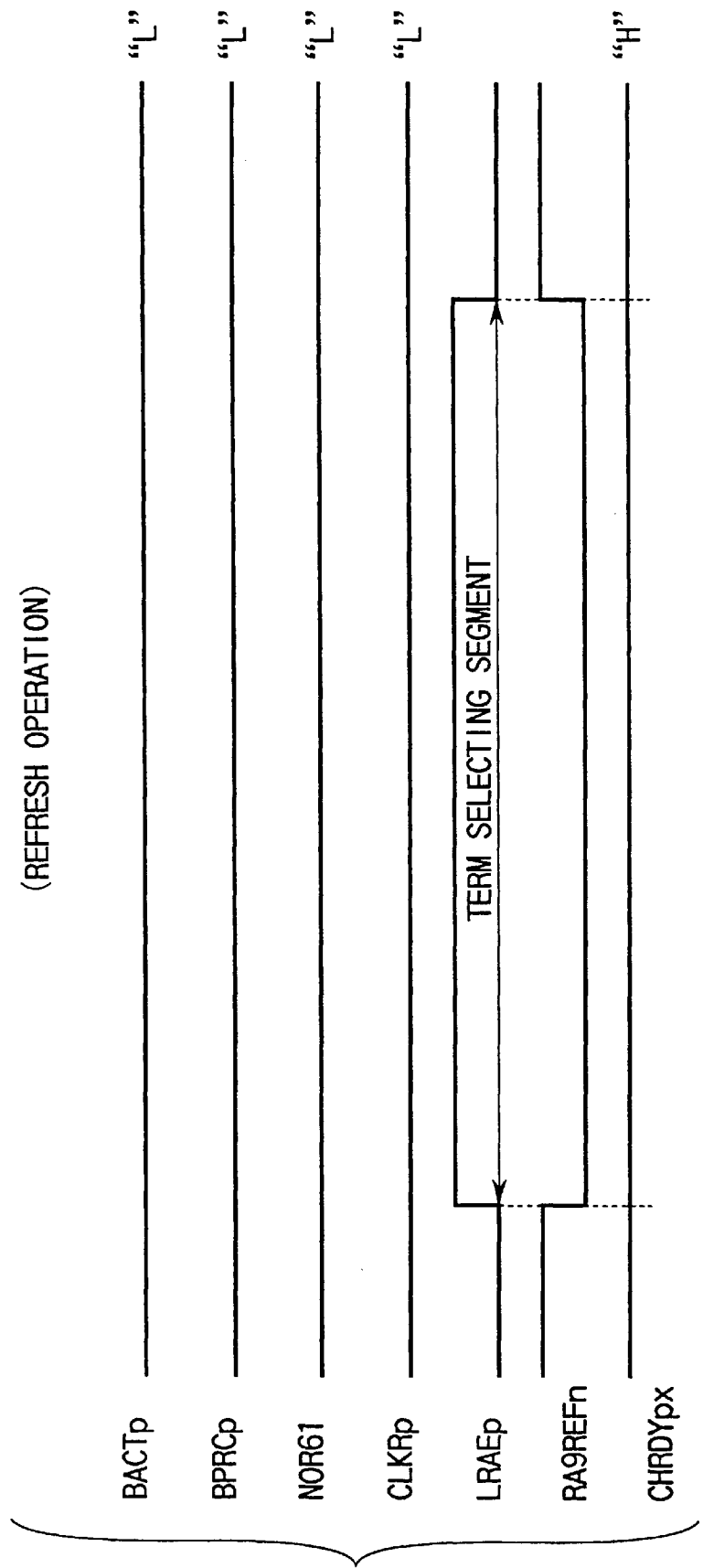
FIG. 39 shows waveforms for each part of the circuit of FIG. 37 when refreshing.

FIG. 39 shows waveforms for each part of the circuit described above in FIG. 37 when refreshing. The period when the signal LRAEp is output at the "H" level is the period when a segment, that is, a predetermined memory cell array, which the circuit in FIG. 37 belongs to, is selected.

FIGS. 38 to 47, which relate to the twelfth embodiment of the present invention, show examples of circuits up to the point where the decoder drives the word lines using the signal LRAEp. These will next be explained.

Figure 40:
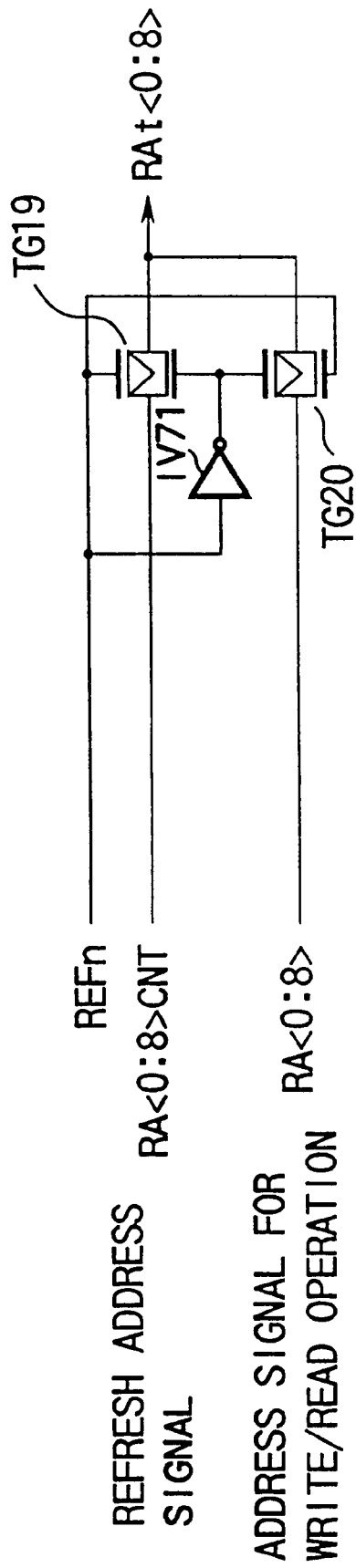
FIG. 40 is a circuit diagram relating to a multiplexer for switch-outputting a write/read row address and a refresh address showing an example controller relating to cell array selection according to the twelfth embodiment of the present invention.

FIG. 40 is a circuit diagram relating to a multiplexer for switch-outputting a write/read row address and a refresh address. The multiplexer comprises nine of the circuit shown in FIG. 40. RA<0:8> represents one signal from the nine bits of signals RA0 to RA8 corresponding to row address signals R0 to R8 input from the outside. RA<0:8>CNT represents one signal from the nine bits of refresh address signals RA0CNT to RA8CNT input from the refresh counter. REFn is a refresh control signal which is output at the "H" level when writing/reading, and at the "L" level when refreshing.

The multiplexers have the following configure on. The P-channel side gate of transfer gate TG19 and the N-channel side gate of transfer gate TG20 are both controlled by refresh control signal REF. The N-channel side gate of transfer gate TG19 and the P-channel side gate of transfer gate TG20 are both controlled by a signal formed by passing the refresh control signal REF through an inverter IV17. More specifically, the transfer gate TG19 is brought into conduction when signal REF is at the "L" level, and the transfer gate TG20 is brought into conduction when signal REF is at the "H" level.

That is, refresh address signals are output via the transfer gate TG19. Row address signals for writing/reading are output via the transfer gate TG20. The transfer gates TG19 and TG20 become active in complement in compliance with the refresh control signal REF, and the output from either of the transfer gates TG19 and TG20 becomes row address signals RA<0:8> (the final t signifies "true").

Figure 41:
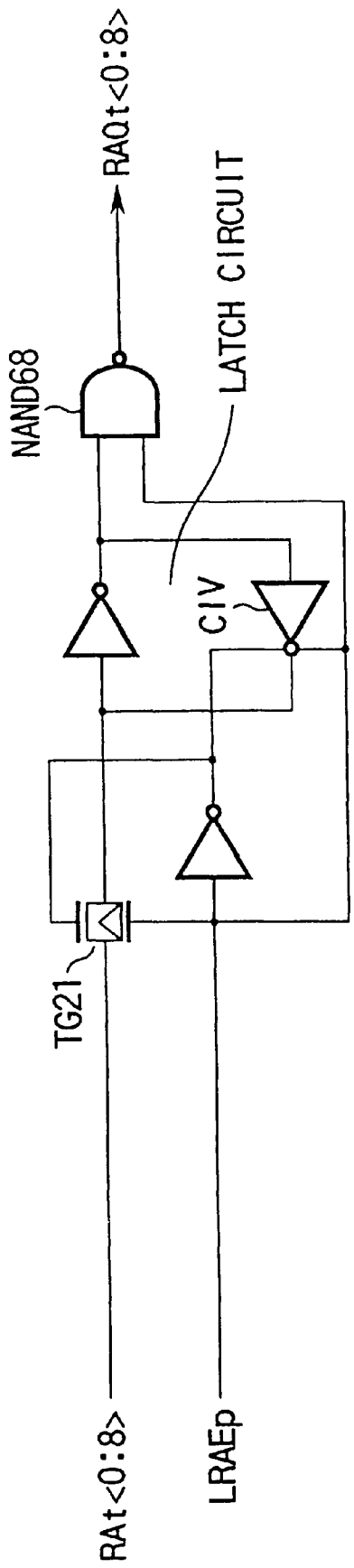
FIG. 41 is a circuit diagram showing a row address latch buffer used in the twelfth embodiment of the present invention.

FIG. 41 is a circuit diagram showing a row address latch buffer, which latches the row address signals RAt<0:8> from the multiplexer of FIG. 40 in correspondence with the signal LRAEp. Therefore, nine of the circuits shown in FIG. 41 are provided to each cell array.

Therefore, the address signals RAt<0:8> pass via transfer gate TG21, which is controlled in compliance with the signal LRAEp, and are latched by the latch circuit. The signal LRAEp also controls the clock inverter CIV in the latch circuit. Moreover, the output from the latch circuit passes through a NAND logic gate NAND68, the output of the NAND68 being controlled by the signal LRAEp. The address signals output from the NAND68 are represented as RAQt<0:8>.

Figure 42:
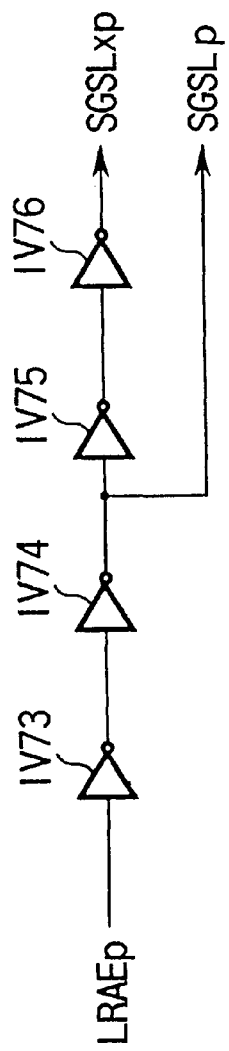
FIG. 42 is a circuit diagram for producing a control signal in order to select predetermined adjoining cell arrays (segments) used in the twelfth embodiment of the present invention.

FIG. 42 is a circuit diagram for creating a control signal in order to select predetermined adjacent cell arrays (segment). Signal SGSLxp is created by passing the signal LRAEp obtained from FIG. 37 through inverters IV73 to IV76. Signal SGSLp is created by passing the signal LRAEp through inverters IV73 and IV74.

Figure 43:
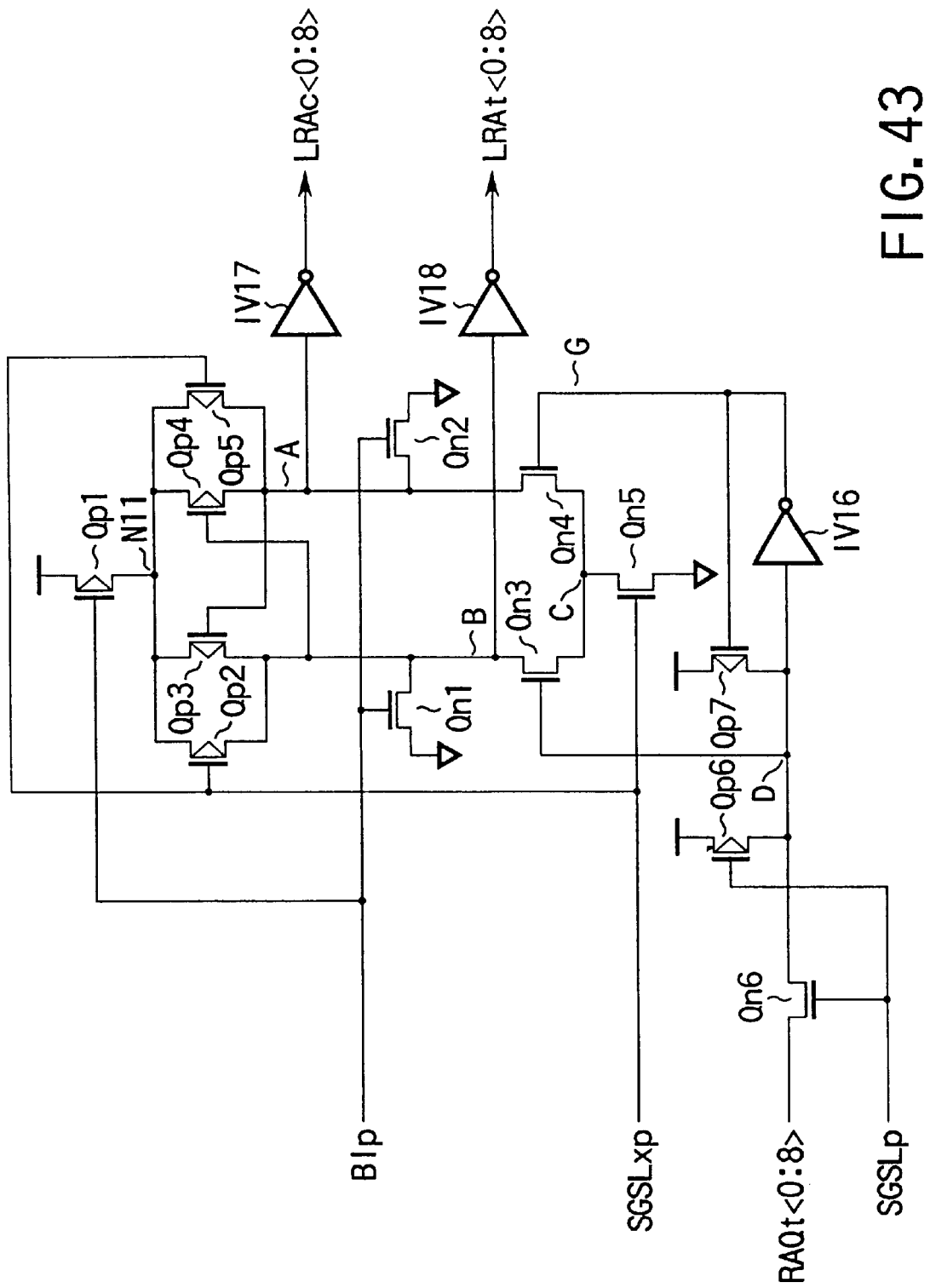
FIG. 43 is a circuit diagram for producing a complementary signal for an address signal RAQt<0:8> used in the twelfth embodiment of the present invention.

FIG. 43 is a circuit diagram for creating a complementary signal for the address signals RAQt<0:8>. When signal BIp becomes "L", this circuit is set to writing/reading. When signal BIp becomes "H", the circuit outputs (outputs from the inverters IV17 and IVl8) are fixed at the "H" level.

That is, when a write/read operation is performed, the circuit shown in FIG. 43 uses the "H" level of signals SGSLxp and SGSLp to create signals LRAc<0:8> and signals LRAt<0:8>, which comprise amplified complementary signals of the address signals RAQt<0:8> (the final letter c signifies "complementary"; the final letter t signifies "true"). Therefore, nine circuits having the configuration of FIG. 43 are provided for the signal outputs. Since one of the circuits of FIG. 43 is the same as FIG. 21, like reference numerals are used and further explanation is omitted.

Figure 44:
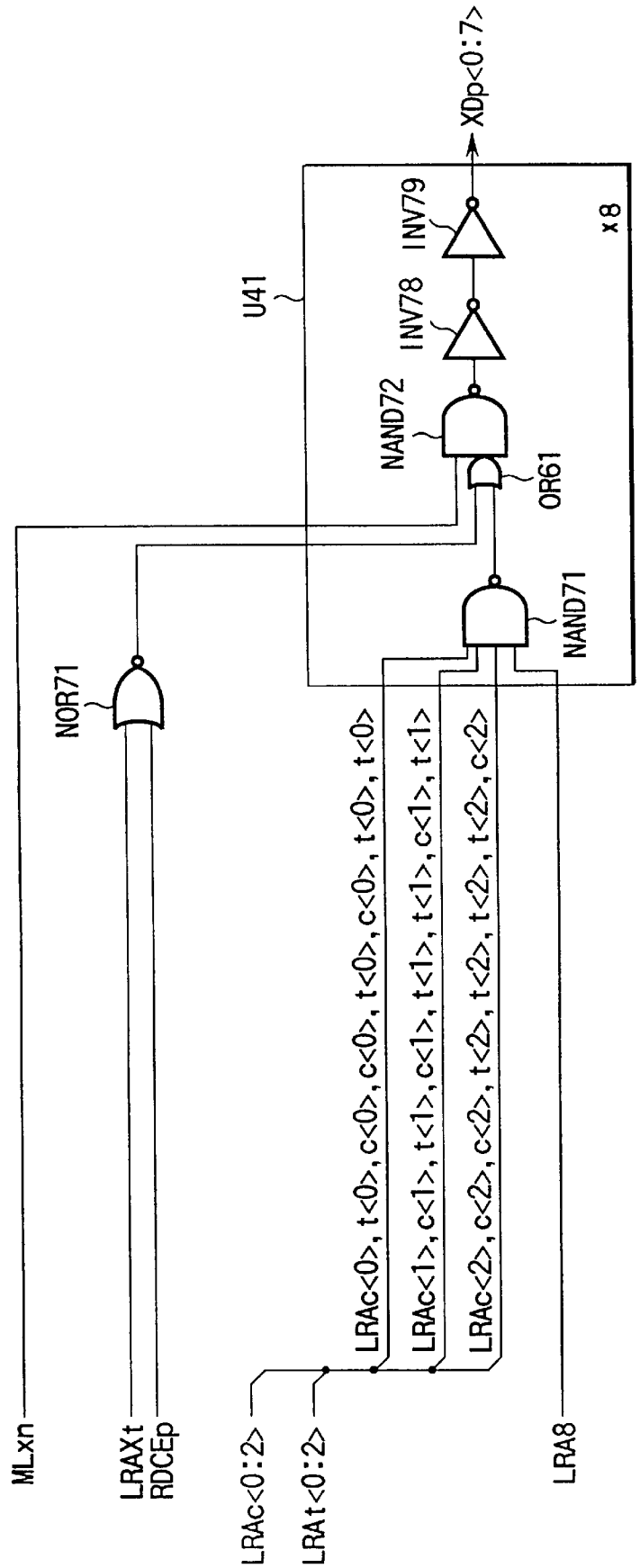
FIG. 44 is a circuit diagram for producing a control signal in order to select a word line driver of a row decoder to be explained later used in the twelfth embodiment of the present invention.

FIG. 44 is a diagram of a circuit for producing a control signal in order to select a word line driver of the row decoder to be explained later. Signal MLxn is a signal for redundancy control (not explained here) and normally keeps the "H" level. Signal LRAXt is a test system control signal (not explained here) and normally keeps the "L" level. When the row decoder is enabled, signal RDCEp rises to the "H" level. When the row decoder is enabled, the output from the NOR logic gate NOR71 drops to the "L" level.

In FIG. 44, there are eight circuit units U41. Eight combinations of signals LRAc<0:2> and LRAt<0:2>, created by the circuit of FIG. 43, and signal LRA8 are supplied to these eight circuit units U41, which consequently output signals XDp<0:7> (that is, signals XDp0 to 7). Moreover, it is determined whether signal LRA8 should be LRA8t or LRA8c in compliance with the cell array address.

For instance, LRAc0, LRAc1 or LRAc2, being one of the eight combinations of signals LRAc<0:2> and LRAt<0:2>, and signal LRA8 (t or c) are input to the NAND logic gate NAND71. The output from the NAND7 s supplied to one of the inputs of the logic gate Or61 The other input of the logic gate OR61 receives the logic gate NOR71 described above.

The output from the logic gate OR61 and the signal MLxn are input to the NAND logic gate NAND72, which outputs signal XDp0 via inverters IV78 and IV79 provided in series.

FIGS. 45A and 45B are circuit diagrams showing circuits for creating word line control signals. According to the above configuration, a control signal is created to prevent unselected word lines from fluctuating. Signal WLDNn is at the "L" level when the word line is selected, and rises to the "H" level when unselected.

That is, when WLDNn is at the "H" level, high potential VPP power source potential ("H" level) is supplied to the node N21. Consequently, node N22 of the latch circuit outputs at the "H" level and node N23 outputs at the "L" level. As a result, signal WDRVp changes to the "L" level (See FIG. 45B) and signal WDRVn to the "H" level.

When WLDNn is outputting at the "L" level, "L" level is supplied to the node N21. Since signal XDp is at the "H" level, node N22 of the latch circuit outputs at the "L" level and node N23 outputs at the "H" level. As a result, signal WDRVp changes to the "H" level (See FIG. 45B) and signal WDRVn to the "L" level.

Circuit units comprising U42 of FIG. 45A are provided for any one of the eight control signals XDp<0:7> which may be input for selecting a word line drive circuit of the row decoder; in other words, there are eight circuit units U42 for each decoder (described below). The circuit of FIG. 45A outputs signal WNKp<0:7> and WDRVn<0:7>. The circuit of FIG. 45B outputs signal WDRVp<0:7>.

Due to the increased number of signal pattern types to the circuits detailed in FIGS. 45A and 45B, eight circuit units must be provided. Since one of the circuit configurations in each diagram is the same as in FIGS. 24A and 24B respectively, like reference numerals are used and explanation is omitted.

Figure 46:
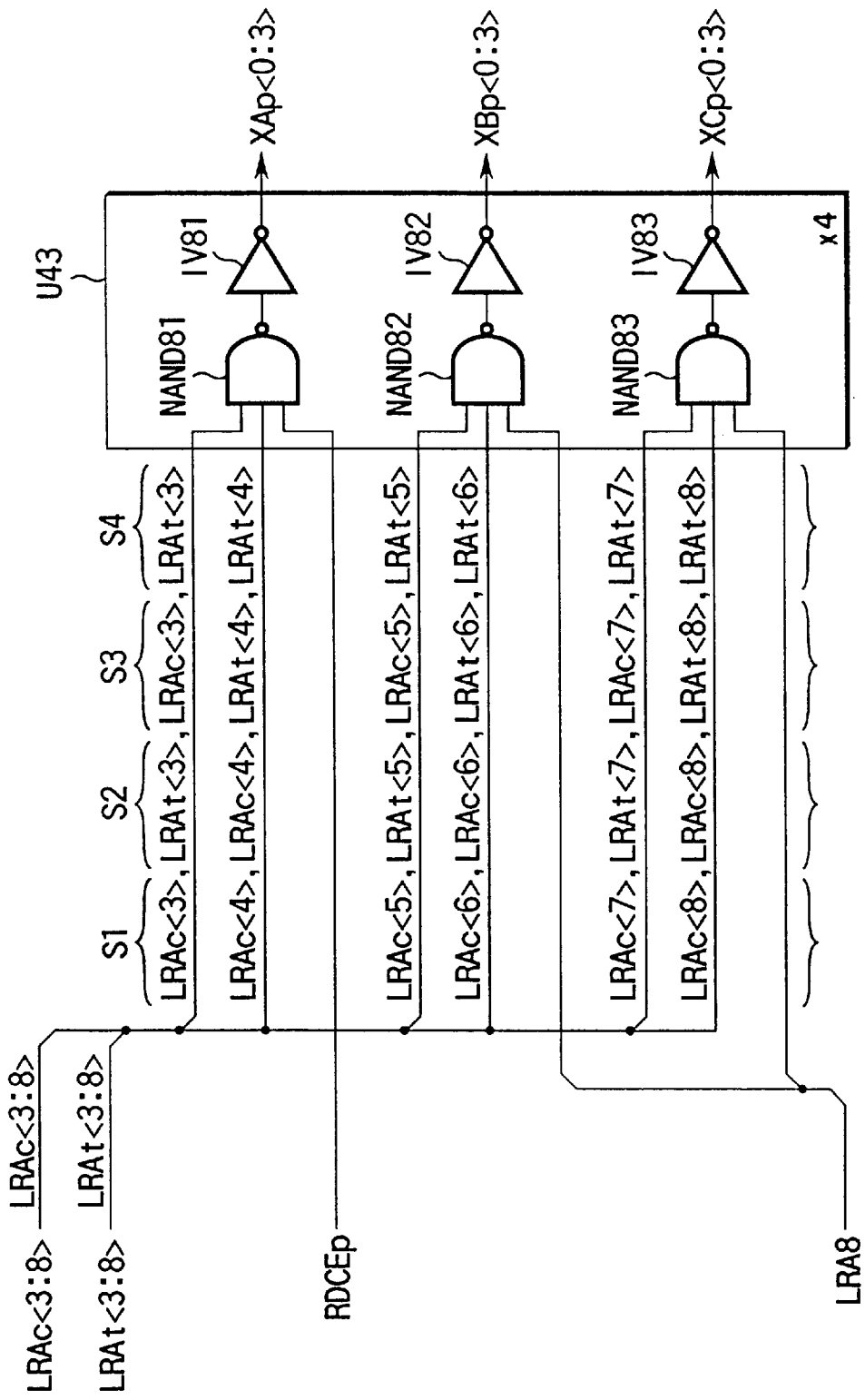
FIG. 46 is a circuit diagram showing a row pre-decoder (row partial decoder) used in the twelfth embodiment of the present invention.

FIG. 46 is a circuit diagram showing the row pre-decoder (row partial decoder). Four circuit units U43 are provided for one decoder explained below. That is, the circuit units U43 use for four signal combinations (S1 to S4): signal RDCEp indicating activation of the row decoder, signal LRA8 created by the circuit unit of FIG. 43, and signals LRACc<3:8> and LRAt<3:8>. Moreover, as described above, it is determined whether signal LRA8 should be LRA8t or LRA8c in compliance with the cell array address.

One of the circuit units U43 (using combination S1, for instance) has the following configuration. Signals LRAc<3> and LRAc<4> and signal RDCEp are input to a NAND logic gate NAND81. An inverter IV81 inverts the output from the NAND81 and outputs signal XAp<0>. Signals LRAc<5> and LRAc<6> and signal LRA8 (t or c) are input to a NAND logic gate NAND82. An inverter IV82 inverts the output from the NAND82 and outputs signal XBp<0>. Signals LRAc<7> and LRAc<8> and signal LRA8 (t or c) are input to a NAND logic gate NAND83. An inverter IV83 inverts the output from the NAND83 and outputs signal XCp<0>.

Figure 47:
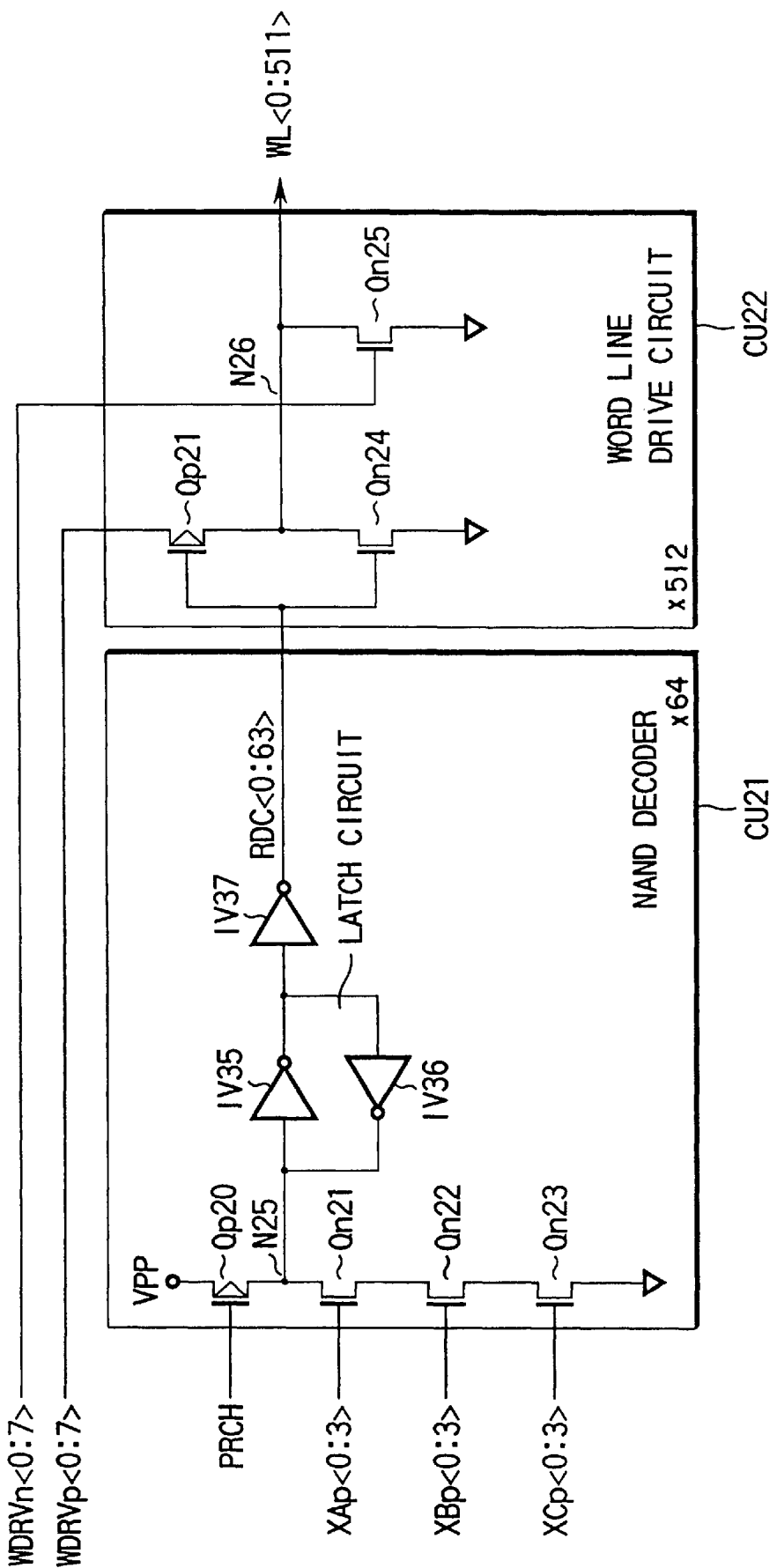
FIG. 47 is a circuit diagram showing a configuration of a row decoder for selecting one of 512 word lines in a 512k memory cell array used in the-twelfth embodiment of the present invention.

FIG. 47 is a circuit diagram showing a configuration of the row decoder for selecting one of 512 word lines in a 512k memory cell array. For instance, 64 NAND decoders of circuit unit CU21 and 512 word line drivers of circuit unit CU22 are provided (without considering redundancy system circuits). Since the circuit configurations of CU21 and CU22 are the same as CU11 and CU12 shown in FIG. 26, like reference numerals are used.

In NAND decoder CU21, the conduction of the P-channel MOSFET Qp20 precharges the node N25 beforehand to the high potential power source VPP. The node N25 takes NAND logic according to the patterns of the signals XAp<0:3>, XBp<0:3> and XCp<0:3> (for the circuit configuration, see FIG. 26). That is, the NAND decoder CU21 outputs RDC<0:63>, that is, one of the signals RDC0 to 63, to the word line driver CU22 of the next stage.

In the word line driver CU22, WDRVn, p<0:7> (WDRVp<0:7> is determined unconditionally for WDRVn<0:7>), that is, the eight signal pattern types comprising WDRVn, p<0> to <7>, are appended. As a result, including the 64 input signals RDC<0:63>, 512 signal patterns are input to the word line driver CU22. Therefore, 512 word line drivers CU22 are provided in order to drive the 512 word lines of a 512k cell array (for the circuit configuration, see CU12 of FIG. 26). That is, the output from the word line driver CU22 (node N26) comprises word line drive signal WL<0:511> (in other words, any one of WL0 to 511).

As shown in the above embodiments, the DRAM configuration has at least two types of access methods: row access, for writing and reading from/to the memory from the outside, and row access for refreshing. The present invention can be utilized to excellent effect in a memory system wherein the number of row addresses for writing/reading is an odd multiple of the number of word lines contained in one cell, and the number of row addresses for refreshing is less than the number of row addresses for writing/reading. That is, when a refresh operation is performed, the number of word lines which become active in the first half and second half of the refresh cycle can be kept constant. Furthermore, with regard to the overall layout of the cell arrays which comprise the memory, there is no deviation in the layout of cell arrays which become active during refreshing, maintaining balance.

As explained above, according to the present invention, addresses are simply changed when writing/reading and when refreshing. Consequently, not only a desired memory capacity can be achieved when increasing memory cells in refresh units but also can use shared sense amplifiers. Moreover, the uniform pattern layout of the configuration makes it possible to provide a semiconductor integrated circuit device which is effective with either standard cell or gate array circuit formation.

Furthermore, when the present invention is used in a memory system wherein the number of row addresses is not an integral multiple of the number of refreshes, the number of word lines which become active when a refresh operation is carried out can always be kept constant. In addition, within the overall configuration of the memory, there is no deviation in the position of cell arrays which become active during refreshing. As a result, it is possible to provide a semiconductor integrated circuit device wherein chip size can be reduced.

That is, considering a memory system which comprises n cell arrays provided in m columns (n>1, m>0), even when the memory system has a configuration wherein the relation between the number of row addresses when writing/reading and the number of row addresses when refreshing is other than a relation wherein the larger number of addresses is a square of the smaller number of addresses, the present invention provides a controller for selecting addresses to ensure that the number of cell arrays (number of word lines) which become active when refreshing is always constant.

Additional advantages and modifications will readily occurs to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor integrated circuit device comprising:
    plurality of memory cell arrays each comprising plurality of memory cells arranged in a matrix; and
    sense amplifiers for sense-amplifying data read out from said memory cell arrays and data written to said memory cell arrays;
    wherein said plurality of memory cell arrays are designated as a first group having at least two elements by a first row address for write/read operation, and are designated as a second group having a plurality of elements by a second row address for refresh operation, and at least two memory cell arrays included in one element of said second group are assigned to adjacent two elements of said first group.

2. The semiconductor integrated circuit device according to claim 1, wherein
    the number of said memory cell arrays contained in one element of said first group is greater than the number of said memory cell arrays contained in one element of said second group.

3. The semiconductor integrated circuit device according to claim 1, wherein
    said sense amplifiers can be shared between adjacent said memory cell arrays.

4. A semiconductor integrated circuit device comprising:
    plurality of memory cell arrays each comprising plurality of memory cells arranged in a matrix;
    sense amplifiers for sense-amplifying data read out from said memory cell arrays and data written to said memory cell arrays;
    a transmission path for transmitting an address signal when refreshing said memory cell arrays, or a signal in correspondence with an address signal when performing write/read operation other than refreshing, to a given row of said memory cell arrays; and
    an address converter for converting a portion of said transmission path relating to an address signal when performing said write/read operation, wherein said address converter comprises a circuit for inverting signal.

5. The semiconductor integrated circuit device according to claim 4, wherein
    said transmission path including a multiplexer provided for each of said memory cell arrays.

6. The semiconductor integrated circuit device according to claim 4, wherein said transmission path including a multiplexer, provided for each of said memory cell arrays, and said address converter is provided preceding-stage of said multiplexer, so as to match a predetermined address relation in said memory cell arrays.

7. The semiconductor integrated circuit device according to claim 4, wherein said sense amplifiers can be shared between adjacent said memory cell arrays.

8. A semiconductor integrated circuit device comprising:
    plurality of memory cell arrays each comprising plurality of memory cells arranged in a matrix;
    sense amplifiers for sense-amplifying data read out from said memory cell arrays and data written to said memory cell arrays;
    a transmission path for transmitting an address signal when refreshing said memory cell arrays, or a signal in correspondence with an address signal when performing write/read operation other than refreshing, to a given row of said memory cell arrays; and
    an address converter for converting a portion of said transmission path relating to an address signal when performing said write/read operation, further comprising a logical circuit section, and a memory circuit portion including said memory cell arrays, sense amplifiers, transmission path and address converter, which are provided on a single LSI chip.

9. The semiconductor integrated circuit device according to claim 8, wherein said LSI chip includes a gate array or standard cell circuit configuration.

10. A semiconductor integrated circuit device comprising:

plurality of memory cell arrays, each comprising plurality of memory cells arranged in a matrix;

sense amplifiers for sense-amplifying data read out from said memory cell arrays and data written to said memory cell arrays;

a transmission path for transmitting an address signal when refreshing said memory cell arrays, or a signal in correspondence with an address signal when performing write/read operation other than refreshing, to a given row of said memory cell arrays; and an address converter for converting a portion of said transmission path relating to an address signal when performing said refreshing, wherein said address converter comprises a circuit for inverting signal.

11. The semiconductor integrated circuit device according to claim 10, wherein said transmission path including a multiplexer provided for each of said memory cell arrays.

12. The semiconductor integrated circuit device according to claim 10, wherein said transmission path including a multiplexer, provided for each of said memory cell arrays, and said address converter is provided preceding-stage of said multiplexer, so as to match a predetermined address relation in said memory cell arrays.

13. The semiconductor integrated circuit device according to claim 7, wherein said sense amplifiers can be shared between adjacent said memory cell arrays.

14. A semiconductor integrated circuit device comprising:

plurality of memory cell arrays, each comprising plurality of memory cells arranged in a matrix;

sense amplifiers for sense-amplifying data read out from said memory cell arrays and data written to said memory cell arrays;

a transmission path for transmitting an address signal when refreshing said memory cell arrays, or a signal in correspondence with an address signal when performing write/read operation other than refreshing, to a given row of said memory cell arrays; and an address converter for converting a portion of said transmission path relating to an address signal when performing said refreshing, further comprising a logical circuit section, and a memory circuit portion including said memory cell arrays, sense amplifiers, transmission path and address converter, which are provided on a single LSI chip.

15. The semiconductor integrated circuit device according to claim 14, wherein said LSI chip includes a gate array or standard cell circuit configuration.

16. A semiconductor integrated circuit device, comprising:

a memory cell array block comprising plurality of memory cells, said memory cell array block having at least 2n (n is an odd number greater than 1) memory cell arrays provided in the row direction and plurality of sense amplifiers provided on both sides of the row direction of each of said 2n memory cell arrays;

plurality of address signal lines for selecting predetermined memory cells in a first half n memory cell arrays of said 2n memory cell arrays, while simultaneously selecting memory cells in a second half n memory cell arrays of said 2n memory cell arrays which correspond to said predetermined memory cell arrays in the first half of said memory cell arrays; wherein said plurality of sense amplifiers are shared by adjacent memory cell arrays; and when refreshing, said plurality of address signal lines used in order to select said 2n memory cell arrays select odd-numbered or even-numbered memory cell arrays among said 2n memory cell arrays, thereby avoiding every adjacent two memory cell arrays from being activated simultaneously.

17. A semiconductor integrated circuit device comprising:

a memory cell array block comprising plurality of memory cells, said memory cell array block having at least 2n (n is an odd number greater than 1) memory cell arrays provided in the row direction and plurality of sense amplifiers provided on both sides of the row direction each of said 2n memory cell arrays;

plurality of address signal lines for selecting predetermined memory cells in an upper half n memory cell arrays of said 2n memory cell arrays, while simultaneously selecting memory cells in a lower half n memory cell arrays of said 2n memory cell arrays which correspond to said predetermined memory cell arrays in the upper half of said memory cell arrays; wherein said plurality of sense amplifiers are shared by adjacent memory cell arrays;

when refreshing, said plurality of address signal lines are used in order to select said 2n memory cell arrays, select odd-numbered or even-numbered memory cell arrays among said 2n memory cell arrays, and each of said memory cell arrays has a pattern layout in which a memory capacity of said each memory cell array is increased or decreased in a minimum unit.

18. The semiconductor integrated circuit device according to claim 17, wherein said minimum unit has the number of row addresses for refreshing as a reference.

19. A semiconductor integrated circuit device, comprising:

a memory system comprising n cell arrays each having memory cells arranged in a matrix, provided in m columns (n>1, m>0), wherein, as regards accessing of word lines in a row direction, at least two types of access are permitted in order to carry out writing/reading from/to said memory cells from the outside and to carry out refresh operation;

an address configuration wherein the relation between the number of row addresses when writing/reading and the number of row addresses when refreshing is other than a relation wherein the larger number of addresses is a square of the smaller number of addresses; and a controller for selecting said addresses which keep the number of said word lines activated during said refreshing at a fixed number.

20. The semiconductor integrated circuit device according to claim 19, wherein said memory system comprises blocks of at least said n cell arrays, aligned on the left and right, and said n cell arrays containing rows which become active simultaneously during refreshing are positioned asymmetrically in said left and right blocks.

21. The semiconductor integrated circuit device according to claim 19, wherein said memory system comprises blocks of at least said n cell arrays, aligned on the left and right and aligned on the upper and lower, and said n cell arrays containing rows which become active simultaneously during refreshing are positioned asymmetrically in said left and right blocks and also asymmetrical in said upper and lower blocks.

22. The semiconductor integrated circuit device according to claim 19, further comprising:

potential generators for said word lines, said potential generators being distributed to each of said m columns of cell arrays.

23. The semiconductor integrated circuit device according to claim 19, wherein each of said memory cell arrays has a pattern layout in which a memory capacity of said each memory cell array is increased or decreased in a minimum unit.

24. The semiconductor integrated circuit device according to claim 19, further comprising:

a potential generator for said word lines;

wherein said memory cell arrays has a pattern layout in which a memory capacity of said each memory cell array is increased or decreased in a minimum unit, and wherein said potential generator is provided for said minimum unit.

25. The semiconductor integrated circuit device according to claim 19, wherein, aid memory system constituted an LSI chip whose circuit configuration being a gate array or standard cell configuration.

26. A semiconductor integrated circuit device comprising:

a memory system comprising n cell arrays, each having memory cells arranged in a matrix, provided in m columns (n>1, m>0), wherein, as regards accessing of word lines in a row direction, at least two types of access are permitted in order to carry out writing/reading from/to said memory cells from the outside and to carry out refresh operation;

a controller and a decoder utilizing said two types of access, which share a decoding system for selecting a part of said cell arrays and selecting word lines in the selected cell arrays;

plurality of row address lines which simultaneously become active without fail when accessing said memory cells in order to perform writing/reading; and a circuit mechanism, provided to said controller and decoder, preventing at least one part of said row address lines which simultaneously become active from becoming active when refreshing.

27. The semiconductor integrated circuit device according to claim 26, wherein said memory system comprises a refresh counter for creating addresses for refreshing, and said controller and decoder comprise multiplexers for selecting row addresses input from the outside and row addresses determined by said refresh counter, a part of values of said refresh counter, which are input to said multiplexers, being different with respect to the alignment of said cell arrays.

28. The semiconductor integrated circuit device according to claim 26, wherein said memory system comprises a refresh counter for creating addresses for refreshing, and said controller and decoder comprise multiplexers for selecting row addresses input from the outside and row addresses determined by said refresh counter, a part of said row addresses, which are input to said multiplexers from the outside, being different with respect to the alignment of said cell arrays.

29. The semiconductor integrated circuit device according to claim 26, further comprising:

potential generators for said word lines, said potential generators being distributed to each of said m columns of cell arrays.

30. The semiconductor integrated circuit device according to claim 26, wherein each of said memory cell arrays has a pattern layout in which a memory capacity of said each memory cell array is increased or decreased in a minimum unit.

31. The semiconductor integrated circuit device according to claim 26, further comprising:

a potential generator for said word lines;

wherein said memory cell arrays has a pattern layout in which a memory capacity of said each memory cell array is increased or decreased in a minimum unit, and wherein said potential generator is provided for said minimum unit.

32. The semiconductor integrated circuit device according to claim 26, wherein, said memory system constituted an LSI chip whose circuit configuration being a gate array or standard cell configuration.

33. A semiconductor integrated circuit device, comprising:

a memory system comprising n cell arrays, each having memory cells arranged in a matrix, provided in m columns (n>1, m>0), wherein, as regards accessing of word lines in a row direction, at least two types of access are permitted in order to carry out writing/reading from/to said memory cells from the outside and to carry out refresh operation;

a controller and a decoder utilizing said two types of access for selecting a part of said aligned cell arrays and selecting word lines in the selected cell arrays;

plurality of row address lines which simultaneously become active without fail when accessing said memory cells in order to perform writing/reading;

row address control lines leading to said controller and decoder, either all or part of said row address control lines having its own access for writing/reading and access for refreshing;

a circuit mechanism for preventing one part of said cell arrays in a same column, which were simultaneously selected when accessing in order to perform writing/reading, from being simultaneously selected when refreshing.

34. The semiconductor integrated circuit device according to claim 33, wherein a part of said row address control lines for refreshing determine the refresh timing of said cell arrays.

35. The semiconductor integrated circuit device according to claims 33, wherein said memory system comprises a refresh counter for creating addresses for refreshing, and said controller and decoder comprise multiplexers, provided separately for each cell array, for selecting row addresses input from the outside and row addresses determined by said refresh counter.

36. The semiconductor integrated circuit device according to claim 33, further comprising:

potential generators for said word lines, said potential generators being distributed to each of said m columns of cell arrays.

37. The semiconductor integrated circuit device according to claim 33, wherein each of said memory cell arrays has a pattern layout in which a memory capacity of said each memory cell array is increased or decreased in a minimum unit.

38. The semiconductor integrated circuit device according to claim 33, further comprising:

a potential generator for said word lines;

wherein said memory cell arrays has a pattern layout in which a memory capacity of said each memory cell array is increased or decreased in a minimum unit, and wherein said potential generator is provided for said minimum unit.

39. The semiconductor integrated circuit device according to claim 33, wherein, said memory system constituted an LSI chip whose circuit configuration being a gate array or standard cell configuration.

40. A semiconductor integrated circuit device comprising:

plurality of memory cell arrays each comprising plurality of memory cells arranged in a matrix; and sense amplifiers for sense-amplifying data read out from said memory cell arrays and data written to said memory cell arrays;

wherein said plurality of memory cell arrays are designated as at least two units of a write/read operation by a first row address, and are so designated as a plurality of units of a refresh operation by a second row address for refresh operation that at least one unit of the refresh operation includes first and second memory cell arrays included in one unit and adjacent one unit of the write/read operation.

41. A semiconductor integrated circuit device according to claim 40, wherein the number of said memory cell arrays contained in one unit of the write/read operation is greater than the number of said memory cell arrays contained in one unit of the refresh operation.

42. A semiconductor integrated circuit device according to claim 40, wherein said sense amplifiers are shared between adjacent two of said memory cell arrays.

* * * * *